(12) United States Patent
Iwasaki et al.

(10) Patent No.: US 11,307,339 B2
(45) Date of Patent: Apr. 19, 2022

(54) OPTICAL FILM, POLARIZING PLATE, AND IMAGE DISPLAY DEVICE

(71) Applicant: DAI NIPPON PRINTING CO., LTD., Tokyo (JP)

(72) Inventors: Toshiki Iwasaki, Tokyo (JP); Yoshiaki Ooyari, Tokyo (JP); Yoshimasa Ogawa, Tokyo (JP); Jun Sato, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 17/050,720

(22) PCT Filed: Apr. 26, 2019

(86) PCT No.: PCT/JP2019/017974
§ 371 (c)(1),
(2) Date: Mar. 10, 2021

(87) PCT Pub. No.: WO2019/208786
PCT Pub. Date: Oct. 31, 2019

(65) Prior Publication Data
US 2021/0239892 A1    Aug. 5, 2021

(30) Foreign Application Priority Data

Apr. 27, 2018 (JP) .............................. JP2018-086886

(51) Int. Cl.
*G02B 5/30* (2006.01)
*B32B 27/08* (2006.01)
(Continued)

(52) U.S. Cl.
CPC ............ *G02B 5/3033* (2013.01); *B32B 27/08* (2013.01); *B32B 27/281* (2013.01); *G02B 1/14* (2015.01);
(Continued)

(58) Field of Classification Search
CPC ..... G02B 5/3033; B32B 27/281; B32B 27/08; B32B 2307/584; B32B 2307/51; B32B 2307/42; B32B 2457/208; B32B 2457/206
See application file for complete search history.

(56) References Cited

U.S. PATENT DOCUMENTS

2017/0276840 A1* 9/2017 Horio .................. H01L 51/5253
2019/0315105 A1* 10/2019 Isojima .................... G02B 1/14
(Continued)

FOREIGN PATENT DOCUMENTS

| JP | 2009-175500 | 8/2009 |
|----|-------------|--------|
| JP | 2012-7119   | 1/2012 |

(Continued)

OTHER PUBLICATIONS

International Preliminary Report on Patentability, issued in the corresponding PCT Application No. PCT/JP2019/017974, dated Oct. 27, 2020, 14 pages (including translation).
(Continued)

*Primary Examiner* — John D Freeman
(74) *Attorney, Agent, or Firm* — Hamre, Schumann, Mueller & Larson, P.C.

(57) ABSTRACT

An aspect of the present invention provides an optical film 10 including a resin base material 11 and a functional layer 12, wherein a 5-μm square region on the front surface 10A of the optical film 10 is observed to have 1 or more and 50 or less depressions having any shape at least selected from a ring shape, a circular shape, and an irregular shape, when the square region is observed using an atomic force microscope after a rubber eraser abrasion test, in which the front surface 10A is rubbed 4,000 times with a rubber eraser in a reciprocating motion under a load of 500 g; the front surface 10A has a dynamic friction coefficient of 0.70 or less before the test; and the change rate of the dynamic friction coef-
(Continued)

ficient of the front surface 10A between before and after the test is 35%.

26 Claims, 10 Drawing Sheets

(51) Int. Cl.
  *G02B 1/14*  (2015.01)
  *B32B 27/28*  (2006.01)

(52) U.S. Cl.
  CPC ....... *B32B 2307/42* (2013.01); *B32B 2307/51* (2013.01); *B32B 2307/584* (2013.01); *B32B 2457/206* (2013.01); *B32B 2457/208* (2013.01)

(56) References Cited

U.S. PATENT DOCUMENTS

| | | | |
|---|---|---|---|
| 2020/0282710 | A1 | 9/2020 | Washio |
| 2020/0386917 | A1* | 12/2020 | Hashimoto ............ H05B 33/02 |

FOREIGN PATENT DOCUMENTS

| | | |
|---|---|---|
| JP | 2016-125063 | 7/2016 |
| JP | 2017-219597 | 12/2017 |
| JP | 2018-92146 | 6/2018 |
| JP | 2018-173564 | 11/2018 |
| WO | 2014/050798 | 4/2014 |
| WO | 2017/073756 | 5/2017 |

OTHER PUBLICATIONS

International Search Report, issued in the corresponding PCT Application No. PCT/JP2019/017974, dated Jul. 30, 2019, 4 pages.

\* cited by examiner

OPTICAL FILM, POLARIZING PLATE, AND IMAGE DISPLAY DEVICE

CROSS-REFERENCE TO RELATED APPLICATION

The present application enjoys the benefit of priority to the prior Japanese Patent Application No. 2018-86886 (filed on Apr. 27, 2018), the entire disclosure of which is incorporated herein by reference.

TECHNICAL FIELD

The present invention relates to an optical film, a polarizing plate, and an image display device.

BACKGROUND ART

Recently, touch function is available on some image display devices, such as those not only in smartphones or tablet terminals but also in, for example, notebook personal computers. The front surface of an image display device with touch function is typically composed of a glass cover. However, glass causes increases in film thickness and in production cost though glass generally has high hardness. Thus, it is contemplated that an optical film that comprises a resin base material is used instead of a glass cover (see, for example, Patent Document 1).

In contrast, some image display devices with touch function may be controlled not only by finger gestures but also by stylus movement on the display screen. Thus, an optical film used as a substitute for the glass cover is naturally required to have scratch resistance and also to have abrasion resistance, which prevents components in the surface of the optical film from being scraped off when the surface is traversed by a stylus or the like, and an antifouling property, which prevents the front surface of the optical film from being fouled even after the front surface is traversed by a stylus or the like.

PRIOR ART DOCUMENTS

Patent Document

Patent Document 1: JP2016-125063A

SUMMARY OF THE INVENTION

Optical films with scratch resistance are conventionally known, but the scratch resistance is a property that is quite different from abrasion resistance. Meanwhile, it is difficult for optical films to provide excellent antifouling performance even if the optical films have superior scratch and abrasion resistance. Therefore, optical films with an excellent antifouling property as well as superior scratch and abrasion resistance are currently unavailable.

The present invention is designed to solve the above problem. That is, an object of the present invention is to provide an optical film capable of achieving superior scratch and abrasion resistance and of providing excellent antifouling performance, and a polarizing plate and an image display device, each comprising the same optical film.

The present invention includes the following inventions.

[1] An optical film comprising a resin base material and a functional layer provided on a first surface of the resin base material, wherein a front surface of the optical film constitutes a front surface of the functional layer; a 5-μm square region on the front surface of the optical film is observed to have 1 or more and 50 or less depressions having any shape at least selected from a ring shape with an outer diameter of 0.1 μm or more and 2.5 μm or less and with a depth of 1 nm or more and 150 nm or less, a circular shape with a diameter of 0.1 μm or more and 2.5 μm or less and with a depth of 1 nm or more and 150 nm or less, and an irregular shape with a width of 0.1 μm or more and 2.5 μm or less and with a depth of 1 nm or more and 150 nm or less, when the square region is observed using an atomic force microscope after a rubber eraser abrasion test, in which the front surface of the optical film is rubbed 4,000 times with a rubber eraser in a reciprocating motion under a load of 500 g; the front surface of the optical film has a dynamic friction coefficient of 0.70 or less before the rubber eraser abrasion test; and the change rate of the dynamic friction coefficient of the front surface of the optical film after the rubber eraser abrasion test to the dynamic friction coefficient of the front surface of the optical film before the rubber eraser abrasion test is up to 35%.

[2] An optical film comprising a resin base material and a functional layer provided on a first surface of the resin base material, wherein a front surface of the optical film constitutes a front surface of the functional layer; the absolute value of the difference in the arithmetic mean height of a 5-μm square region on the front surface of the optical film measured using an atomic force microscope between before and after a rubber eraser abrasion test is 10 nm or less when the rubber eraser abrasion test is performed by rubbing the front surface of the optical film 5,000 times with a rubber eraser in a reciprocating motion under a load of 1,000 g; the front surface of the optical film has a dynamic friction coefficient of 0.70 or less before the rubber eraser abrasion test; and the change rate of the dynamic friction coefficient of the front surface of the optical film after the rubber eraser abrasion test to the dynamic friction coefficient of the front surface of the optical film before the rubber eraser abrasion test is up to 35%.

[3] The optical film according to [2], wherein a 5-μm square region on the front surface of the optical film is observed to have 1 or more and 50 or less depressions having any shape at least selected from a ring shape with an outer diameter of 0.1 μm or more and 2.5 μm or less and with a depth of 1 nm or more and 150 nm or less, a circular shape with a diameter of 0.1 μm or more and 2.5 μm or less and with a depth of 1 nm or more and 150 nm or less, and an irregular shape with a width of 0.1 μm or more and 2.5 μm or less and with a depth of 1 nm or more and 150 nm or less, when the square region is observed using an atomic force microscope after the rubber eraser abrasion test.

[4] The optical film according to any one of [1] to [3], wherein a 5-μm square region on the front surface of the optical film is observed to have the depressions, ranging from 1 or more to 50 or less in number, when the square region is observed using an atomic force microscope before the rubber eraser abrasion test.

[5] The optical film according to any one of [1] to [3], wherein a 5-μm square region on the front surface of the optical film is observed to have no depressions when the square region is observed using an atomic force microscope before the rubber eraser abrasion test.

[6] The optical film according to any one of [1] to [5], wherein a projection with a height of 1 nm or more is located within each depression or inside each depression.

[7] The optical film according to any one of [1] to [6], wherein the ratio of maintained contact angle is 80% or more, which is the ratio of the contact angle of water on the front surface of the optical film measured after the rubber eraser abrasion test to that measured before the rubber eraser abrasion test.

[8] The optical film according to any one of [1] to [7], wherein no scratches are found on the front surface of the optical film when the front surface of the optical film not provided for the rubber eraser abrasion test is rubbed 5,000 times with steel wool in a reciprocating motion under a load of 1 kg/cm$^2$ during a steel-wool scratch test.

[9] The optical film according to any one of [1] to [8], wherein the functional layer comprises a first functional layer containing particles and a second functional layer provided on a surface opposite to the resin base material side surface of the first functional layer.

[10] The optical film according to any one of [1] to [9], wherein no crack or break is formed in the optical film when the optical film is folded in such a manner that a gap of 2 mm is left between the opposite edges and the functional layer faces inward, and then unfolded, and the process is repeated 100,000 times, in cases where the resin base material contains cellulose triacetate resin and the resin base material has a thickness of 15 μm or more and 65 μm or less, or the resin base material contains a polyester resin and the resin base material has a thickness of 5 μm or more and 45 μm or less, or the resin base material contains a cycloolefin polymer resin and the resin base material has a thickness of 5 μm or more and 35 μm or less, or the resin base material contains at least either a polyimide resin or a polyamide resin and the resin base material has a thickness of 5 μm or more and 75 μm or less.

[11] The optical film according to any one of [1] to [9], wherein no crack or break is formed in the optical film when the optical film is folded in such a manner that a gap of 3 mm is left between the opposite edges and the functional layer faces outward, and then unfolded, and the process is repeated 100,000 times, in cases where the resin base material contains at least any of a cellulose triacetate resin, a polyester resin, a cycloolefin polymer resin, or a polyimide resin and a polyamide resin and the resin base material has a thickness of 35 μm or more and 105 μm or less.

[12] A polarizing plate, comprising the optical film according to any one of [1] to [11] and a polarizer provided on a second surface opposite to the first surface of the resin base material in the optical film.

[13] An image display device, comprising a display element and the optical film according to any one of [1] to [11] or the polarizing plate according to [12], placed on the observer's side of the display element, wherein the functional layer of the optical film is placed on the observer's side of the resin base material.

[14] The image display device according to [13], wherein a touch sensor is further provided between the display element and the optical film.

[15] The image display device according to [13] or [14], wherein the display element is an organic light-emitting diode element.

The present invention can provide an optical film capable of achieving superior scratch and abrasion resistance and of providing excellent antifouling performance, and a polarizing plate and an image display device, each comprising the optical film.

DETAILED DESCRIPTION OF THE INVENTION

Figure 1:
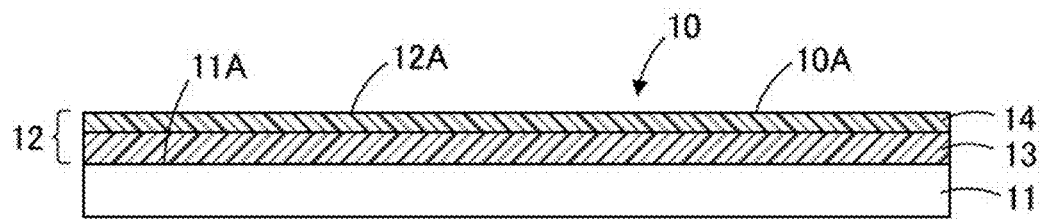
FIG. 1 shows a schematic diagram of an optical film according to an embodiment.
Figure 2:
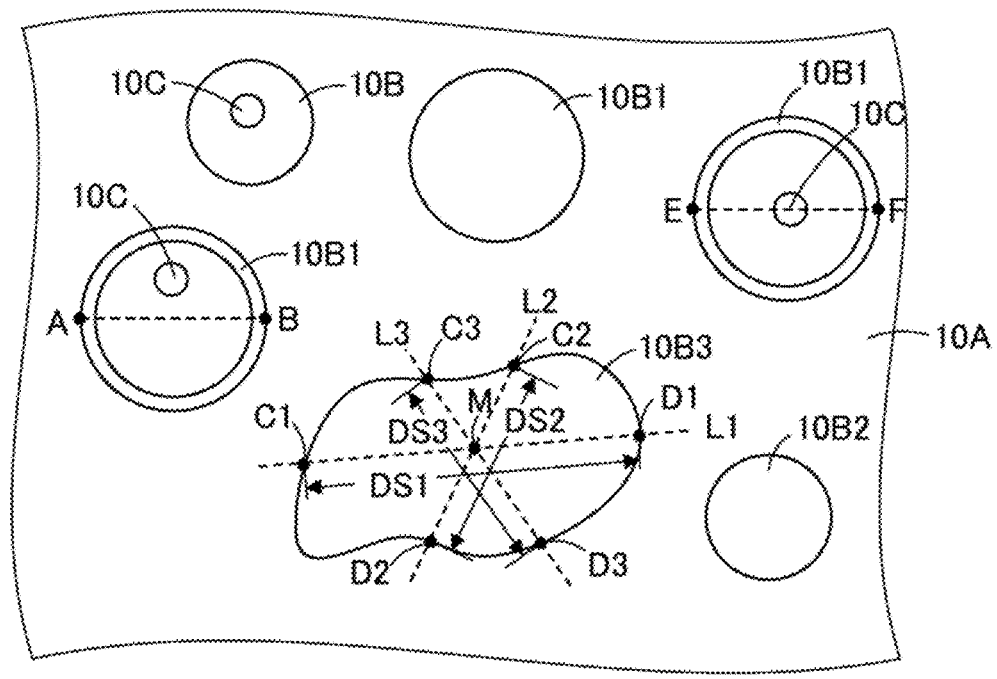
FIG. 2 is an enlarged top view showing a portion of the optical film shown in FIG. 1.
Figure 3:
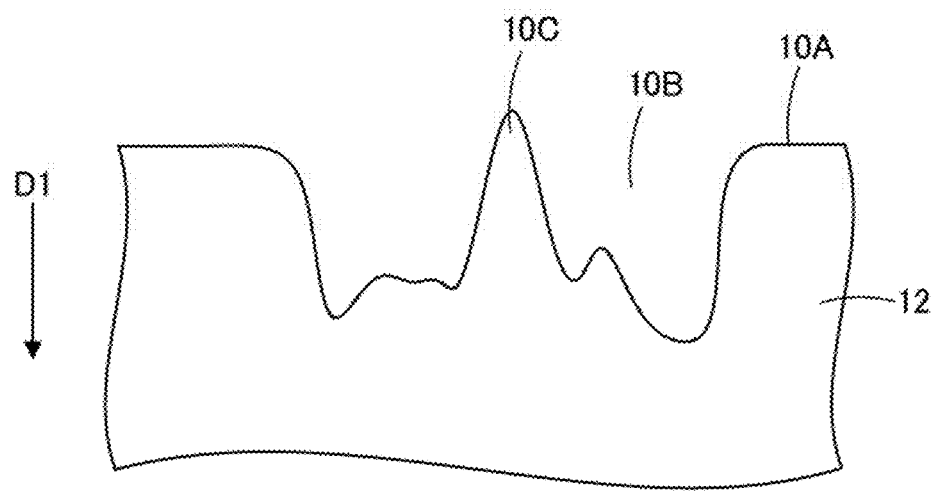
FIG. 3 is an enlarged cross-sectional view showing a portion of a functional layer shown in FIG. 1.
Figure 4:
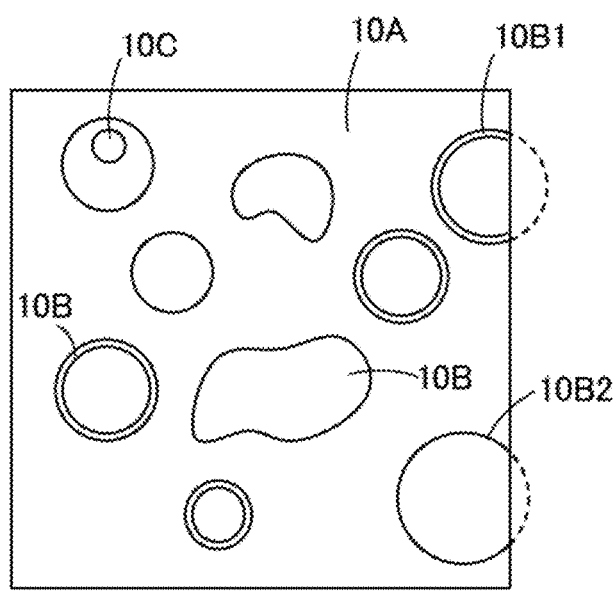
FIG. 4 schematically shows the way to count the number of depressions and to measure the diameter of each depression.
Figure 5:
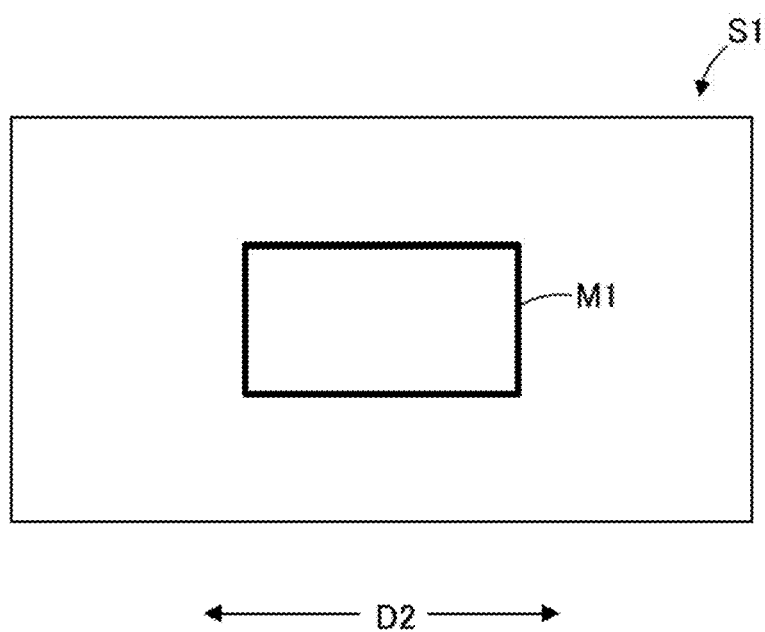
FIG. 5 illustrates a sample used for a rubber eraser abrasion test.
Figure 6:
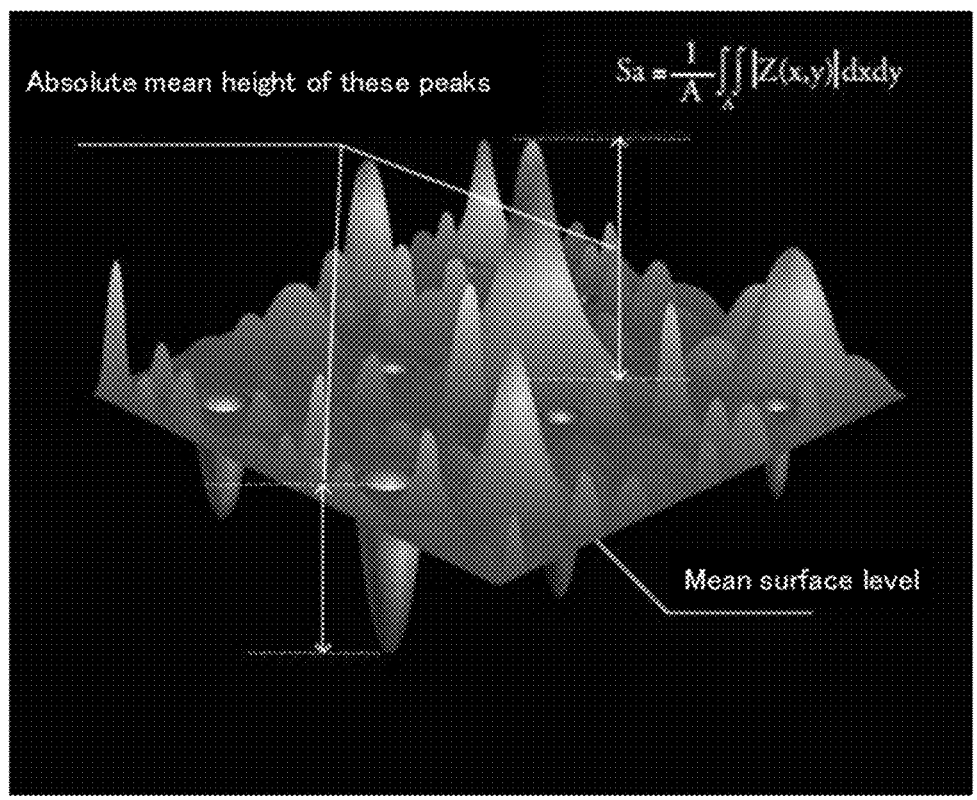
FIG. 6 is a conceptual diagram showing an arithmetic mean height (Sa).
Figure 7A:
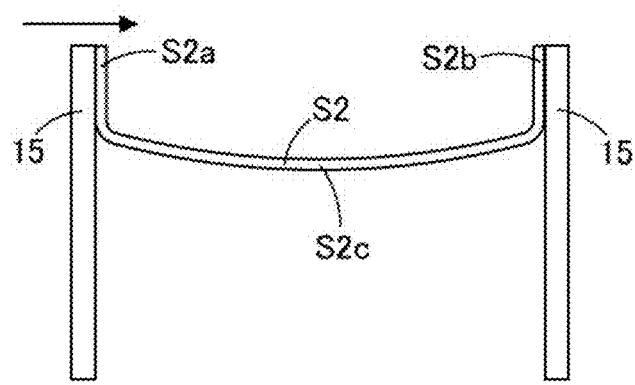
FIGS. 7(A) to 7(C) schematically illustrate the steps of a folding test.
Figure 7B:
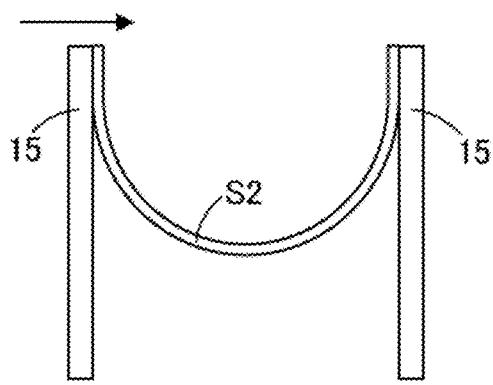
Figure 7C:
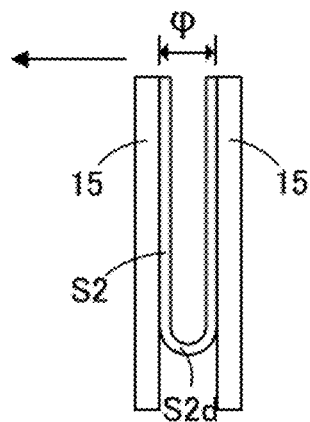
Figure 8:
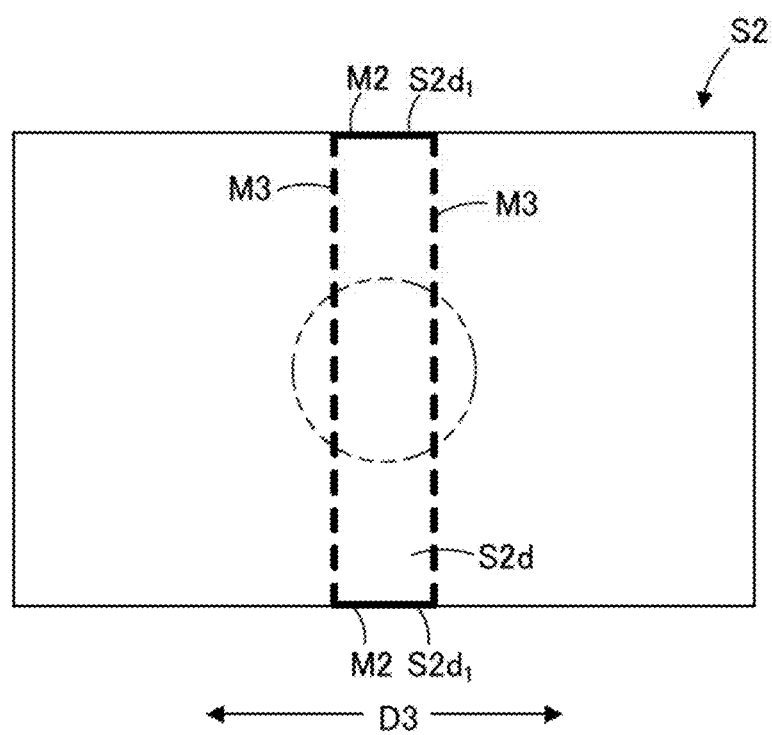
FIG. 8 is a top view of a sample subjected to the folding test.

An optical film and an image display device according to an embodiment of the present invention are now described below with reference to the drawings. In this specification, the terms "film" and "sheet" are not distinguished from each other only on the basis of the difference of names. For example, the term "film" is thus used to refer inclusively to an element called "sheet." FIG. 1 shows a schematic diagram of an optical film according to the embodiment, and FIG. 2 is an enlarged top view showing a portion of the optical film shown in FIG. 1, and FIG. 3 is an enlarged cross-sectional view showing a portion of a functional layer shown in FIG. 1, and FIG. 4 schematically shows the way to count the number of depressions and to measure the diameter of each depression. FIG. 5 illustrates a sample used for a rubber eraser abrasion test, and FIG. 6 is a conceptual diagram showing an arithmetic mean height (Sa), and FIGS. 7(A) to 7(C) schematically illustrate the steps of a folding test, and FIG. 8 is a top view of a sample subjected to the folding test.

<<<Optical Film>>>

An optical film 10 shown in FIG. 1 is light-transmissive and comprises a resin base material 11 and a functional layer 12 provided on a first surface 11A, which is one surface of the resin base material 11. The term "functional layer" as used herein refers to a layer intended to exert some function in an optical film. Specific examples of the functional layer include layers with a hard-coat function, an antifouling function, and/or a smoothing function. The functional layer is not limited to a functional layer with a monolayer structure, and may have a multilayer structure composed of two or more layers. The functional layer 12 shown in FIG. 1 has a multilayer structure composed of a first functional layer 13 and a second functional layer 14. The front surface 10A of the optical film 10 constitutes the front surface 12A of the functional layer 12.

When a 5-μm square (5 μm×5 μm) region on the front surface 10A of the optical film 10 is observed using an atomic force microscope (AFM) (for example, product name: "WET-9100"; manufactured by Shimadzu Corporation) after the optical film 10 is subjected to a rubber eraser abrasion test in which the front surface of the optical film 10 is rubbed 4,000 times with a rubber eraser in a reciprocating motion under a load of 500 g (the test is hereinafter referred to as the rubber eraser abrasion test (500 g×4,000 times)), the square region in the optical film 10 is observed to have 1 or more and 50 or less depressions 10B having any shape at least selected from a ring shape with an outer diameter of 0.1 μm or more and 2.5 μm or less and with a depth of 1 nm or more and 150 nm or less, a circular shape with a diameter of 0.1 μm or more and 2.5 μm or less and with a depth of 1 nm or more and 150 nm or less, and an irregular shape with a width of 0.1 μm or more and 2.5 μm or less and with a depth of 1 nm or more and 150 nm or less, as shown FIGS. 2 and 3. When the number of depressions 10B with any shape selected from a ring shape, a circular shape, and an irregular shape as described above and present in the square region is 1 or more, the optical film 10 exhibits an ability to meet requirements for the scratch and abrasion resistance and enables prevention of removal of an antifouling agent from the front surface 10A. When the number of such depressions 10B present in the square region is 50 or less, the front surface 10A does not exhibit uniform properties across the entire area but is divided into areas with different functions, namely areas exhibiting either hardness or smoothness, which can result in providing favorable physical properties. Although the above-described outer diameter, diameter, or width of each depression 10B is 0.1 μm or more and 2.5 μm or less, depressions with an outer diameter or the like of less than 0.1 μm may cause reduced abrasion resistance, and depressions with an outer diameter or the like of more than 2.5 μm may cause reduced scratch resistance. Such depressions 10B can be formed by, for example, allowing the functional layer 12 to contain both a lubricant and an antifouling agent as described below or to contain not a single but multiple types of antifouling agents or an antifouling agent containing different types of elements in the absence of a lubricant, though the mechanism is not exactly known. Additionally, the reason why the size of the observed region is 5 μm square is because it is a size that allows observation of smooth areas in the square region for finding the nature of the layer, whether the square region is macroscopically observed to have a smooth mirror surface or to have a rough surface with antireflection properties, wherein the surface is observed with a desirable magnification to examine whether or not the condition of the surface is suitable for playing a role in providing the required physical properties. A region larger than a 5-μm square will be observed with an insufficient magnification to find the nature of the layer, in which small depressions as described are hard to be observed, while a region smaller than a 5-μm square will not be observed with a sufficient resolution to identify the profiles required for exhibiting the above functions essential in the present invention. In cases where a rubber eraser abrasion test is performed under conditions where the load is 500 g and the rubbing is repeated around 1,000 or 1,500 times, the presence of an antifouling agent in the functional layer may provide superior scratch and abrasion resistance but no antifouling property at the same time, which is essential for practical use of the optical film. Moreover, in cases where a rubber eraser abrasion test under severer conditions (500 g×4,000 times) or a rubber eraser abrasion test under further severer conditions (1,000 g×5,000 times) as described below is performed, components in the functional layer are greatly scraped off by a rubber eraser, leading to reduced scratch and abrasion resistance. In contrast, since the functional layer 12 contains, for example, a lubricant in addition to an antifouling agent or contains multiple types of antifouling agents, 1 to 50 depressions are scattered over the surface, as if islands in a sea, wherein the depressions are considered to divide the front surface into the above-described areas with different functions, namely areas exhibiting either hardness or smoothness. Macroscopic observation of the depressions indicates that the depressions are ubiquitously located on the surface of the functional layer. Thus, it is believed that some depressions will remain even after a severe rubber eraser abrasion test, or after the surface is worn away during practical use, and the presence of the depressions allows the surface of the functional layer to ensure an adequate dynamic friction coefficient and to have superior scratch and abrasion resistance, as well as to retain the excellent antifouling property.

The number of depressions 10B observed in a 5-μm square (5 μm×5 μm) region on the front surface 10A of the optical film 10 subjected to the rubber eraser abrasion test (4,000 times) is preferably a number of 3 or more, or a number of 5 or more.

In cases where the depressions 10B include ring-shaped depressions 10B1, the depressions 10B1 preferably has a minimum outer diameter of 0.2 μm or more, 0.4 μm or more, 0.6 μm or more, 0.8 μm or more, or 1.0 μm or more, and a maximum outer diameter of 2.4 μm or less, 2.2 μm or less, or 2.0 μm or less. Additionally, the inner diameter and width of the depressions 10B1 are not specifically limited. For example, the depressions 10B1 preferably has a width of 1.0 nm or more and 5.0 nm or less. Depressions 10B1 with a width of 1.0 nm or more could prevent an antifouling agent from being scraped off, while those with a width of 5.0 nm or less would provide excellent scratch resistance. The above "width of a depression" should refer to the distance from the inner edge to the outer edge of a depression.

In cases where the depressions 10B include circularly shaped depressions 10B2, the depressions 10B2 preferably has a minimum diameter of 0.2 μm or more, 0.4 μm or more, 0.6 μm or more, 0.8 μm or more, or 1.0 μm or more, and a maximum diameter of 2.4 μm or less, 2.2 μm or less, or 2.0 μm or less.

In cases where the depressions 10B include irregularly shaped depressions 10B3, the depressions 10B3 preferably has a minimum width of 0.2 μm or more, 0.4 μm or more, 0.6 μm or more, 0.8 μm or more, or 1.0 μm or more, and a maximum width of 2.4 μm or less, 2.2 μm or less, or 2.0 μm or less.

The reason why a rubber eraser is used for the above-described test is because the rubbing with a rubber eraser resembles that with a stylus, and the abrasion resistance against rubbing with a stylus can be evaluated by the rubber eraser abrasion test. Although the scratch resistance of optical films is conventionally evaluated by a steel-wool scratch test, in which the front surface of an optical film is rubbed with steel wool, the steel-wool scratch test is not available for the evaluation of the abrasion resistance against rubbing with a stylus because steel wool is composed of thin metal wires and is quite different in structure from a stylus.

The above rubber eraser abrasion test (500 g×4,000 times) should be performed by the following procedure. First of all, a rubber eraser used for the rubber eraser abrasion test is provided. As the rubber eraser, an eraser with a diameter of 6.0 mm, a length of 160 mm or less, and a durometer hardness (Type A Durometer, Type A (cylindrical indenter), JIS K6253: 1997/ISO7619 (Rubber)) of 60 or more and 90 or less, and made of a rubber material should be used. A pencil with a rubber eraser manufactured by Mitsubishi Pencil Co., Ltd. (product name: "Pencil for office use #9852 (with a rubber eraser)") and Rubber Stick manufactured by Minoan Inc. are examples of such a rubber eraser. The rubber eraser may be a simple rubber eraser or a pencil with a rubber eraser. The length of the rubber eraser should be a length that allows attachment of the rubber eraser to a jig. The tensile strength of the rubber eraser may be 11 kgf/cm$^2$ or more and 13 kgf/cm$^2$ or less. In the present embodiment, a pencil with a rubber eraser should be used as the rubber eraser to perform the rubber eraser abrasion test. Once a pencil with a rubber eraser (product name: "Pencil for office use #9852 (with a rubber eraser)"; manufactured by Mitsubishi Pencil Co., Ltd.) is provided, the pencil is cut at a distance of 50 mm from the tip of the rubber eraser. Then, the cut end of pencil with a rubber eraser is attached to a jig having a hole with a diameter of 6 mm by inserting the tip of the cut piece, as opposed to the rubber eraser, into the hole in such a manner that the tip of the rubber eraser is completely exposed from the jig. In this respect, it is to be noted that the tip of the rubber eraser exposed from the jig is not excessively long in length. Specifically, the pencil with a rubber eraser is attached to the jig in such a manner that the tip of the rubber eraser exposed from the jig is around 1.5 mm in length. The jig holding the pencil with a rubber eraser is mounted on a color fastness rubbing tester (for example, product name: "AB-301"; manufactured by Tester Sangyo Co., Ltd.). The jig should be mounted on the above tester in such a manner that the pencil with a rubber eraser is perpendicular to the surface of a tested subject (the front surface of an optical film). Meanwhile, an optical film 10 that has not been subjected to a rubber eraser abrasion test is cut into a piece with a size of 50 mm×100 mm to obtain a sample S1 as shown in FIG. 5. Then, a frame-shaped mark M1 with a size of 20 mm×40 mm is drawn with a permanent marker on the back surface of the sample S1 (by the side of resin base material) so that the center of a region to be rubbed will be easily recognized. The mark M1 is drawn in such a manner that the longitudinal direction is parallel to the longitudinal direction D2 of the sample S1. Then, the sample S1 is immobilized on a sample stage of the color fastness rubbing tester in such a manner that the sample S1 lying on the surface of the sample stage has no wrinkle. The sample S1 is placed on the sample stage in such a manner that the moving direction of the sample stage is in the longitudinal direction D2 of the sample S1 and the center of a region to be rubbed is matched with the center of the mark M1. Then, the front surface 10A of the optical film 10 is rubbed under these conditions 4,000 times with the rubber eraser in a reciprocating motion at a rubbing speed of 30 mm/sec and under a load of 500 g.

Depressions 10B in the sample S1 are observed with an atomic force microscope. The observation of depressions 10B is performed by the following procedure. Specifically, three areas where at least no macroscopic abnormality is seen (areas which carry, for example, no foreign bodies or scratches) are first selected at the central part of the region within the mark M1 on the sample S1 subjected to the rubber eraser abrasion test (500 g×4,000 times), and the sample S1 is cut into 5-mm squares to obtain three measurement samples from those areas. Meanwhile, a plural number of flat and circular metal plates with a diameter of 15 mm and a thickness of 1 mm are provided, and each metal plate is attached with a piece of a double-sided carbon coated tape manufactured by Nissin EM Co., Ltd. Each measurement sample is attached to each piece of the tape in such a manner that the surface of the measurement sample (the surface of the optical film) faces upward. Then, the metal plates attached with the measurement samples are left in a desiccator overnight for secure adhesion between the tape and the samples. After left overnight, each metal plate with an attached measurement sample is immobilized on a stage of an atomic force microscope (product name: "WET-9400"; manufactured by Shimadzu Corporation) by means of a magnet, and the surface profiles on 5-μm square measurement areas are observed with the atomic force microscope in tapping mode. The following point should be noted during the observation of depressions. First of all, in cases where an observed image is vague, the contrast of the image is increased as much as possible by the image adjustment system for the atomic force microscope (AFM). In atomic force microscopy images, color tone indicates height. That is, a darker color indicates a region at a lower level, and a brighter color indicates a region at a higher level. Accordingly, in the observation of depressions, regions with darker color (for example, regions colored in dark brown, when brown is chosen as the color) are subjects of observation. Additionally, the scale bar located near the lower right corner of the observed image likewise follows the above-described rule, and the histogram shows a distribution of heights, each of which is in line with each region represented in the scale bar. Once the surface profile of an optical film is taken under the atomic force microscope, the histogram is automatically displayed.

The number of depressions 10B should be calculated by randomly selecting 5 positions from one measurement sample, counting the number of depressions 10B at the 5 positions within a 5-μm square region in each of the three measurement samples (a total of 15 positions), and calculating the arithmetic mean of the obtained numbers of depressions 10B at the 15 positions. In this respect, when the above-described region includes a part of a ring-shaped depression 10B1 but not its entirety, the above-described region is observed to extrapolate the missing outer edge of the depression 10B1 included in the above-described region, as shown by a dotted line in FIG. 4, to draw a full circle. If the area of the depression 10B1 inside the outer edge included in the above-described region is not less than half the area of the extrapolated full circle, even the part of the depression 10B1 should be counted as a depression 10B1. If the area of the part of the depression 10B1 included in the above-described region is less than half the area of the extrapolated full circle, the depression 10B1 should not be counted. Moreover, when the above-described region includes a part of a circularly shaped depression 1062 but not its entirety, the same processing as for the ring-shaped depression 10B1 should also be performed.

In cases where the above depressions 10B include ring-shaped depressions 10B1, the outer diameter of the depressions 10B1 should be determined by the following procedure. First of all, while one depression 10B1 in a 5-μm square region on the surface of the measurement sample S1 is observed with an atomic force microscope, a straight line is drawn from an arbitrary point A to another arbitrary point B on the outer edge of the depression 10B1 to connect the longest distance between the two points, as shown in FIG. 2, and the length of the line from the point A to the point B (the outer diameter) is determined. Then, the measurement is performed on 3 different positions, and the arithmetic mean of the lengths measured at the 3 positions should be calculated to obtain the outer diameter of the depressions 10B1. Also in cases where the above depressions 10B include circularly shaped depressions 10B2, the diameter of the depressions is calculated in the same manner as the outer diameter of ring-shaped depressions 10B1.

In cases where the depressions 10B include irregularly shaped depressions 10B3, the width of the depressions 10B3 should be determined by the following procedure. First of all, while one depression 10B3 in a 5-μm square region on the surface of the measurement sample S1 is observed with an atomic force microscope, a straight line L1 passing through a position considered as the central part of the depression 10B3 is drawn, as shown in FIG. 2. Then, the intersection points C1 and D1 between the straight line L1 and the outer edge of the depression 10B are determined. Subsequently, the distance DS1 between the points C1 and D1 is measured, and the middle point M of the segment with the distance DS1 is determined. Moreover, a straight line L2 passing through the middle point M and inclined at 60° from the straight line L1 is drawn, and the intersection points C2 and D2 between the straight line L2 and the outer edge of the depression 10B are determined to measure the distance DS2 between the points C2 and D2. Furthermore, a straight line L3 passing through the middle point M and inclined at 120° from the straight line L1 and not overlapping with the straight line L2 is drawn, and the intersection points C3 and D3 between the straight line L3 and the outer edge of the depression 10B are determined to measure the distance DS3 between the points C3 and D3. Finally, the average of the distances DS1 to DS3 is calculated to determine the width.

The "depth of a depression" as described above refers to the distance from a reference level to the deepest position of the depression in the depth direction D1 (see FIG. 3). The depth of each depression as described above should be determined by the following procedure. First of all, while one depression in a 5-μm square region on the front surface 10A of the optical film 10 is observed with an atomic force microscope, arbitrary points E and F are selected, as shown in FIG. 2, to measure depths along the axis from the point E to the point F. Then, the largest among the depths along the axis from the point E to the point F is found. Once the surface profile of an optical film is taken under the atomic force microscope, the reference level for depth measurement is automatically determined. Then, the measurement is performed on 3 different positions, and the arithmetic mean of the depths measured at the 3 positions should be calculated to obtain the depth of the depressions. Some depressions 10B may have a local deep hole with an aspect ratio of 5 or more on the bottom surfaces. When the hole is taken into consideration for measurement of the depth of a depression 10B, the depth of the depression 10B is not accurately determined. Then, the points E and F are selected in such a manner that any local deep hole as described above is not located on the axis from the point E to the point F. The minimum depth of depressions 10B may be 3 nm or more, 5 nm or more, or 10 nm or more. The maximum depth of the depressions is preferably 100 nm or less because depressions with such a maximum depth exert their functions but do not act as starting points of microcrack formation during durability testing and are preferably not regarded as defects when macroscopically observed by naked eyes.

In an optical film 10 that has not been subjected to a rubber eraser abrasion test, a 5-μm square (5 μm×5 μm) region on the front surface 10A of the optical film 10 may or may not include 1 or more and 50 or less depressions 10B when the above-described region is observed. That is, depressions 10B will appear or not appear on the optical film 10 that has not been subjected to a rubber eraser abrasion test, depending on the constitutive components of the functional layer 12, conditions for drying a functional layer composition in the construction of the functional layer 12, and the like. However, depressions 10B are potentially present in the optical film 10 that has not been subjected to a rubber eraser abrasion test, even if the presence of the depressions 10B is not detected. It is believed that once some components inside depressions 10B or on depressions 10B are removed by a rubber eraser abrasion test (500 g×4,000 times) or a rubber eraser abrasion test (1,000 g×5,000 times), the depressions 10B will appear after the rubber eraser abrasion test. In the optical film 10 that has not been subjected to a rubber eraser abrasion test, a 5-μm square region on the front surface 10A of the optical film 10 may include 3 or more depressions 10B or 5 or more depressions 10B when the above-described region is observed. In this specification, the "optical film that has not been subjected to a rubber eraser abrasion test" should refer to an optical film that has not yet undergone a rubber eraser abrasion test such as the rubber eraser abrasion test (500 g×4,000 times) or the below-described rubber eraser abrasion test (1,000 g×5,000 times). Depressions 10B in the optical film 10 that has not been subjected to a rubber eraser abrasion test should be observed by the same method as for depressions 10B in the optical film 10 subjected to the rubber eraser abrasion test (500 g×4,000 times).

Additionally, when a 5-μm square (5 μm×5 μm) region on the front surface 10A of the optical film 10 is observed using an atomic force microscope (AFM) (for example, product name: "WET-9100"; manufactured by Shimadzu Corporation) after the optical film 10 is subjected to a rubber eraser abrasion test in which the front surface 10A of the optical film 10 is rubbed 5,000 times with a rubber eraser in a reciprocating motion under a load of 1,000 g (the test is hereinafter referred to as the rubber eraser abrasion test (1,000 g×5,000 times)), the square region is observed to have, preferably, 1 or more and 50 or less depressions 10B having a ring shape with an outer diameter of 0.5 μm or more and 2.5 μm or less and with a depth of 1 nm or more and 150 nm or less, a circular shape with a diameter of 0.5 μm or more and 2.5 μm or less and with a depth of 1 nm or more and 150 nm or less, or an irregular shape with a width of 0.5 μm or more and 2.5 μm or less and with a depth of 1 nm or more and 150 nm or less. The rubber eraser abrasion test (500 g×4,000 times) is normally competent enough to evaluate scratch resistance and abrasion resistance, but a rubber eraser abrasion test under harsher conditions is currently required for the evaluation, expecting those who strongly and frequently press a stylus to move the stylus on the surface. The rubber eraser abrasion test (1,000 g×5,000 times) is performed to address the requirement. Depressions 10B in the optical film 10 subjected to the rubber eraser abrasion test (1,000 g×5,000 times) should be observed by the same method as for depressions 10B in the optical film 10 subjected to the rubber eraser abrasion test (500 g×4,000 times).

A projection 10C with a height of 1 nm or more is preferably located within each depression 10B or inside each depression 10B. The presence of such a projection 10C within each depression 10B or inside each depression 10B can increase the ratio of maintained contact angle as described below. Projections 10C can be confirmed by observation with an atomic force microscope (AFM) (for example, product name: "WET-9100"; manufactured by Shimadzu Corporation). Additionally, the height of a projection 10C should be calculated by finding the highest height of a projection 100 among the height values of projections 10C measured during the observation. Specifically, the height of a projection 10C should be determined by the following procedure. First of all, while one projection 10C in a 5-µm square region on the front surface 10A of the optical film 10 is observed with an atomic force microscope, heights are measured along the axis from the point E to the point F, as shown in FIG. 4, which is the axis drawn above to connect the points E and F. Then, the largest among the heights along the axis from the point E to the point F is found. Once the surface profile of an optical film is taken under the atomic force microscope, the reference level for height measurement is automatically determined.

The absolute value of the difference in the arithmetic mean height (Sa) of a 5-µm square region on the front surface 10A of the optical film 10 measured using an atomic force microscope (for example, product name: "AFM-5500"; manufactured by Hitachi High-Technologies Corporation) between before and after the rubber eraser abrasion test (1,000 g×5,000 times) is preferably 10 nm or less. If the difference is 10 nm or less, it is considered that areas intended to provide smoothness and to provide hardness remain to provide a well-balanced combination of those functions, which can maintain favorable physical properties of the optical film. The reason why the absolute value of the difference in the arithmetic mean height (Sa) between before and after the rubber eraser abrasion test (1,000 g×5,000 times) is used is because a rubber eraser abrasion test performed under a load of 1,000 g is so harsh that the front surface of an optical film subjected to the rubber eraser abrasion test becomes rough and depressions are often deformed, which makes it difficult to characterize the depressions, differing from a rubber eraser abrasion test under a load of 500 g. The minimum absolute value of the difference is preferably 0.005 nm or more, more preferably 0.001 nm or more. In consideration of abrasion resistance and scratch resistance, it seems to be better for an optical film to show no change in Sa. However, when an optical film has film properties that lead to no change in Sa, various external impacts are less absorbed by the optical film, and microcracks may be formed in the optical film, and it may be difficult for the optical film to provide excellent foldability. Thus, the maximum Sa value is more preferably 7 nm or less, 5 nm or less, or 3 nm or less. The definition of Sa should follow the ISO25178 standard. Sa is a three-dimensional parameter extended from the two-dimensional average roughness Ra (see FIG. 6) and represents the average of absolute height values Z(x, y) in a measured area (A), and refers to the arithmetic mean of heights in a measured region, where troughs are transformed into peaks in the three-dimensional representation of the measured region when all the values representing the troughs and peaks are converted to absolute values. The above-described two dimension does not refer to a plane. For example, in cases where a plane is denoted by x and y, and where the height is denoted by z, a two-dimensional space is given by a line and a height, or x and z, or y and z, and a three-dimensional space is given by a plane and a height, or x, y, and z. Specifically, a Sa value can be calculated by the following equation (1), where A represents the area of a measured region.

$$Sa = \frac{1}{A} \int\int_A |Z(x, y)| dx dy \quad (1)$$

The arithmetic mean height (Sa) should be determined using an atomic force microscope (for example, product name: "AFM-5500"; manufactured by Hitachi High-Technologies Corporation) as follows. Specifically, an optical film that has not been subjected to a rubber eraser abrasion test is first cut into a piece with a size of 50 mm×100 mm to obtain a sample similar to the sample S1. Then, three areas where at least no macroscopic abnormality is seen (areas which carry, for example, no foreign bodies or scratches) are randomly selected in the sample, and the sample is cut into 5-mm squares to obtain three measurement samples. Meanwhile, a plural number of flat and circular metal plates with a diameter of 15 mm and a thickness of 1 mm are provided, and each metal plate is attached with a piece of a double-sided carbon coated tape manufactured by Nissin EM Co., Ltd. Each measurement sample is attached to each piece of the tape in such a manner that the surface of the measurement sample (the surface of the optical film) faces upward. Then, the metal plates attached with the measurement samples are left in a desiccator overnight for secure adhesion between the tape and the samples. After left overnight, each metal plate with an attached measurement sample is placed on a stage of an atomic force microscope (product name: "AFM-5500"; manufactured by Hitachi High-Technologies Corporation), and the surface profiles on 5-µm square measurement areas are observed with the atomic force microscope in tapping mode. Then, the Sa is calculated from the observation data using the surface analysis software installed in the atomic force microscope. The vertical scale during the surface analysis is 20 nm. The observation is performed at room temperature, and a cantilever SI-DF40P2 manufactured by Olympus Corporation is used as a cantilever. In the observation of surface profile, five positions are randomly selected from each of the three measurement samples and the surface profile is observed at the 15 positions in total (three measurement samples×five positions). Then, the surface analysis software installed in the atomic force microscope is used to calculate Sa values from all the obtained data from the 15 positions, and the arithmetic means of the values from the 15 positions is determined as the Sa of the measurement samples. The arithmetic mean height (Sa) is also measured in an optical film subjected to the rubber eraser abrasion test (1,000 g×5,000 times) by the same method as for the optical film that has not been subjected to a rubber eraser abrasion test.

The front surface 10A of an optical film 10 that has not been subjected to a rubber eraser abrasion test may have an arithmetic mean height (Sa) of 10 nm or less in a 5-µm square region. The maximum Sa value may be 7 nm or less, 4 nm or less, 1 nm or less, or 0.8 nm or less. The maximum Sa value as described above can provide high transparency and low haze in spite of the presence of depressions as described above, or even if these depressions appear after the rubber eraser abrasion test. Additionally, the maximum value as described above is considered to be effective in providing depressions after the rubber eraser abrasion test, which can provide favorable film properties. Above the maximum value, it becomes difficult to control film properties, which may cause failure to provide favorable physical properties. Moreover, the minimum Sa value may be 0.01 nm or more, or 0.05 nm or more, in consideration of preventing film sticking during the production process where the optical film is possibly overlaid on itself to produce a film roll or film sheets.

The front surface 10A of the optical film 10 subjected to the rubber eraser abrasion test (1,000 g×5,000 times) may have an arithmetic mean height (Sa) of 7±0.005 nm or less in a 5-μm square region. This is because even a slight change in the Sa value between before and after the rubber eraser abrasion test (1,000 g×5,000 times) is better than no change, as described above. The variation in the value may be increased or decreased. The maximum Sa value may be 6 nm or less, 5 nm or less, or 3 nm or less. Moreover, the minimum Sa value may be 0.01 nm or more, or 0.05 nm or more, in consideration of preventing film sticking and of providing a front surface 10A with favorable depressions as described above during the production process where the optical film is possibly overlaid on itself to produce a film roll or film sheets.

The front surface 10A of an optical film 10 that has not been subjected to a rubber eraser abrasion test has a dynamic friction coefficient (at a load of 500 g or 1,000 g) of 0.70 or less. When the dynamic friction coefficient (at a load of 500 g or 1,000 g) is 0.70 or less, excellent initial smoothness can be achieved, and superior scratch and abrasion resistance can be thus provided. An excessively low dynamic friction coefficient may cause sliding of a film due to the high smoothness of the film when the film is wound up into a roll. Thus, the lower limit of the above dynamic friction coefficient (at a load of 500 g or 1,000 g) is preferably 0.20 or more, more preferably 0.25 or more. The upper limit of the above dynamic friction coefficient (at a load of 500 g or 1,000 g) is preferably 0.65 or less, or 0.60 or less. Such a dynamic friction coefficient (at a load of 500 g or 1,000 g) can be obtained by, for example, allowing the functional layer 12 to contain a lubricant and an antifouling agent or to contain not a single but multiple types of antifouling agents or an antifouling agent containing different types of elements in the absence of a lubricant. In contrast, the dynamic friction coefficient (at a load of 500 g or 1,000 g) is not reduced so much and a dynamic friction coefficient as described above is not provided in cases where the functional layer contains a single type of additive: for example, where the functional layer contains a lubricant but not an antifouling agent, where the functional layer contains an antifouling agent but not a lubricant, or where the functional layer contains only a single type of antifouling agent. In the optical film of the present invention, depressions appear after the optical film is subjected to a rubber eraser abrasion test, and a depression-free region is also included. Such a surface with a certain type of uniformity promotes reduction in dynamic friction coefficient (at a load of 500 g or 1,000 g) and is considered to be effective on scratch resistance and abrasion resistance.

The above dynamic friction coefficient can be determined using a dynamic friction abrasion testing device (for example, product name: "Handy Tribomaster Type TL201 Ts", manufactured by Trinity-Lab Inc.) as follows. This testing device can perform real-time measurement of dynamic friction coefficient as well as can simulate a rubber eraser abrasion test. Therefore, the rubber eraser abrasion test performed in conjunction with the determination of dynamic friction coefficient is different from a rubber eraser abrasion test performed using a color fastness rubbing tester. The dynamic friction coefficient of the front surface 10A of the optical film 10 determined before a rubber eraser abrasion test should be a dynamic friction coefficient obtained after one reciprocating motion in the below-described pseudo-rubber eraser abrasion test, and the dynamic friction coefficient (at a load of 500 g) of the front surface 10A of the optical film 10 determined after the rubber eraser abrasion test (500 g×4,000 times) should be a dynamic friction coefficient obtained after 4,000 reciprocating motions in the pseudo-rubber eraser abrasion test, and the dynamic friction coefficient (at a load of 1,000 g) of the front surface 10A of the optical film 10 determined after the rubber eraser abrasion test (1,000 g×5,000 times) should be a dynamic friction coefficient obtained after 5,000 reciprocating motions in the pseudo-rubber eraser abrasion test.

Specifically, a rubber eraser is first provided. A rubber eraser similar to that used for the rubber eraser abrasion test (500 g×4,000 times) is used as a rubber eraser for use in the determination of dynamic friction coefficient. In the present embodiment, a pencil with a rubber eraser should be used as the rubber eraser to perform the rubber eraser abrasion test. Once a pencil with a rubber eraser (product name: "Pencil for office use #9852 (with a rubber eraser)"; manufactured by Mitsubishi Pencil Co., Ltd.) is provided, the pencil is cut at a distance of 50 mm from the tip of the rubber eraser. Then, the cut end of pencil with a rubber eraser, as opposed to the rubber eraser, is attached to a jig having a hole with a diameter of 6 mm, similarly to the rubber eraser abrasion test (500 g×4,000 times). Subsequently, the jig with the pencil with a rubber eraser is immobilized on a measurement unit of the dynamic friction abrasion testing device along the axis of the measurement unit by means of a double-sided tape. Then, a specialized software program (Tribo-Analysis Software) is started on the screen of a personal computer (PC) electrically connected to the dynamic friction abrasion testing device with the pencil immobilized on the measurement unit. Meanwhile, an optical film 10 that has not been subjected to a rubber eraser abrasion test is cut into pieces with a size of 50 mm×100 mm to obtain six samples S1. Among the six samples S1, three samples S1 are for determining a dynamic friction coefficient (at a load of 500 g) obtained before a rubber eraser abrasion test and a dynamic friction coefficient (at a load of 500 g) obtained after a rubber eraser abrasion test (500 g×4,000 times), and the remaining three samples S1 are for determining a dynamic friction coefficient (at a load of 1,000 g) obtained before a rubber eraser abrasion test and a dynamic friction coefficient (at a load of 1,000 g) obtained after a rubber eraser abrasion test (1,000 g×5,000 times). Then, a frame-shaped mark M1 with a size of 20 mm×40 mm is drawn with a permanent marker on the back surface of each sample S1 (by the side of resin base material), as shown in FIG. 5, so that the center of a region to be rubbed will be easily recognized. The mark M1 is drawn in such a manner that the longitudinal direction is parallel to the longitudinal direction D2 of the sample S1. Subsequently, a tape named Cello-tape® is stuck on the four sides to immobilize the sample S1 on a driving unit of the dynamic friction abrasion testing device in such a manner that the surface to determine the dynamic friction coefficient faces upward and the sample S1 lying on the surface of the driving unit has no wrinkle. The sample S1 is placed on the driving unit in such a manner that the moving direction of the driving unit is in the longitudinal direction D2 of the sample S1 and the center of a region to be rubbed is matched with the center of the mark M1. Additionally, a weight of 500 g is immobilized on the upper surface of the jig by means of a double-sided tape to make the rubber eraser in the measurement unit placed in contact with and perpendicular to the surface of the sample S1. After the rubbing distance (in one way), the rubbing speed, the number of reciprocating motions, and the measurement mode are respectively set to 20 mm, 40 rounds/min, 4,000 times, and the continuous measurement mode, a switch on the screen of the PC is pressed to start determination of the dynamic friction coefficient of the sample S1 in an environment at a temperature of 23±5° C. and a relative humidity of 30% or more and 70% or less. This allows a pseudo-rubber eraser abrasion test (500 g×4,000 times), which simulates the rubber eraser abrasion test (500 g×4,000 times), to proceed. During the pseudo-rubber eraser abrasion test, the frictional force is continuously measured to plot a graph where the horizontal axis represents the time and the vertical axis represents the frictional force. The dynamic friction coefficient at a time point corresponding to each of the reciprocating motions is calculated by dividing the frictional force by the normal force at the particular time point. The normal force refers to a load applied to the rubber eraser. The dynamic friction coefficients (at a load of 500 g) of the front surface 10A of the optical film 10 determined before and after the rubber eraser abrasion test (500 g×4,000 times) should be the arithmetic mean of dynamic friction coefficient values (at a load of 500 g) obtained in the three samples S1, where the values are measured in the three samples. Moreover, the remaining three samples are similarly used to perform a pseudo-rubber eraser abrasion test (1,000 g×5,000 times), as well as to determine the dynamic friction coefficients before and after the rubber eraser abrasion test. In this case, the weight of 500 g is replaced with a weight of 1,000 g, and the number of reciprocating motions is set to 5,000 times. The dynamic friction coefficient (at a load of 1,000 g) of the front surface 10A of the optical film 10 determined after the rubber eraser abrasion test (1,000 g×5,000 times) should be the arithmetic mean of dynamic friction coefficient values (at a load of 1,000 g) obtained in the remaining three samples S1, where the values are measured in the three samples. Prior to every measurement, the position of the rubber eraser is corrected in such a manner that the length of the rubber eraser exposed from the jig is around 1.5 mm (for example, a length of 1 mm to 2 mm).

The change rate of the dynamic friction coefficient (at a load of 500 g) of the front surface 10A of the optical film 10 between before and after the rubber eraser abrasion test (500 g×4,000 times) is up to 35%. When the change rate of dynamic friction coefficient is up to 35%, surface smoothness can be maintained even if the surface is rubbed 4,000 times with a rubber eraser, and superior scratch and abrasion resistance can be thus provided, as well as the excellent antifouling property, which is important when the optical film is used for the surface of an image display device, can be maintained. The dynamic friction coefficient, but not the static friction coefficient, is examined here because it is believed that the conditions on the front surface 10A of the optical film 10 during the rubber eraser abrasion test can be evaluated by the dynamic friction coefficient. The change rate of dynamic friction coefficient is more preferably up to 20%, most preferably up to 15%. Furthermore, the change rate of the dynamic friction coefficient (at a load of 500 g) of the front surface 10A of the optical film 10 between before and after a pseudo-rubber eraser abrasion test is preferably up to 35%, where the pseudo-rubber eraser abrasion test is performed by rubbing the front surface of the optical film 1,000, 2,000, 3,000, 4,000, or 5,000 times with a rubber eraser in a reciprocating motion under a load of 500 g.

The change rate of the dynamic friction coefficient (at a load of 1,000 g) of the front surface 10A of the optical film 10 between before and after the rubber eraser abrasion test (1,000 g×5,000 times) is up to 35%. When the change rate of dynamic friction coefficient is up to 35%, surface smoothness can be maintained even if the surface is rubbed 5,000 times with a rubber eraser, and superior scratch and abrasion resistance can be thus provided, as well as the excellent antifouling property, which is important when the optical film is used for the surface of an image display device, can be maintained. The change rate of dynamic friction coefficient is more preferably up to 20%, most preferably up to 15%. Furthermore, the change rate of the dynamic friction coefficient (at a load of 1,000 g) of the front surface 10A of the optical film 10 between before and after a pseudo-rubber eraser abrasion test is preferably up to 35%, where the pseudo-rubber eraser abrasion test is performed by rubbing the front surface of the optical film 1,000, 2,000, 3,000, 4,000, or 5,000 times with a rubber eraser in a reciprocating motion under a load of 1,000 g.

The above change rate of dynamic friction coefficient is calculated by the following equation (2), where A represents a change rate, and B represents the dynamic friction coefficient of the front surface of an optical film that has not been subjected to a rubber eraser abrasion test, and C represents the dynamic friction coefficient of the front surface of the optical film subjected to the rubber eraser abrasion test. The change rate A should be an absolute value.

$$A=|\{(C-B)/B\}\times 100| \qquad (2)$$

The dynamic friction coefficient (at a load of 500 g) of the front surface 10A of the optical film 10 determined after the rubber eraser abrasion test (500 g×4,000 times) may be lower than the dynamic friction coefficient (at a load of 500 g) of the front surface 10A of the optical film 10 determined before the rubber eraser abrasion test. When the dynamic friction coefficient (at a load of 500 g) of the front surface 10A of the optical film 10 satisfies the relationship as described above, the front surface 10A of the optical film 10 subjected to the rubber eraser abrasion test (500 g×4,000 times) is smoother than that prior to the rubber eraser abrasion test, and more superior scratch and abrasion resistance can be thus provided to the optical film 10 that has been subjected to the rubber eraser abrasion test (500 g×4,000 times). Additionally, when a dynamic friction coefficient (at a load of 500 g) obtained before a rubber eraser abrasion test is compared with a dynamic friction coefficient (at a load of 500 g) obtained after a rubber eraser abrasion test with 1,000 times of rubbing, a smaller absolute value of the difference between the dynamic friction coefficient values is more preferable. The smaller difference means the presence of excellent initial abrasion resistance. The functional layer 12 as described above is considered to have film properties that allow effective separation of features, such as particularly smoothness and hardness, before a rubber eraser abrasion test. The above dynamic friction coefficient (at a load of 500 g) obtained after the rubber eraser abrasion test (500 g×4,000 times) is preferably 0.70 or less, 0.65 or less, or 0.60 or less. An excessively low dynamic friction coefficient may cause sliding of a film due to the high smoothness of the film when the film is wound up into a roll. Thus, the lower limit of the above dynamic friction coefficient (at a load of 500 g) obtained after the rubber eraser abrasion test (500 g×4,000 times) is preferably 0.2 or more, more preferably 0.25 or more. Such a dynamic friction coefficient (at a load of 500 g) can be obtained by, for example, allowing the functional layer 12 to contain a lubricant and an antifouling agent or to contain not a single but multiple types of antifouling agents or an antifouling agent containing different types of elements in the absence of a lubricant.

The dynamic friction coefficient (at a load of 1,000 g) of the front surface 10A of the optical film 10 determined after the rubber eraser abrasion test (1,000 g×5,000 times) may be lower than the dynamic friction coefficient (at a load of 1,000 g) of the front surface 10A of the optical film 10 determined before the rubber eraser abrasion test. When the dynamic friction coefficient of the front surface 10A of the optical film 10 satisfies the relationship as described above, the front surface 10A of the optical film 10 subjected to the rubber eraser abrasion test (1,000 g×5,000 times) is smoother than that prior to the rubber eraser abrasion test, and more superior scratch and abrasion resistance can be thus provided to the optical film 10 that has been subjected to the rubber eraser abrasion test (1,000 g×5,000 times). Additionally, when a dynamic friction coefficient (at a load of 1,000 g) obtained before a rubber eraser abrasion test is compared with a dynamic friction coefficient (at a load of 1,000 g) obtained after a rubber eraser abrasion test with 1,000 times of rubbing, a smaller absolute value of the difference between the dynamic friction coefficient values is more preferable. The smaller difference means the presence of excellent initial abrasion resistance. The functional layer 12 as described above is considered to have film properties that allow effective separation of features, such as particularly smoothness and hardness, before a rubber eraser abrasion test. The above dynamic friction coefficient (at a load of 1,000 g) obtained after the rubber eraser abrasion test (1,000 g×5,000 times) is preferably 0.65 or less, 0.60 or less, or 0.55 or less. An excessively low dynamic friction coefficient may cause sliding of a film due to the high smoothness of the film when the film is wound up into a roll. Thus, the lower limit of the above dynamic friction coefficient (at a load of 1,000 g) obtained after the rubber eraser abrasion test (1,000 g×5,000 times) is preferably 0.20 or more, more preferably 0.25 or more. Such a dynamic friction coefficient (at a load of 1,000 g) can be obtained by, for example, allowing the functional layer 12 to contain a lubricant and an antifouling agent or to contain not a single but multiple types of antifouling agents or an antifouling agent containing different types of elements in the absence of a lubricant.

Preferably, the ratio of the contact angle of water on the front surface 10A of the optical film 10 measured after the rubber eraser abrasion test (500 g×4,000 times) to that measured before the rubber eraser abrasion test, namely the ratio of maintained contact angle, is 80% or more in cases where the rubber eraser abrasion test (500 g×4,000 times) is performed on the front surface 10A of the optical film 10. When the ratio of maintained contact angle is 80% or more, most of the antifouling agent remains without being scraped off from the front surface 10A of the optical film 10 by the rubber eraser abrasion test. That is, depressions appearing after the rubber eraser abrasion test (500 g×4,000 times) are well-balanced with the depression-free region, from which the optical film 10 can be considered to have superior abrasion resistance, as well as can have an excellent antifouling property.

More preferably, the ratio of the contact angle of water on the front surface 10A of the optical film 10 measured after the rubber eraser abrasion test (1,000 g×5,000 times) to that measured before the rubber eraser abrasion test, namely the ratio of maintained contact angle, is 80% or more in cases where the rubber eraser abrasion test (1,000 g×5,000 times) is performed on the front surface 10A of the optical film 10. When the ratio of maintained contact angle is 80% or more, the optical film 10 can be considered to have more superior abrasion resistance, as well as can have a more excellent antifouling property.

Each of the contact angles of water is measured using a microscopic contact angle meter (for example, product name: "DropMaster 300"; manufactured by Kyowa Interface Science Co., Ltd.) according to the sessile drop method described in JIS R3257: 1999. Specifically, the sample S1 that has not been subjected to a rubber eraser abrasion test is first cut into a piece with a size of 30 mm×50 mm to obtain a measurement sample. The measurement sample is cut so as to include a frame-shaped mark M1 with a size of 20 mm×40 mm. Then, the measurement sample is placed flat on a glass slide with a size of 25 mm×75 mm by means of a double-sided tape. The measurement sample is placed in such a manner that the above-described frame is located within the glass slide. A double-sided tape equal to or larger than the above-described frame in size should be used to place the measurement sample flat on the glass slide. Moreover, the measurement sample is placed in such a manner that the above-described frame is located within the glass slide. That is, the measurement sample is arranged in the following order: a glass slide/a double-sided tape/the measurement sample. Subsequently, ions generated with an ionizer (for example, product name: "KD-730B", manufactured by Kasuga Denki, Inc.) are applied for 30 seconds to eliminate static electricity on the measurement sample and thereby to prevent static electricity on the measurement sample from influencing the measurement result. After the static electricity is eliminated, a 1-µL drop of water is placed on the surface of the functional layer by means of a syringe, and is left to stand for 5 seconds. Then, the microscopic contact angle meter is switched on to measure the contact angle of water. The measurement of contact angle is performed in an environment at a temperature of 23±5° C. and a relative humidity of 30% or more and 70% or less. Moreover, the contact angle is measured at 10 different position, and the arithmetic mean of the measured values is defined as the contact angle on the front surface of the optical film measured before a rubber eraser abrasion test. The contact angle of water on the front surface of the optical film measured after the rubber eraser abrasion test (500 g×4,000 times) and the contact angle of water on the front surface of the optical film measured after the rubber eraser abrasion test (1,000 g×5,000 times) are measured by the same method as for the contact angle of water on the front surface of the optical film before a rubber eraser abrasion test, except that the sample S1 subjected to the rubber eraser abrasion test (500 g×4,000 times) and the sample S1 subjected to the rubber eraser abrasion test (1,000 g×5,000 times) are respectively used for the measurement.

The above ratio of maintained contact angle should be calculated by the following equation (3), where D represents a ratio of maintained contact angle (%), and E represents the contact angle of water on the front surface of an optical film measured before a rubber eraser abrasion test, and F represents the contact angle of water on the front surface of the optical film measured after the rubber eraser abrasion test.

$$D = F/E \times 100 \qquad (3)$$

The contact angle of water on the front surface 10A of the optical film 10 measured before a rubber eraser abrasion test is preferably 100° or more. When the contact angle is 100° or more, an excellent antifouling property is provided, which can prevent deposition of fingerprints or dirt and promotes removal of fingerprints or dirt, if any, by wiping. More preferably, the lower of the contact angle of water on the front surface 10A of the optical film 10 is 95° or more and the upper limit of that is 120° or less.

Preferably, no scratches are found on the front surface 10A of an optical film 10 when the optical film 10 that has not been subjected to a rubber eraser abrasion test is subjected to a steel-wool scratch test by rubbing the front surface 10A of the optical film 10 (the front surface 12A of the functional layer 12) 5,000 times with steel wool in a reciprocating motion under a load of 1 kg/cm$^2$. The steel-wool scratch test is performed by the following procedure. First of all, an optical film 10 that has not been subjected to a rubber eraser abrasion test is cut into a piece with a size of 50 mm×100 mm to obtain a sample. Then, the sample is immobilized on a sample stage of a color fastness rubbing tester (for example, product name: "AB-301"; manufactured by Tester Sangyo Co., Ltd.) in such a manner that the surface of the sample (the front surface of the optical film) faces upward and the sample lying flat on the sample stage has no wrinkle or no curl. Subsequently, a wad of steel wool with a grade of #0000 (product name: "Bonstar B-204"; manufactured by Nihon Steel Wool Co., Ltd.) is mounted on the tester and brought into contact with the surface of the sample, and is allowed to rub the front surface 5,000 times under a load 1 kg/cm$^2$ by moving reciprocally at a speed of 100 mm/sec through a distance of 200 mm in both ways (100 mm in one way). The contact area between the steel wool and the surface of the sample should 1 cm$^2$. Unless otherwise noted, the test environment should have a temperature of 23±5° C. and a relative humidity of 30% or more and 70% or less. The above Bonstar B-204 has a width of about 390 mm, a length of about 75 mm, and a thickness of about 110 mm for commercial uses. The wad of steel wool is torn off (not chopped with a cutting tool because chopped steel wool fiber have sharp edges) from the original mass of steel wool and is uniformly rounded into a ball until specific wires extended from the steel wool are laid on the surface of the ball. Then, the tester is set in such a manner that the thickness of the steel wool is reduced to 20 mm when a load of 1 kg is applied, provided that the contact area is 1 cm$^2$. Finally, the sample is observed under transmitting fluorescent light (illuminance on the sample: 800 to 1200 Lx; observation distance: 30 cm) and under LED light (illuminance on the sample: 4,000 to 6,000 Lx; observation distance: 30 cm) by naked eyes to determine whether any scratch is found or not.

The front surface 10A of an optical film 10 that has not been subjected to a rubber eraser abrasion test preferably has a hardness (pencil hardness) or 3H or harder, more preferably 6H, further preferably 7H or harder, as measured by the pencil hardness test specified by JIS K5600-5-4: 1999. The pencil hardness test is performed by the following procedure. First of all, an optical film that has not been subjected to a rubber eraser abrasion test is cut into a piece with a size of 50 mm×100 mm to obtain a sample. Then, the sample is immobilized on a glass plate by means of a tape called Cello-tape®, manufactured by Nichiban Co., Ltd., in such a manner that the functional layer faces upward and the sample lying on the glass plate has no fold or no wrinkle. Then, a pencil is moved on the sample at a scratching speed of 1 mm/sec by applying a load of 500 g to the pencil. The grade of the hardest pencil that does not scratch the surface of the sample during the pencil hardness test is determined as the pencil hardness of the sample. A plural number of pencils with different hardness are used for the measurement of pencil hardness and the pencil hardness test is repeated five times for each pencil. If no scratch is made on the surface of the sample with a pencil with specific hardness in four or more out of the five replicates, the pencil with the hardness is determined to make no scratch on the surface of the sample. The above-described scratch refers to a scratch which is visibly detectable when the surface of the sample subjected to the pencil hardness test is observed under transmitting fluorescent light.

Preferably, no crack or break is formed in the optical film 10 even if the optical film 10 is folded in such a manner that the gap distance φ between opposing edges of the optical film 10 reaches 2 mm and the functional layer 12 faces inward, and then unfolded, and the process (the folding test) is repeated 100,000 times, 200,000 times, 500,000 times, or 1,000,000 times, in an environment at a temperature of 23±5° C. and a relative humidity of 30% or more and 70% or less. In cases the folding test is repeated 100,000 times on the optical film 10 and the resulting optical film 10 is, for example, cracked or broken, it means that the optical film 10 is low in foldability. As the number of the above folding events is increased, the formation of cracks or breaks is promoted. Accordingly, from a technical viewpoint, there is a significant difference between optical films in which no crack or break is formed after the folding test is repeated 200,000 times, 300,000 times, 500,000 times, or 1,000,000 times and those in which no crack or break is formed after the folding test is repeated 100,000 times. Moreover, the reason why the above folding test is repeated at least 100,000 times for evaluation purposes is as described below. For example, assuming that an optical film is incorporated in a foldable smartphone, the frequency of folding (the frequency of opening and closing) is very high. Thus, an evaluation obtained by the above folding test with, for example, 10,000 or 50,000 folding events is unlikely to be practically meaningful. Specifically, assuming, for example, those who constantly use a smartphone, the smartphone is supposed to be opened and closed at a frequency of 5 to 10 times even during a morning commute by, for example, train or bus, and is supposed to be opened and closed at least 30 times even for one day. Thus, assuming that a smartphone is opened and closed 30 times for one day, a folding test with 10,000 folding events is considered as a test assuming that the smartphone is used for one year because 30 times multiplied by 365 days equals 10,950 times. It means that an optical film in the smartphone may be cracked or broken after using the smartphone for one year, even if the optical film shows a good evaluation result in the folding test with 10,000 folding events. Accordingly, an evaluation obtained by the folding test with 10,000 folding events is only sufficient for identification of optical films with a level for which the optical films are not usable as commercial products, and even optical films that can be used but are insufficient are evaluated as good in such a folding test and are not able to be properly evaluated. Thus, the evaluation should be performed by the above folding test with at least 100,000 folding events, to assess whether or not an optical film is practically sufficient. More preferably, no crack or break is also formed in the optical film 10 even if the optical film 10 is folded in such a manner that the gap distance φ between opposing edges of the optical film 10 reaches 3 mm and the functional layer 12 faces outward, and then unfolded, and the process is repeated 100,000 times.

In the above folding test, the optical film 10 is folded in such a manner that the gap distance φ between the opposing edges reaches 2 mm. However, in consideration of making image display devices thinner, the optical film 10 is more preferred to form no crack or break even if a folding test with 100,000 folding events is performed in such a manner that the gap distance φ between the opposing edges is further reduced, particularly to 1 mm. As the length of the above gap distance φ is reduced, it becomes more difficult to avoid formation of cracks or breaks even if the number of folding events is not changed. Accordingly, from a technical viewpoint, there is a significant difference between optical films in which no crack or break is formed after repeating the folding test in which the above gap distance φ is 1 mm and those in which no crack or break is formed after repeating the folding test in which the above gap distance φ is 2 mm.

When the folding test is performed, a sample S2 with a predetermined size (for example, in a rectangular shape with a size of 125 mm×50 mm) is first cut out from an optical film 10 that has not been subjected to a folding test (see FIG. 8). In cases where it is impossible to cut the optical film to the sample with a size of 125 mm×50 mm, the optical film should be cut into a rectangular sample with a size enough for the below-described evaluations following the folding test, such as 80 mm×25 mm. After the sample S2 is cut out from the optical film 10 that has not been subjected to a folding test, the above folding test is performed on the sample S2.

The folding test is performed by the following procedure. The folding test starts with fixing an edge S2a and an edge S2b, which is opposite to the edge S2a, of the sample S2 to fixing members 15 arranged parallel to each other, as shown in FIG. 7(A), of a folding endurance testing machine (for example, product name: "Tension Free U-shape Folding Test Machine DLDMLH-FS"; manufactured by Yuasa System Co., Ltd.; in accordance with IEC 62715-6-1). The sample S2 is fixed by the fixing members 15 holding the longitudinal edges of the sample S2 within about 10 mm on each side. However, in cases where the sample S2 has a much smaller size than the above-described size, the sample S2 can be fixed to the fixing members 15 by means of a tape and then be provided for the measurement if the length required for fixing the sample is up to about 20 mm (that is, a sample with the smallest size is 60 mm×25 mm in size). In addition, the fixing members 15 can slide in the horizontal direction, as shown in FIG. 7(A). Preferably, the above testing machine can conduct an evaluation of the durability of a sample against bending load without creating tension or friction inside the sample, differing from, for example, a conventional method in which a sample is wrapped around a rod.

Next, the fixing members 15 are moved close to each other to allow the sample S2 to be folded and deformed along a line passing through the middle point S2c, as shown in FIG. 7 (B); the fixing members 15 are further moved until the gap distance φ between the two opposing edges S2a and S2b of the sample S2 fixed to the fixing members 15 reaches 2 mm, as shown in FIG. 7(C); subsequently, the fixing members 15 are moved in opposite directions to resolve the deformation of the sample S2.

As shown in FIGS. 7(A) to (C), the fixing members 15 can be moved to allow the sample S2 to be folded along the line passing through the middle point S2c. Additionally, the gap distance φ between the two opposing edges S2a and S2b of the sample S2 can be maintained at 2 mm by carrying out the folding test under the following conditions in such a manner that the bent part S2d of the sample S2 is prevented from being forced out beyond the lower edges of the fixing members 15 and the gap distance between the fixing members 25 is controlled to be 2 mm when they approach each other closest. In this case, the outer diameter of the bent part S2d is considered as 2 mm. The thickness of the sample S2 is small enough as compared with the gap distance (2 mm) between the fixing members 25. Thus, it seems unlikely that a difference in the thickness of the sample S2 affects the result of the folding test on the sample S2.

(Folding Conditions)
Reciprocating speed: 80 rpm (revolutions per minute)
Test stroke: 60 mm
Bend angle: 180°

When the above folding test is performed on the sample S2, creases or microcracks are likely to be created at the bent part in the sample S2 subjected to the folding test even if no crack or break is formed, which potentially results in appearance defects, particularly clouding, or interlayer separation (adhesion defect) originating from the microcracks. One of the causes of the clouding is believed to be a change in the crystal structure of an organic compound as a material for any of the layers constituting the optical film. If poor adhesion occurs locally in the optical film, the optical film may allow water or air to fill the space between separated layers in response to changes in temperature or humidity, which may expand the area covered by cloud. Recently, displays not with a simple flat design but with various three-dimensional designs, such as folded or curved designs, are increasingly available. Thus, prevention of crease or microcrack formation on bent parts in optical films is very important to use those optical films in image display devices. Accordingly, the optical film 10 is preferred to have some flexibility. The "flexibility" as used herein refers not only to formation of no crack or break after the above-described folding test, but also to recognition of no crease and microcrack, and is different from the plain meaning of the term "flexibility," which only requires that no crack or break is formed after the above-described folding test.

The above-described creases should be observed by naked eyes, particularly by thoroughly observing both the inner and outer surfaces at the bent part under unfolded conditions in transmitted light and reflected light at a room under a white color illumination (at 800 to 2,000 lux). The above-described creases should be observed in an environment at a temperature of 23±5° C. and a relative humidity of 30% or more and 70% or less.

The above-described microcracks should be observed under a digital microscope. Digital Microscope VHX-5000 manufactured by Keyence Corporation is an example of the digital microscope. The microcracks should be observed in reflected light under darkfield conditions with choosing a ring light as the light source for the digital microscope. Specifically, the sample subjected to the folding test is first slowly unfolded and is immobilized on a stage of the microscope by means of a tape. When the creases are tight, an area to be observed is made as smooth as possible. However, the area to be observed (at the bent part) near the center of the sample should not be touched by hand and is protected from any excessive force. Then, the area on both the inner and outer surfaces should be observed under unfolded conditions. The above-described microcracks should be observed in an environment at a temperature of 23±5° C. and a relative humidity of 30% or more and 70% or less.

For observation of the above-described creases and microcracks, marks M2 should be drawn on both the edges S2d, perpendicular to the folding direction D3 in the bent part S2d, with a permanent marker, to indicate the position of the bent part for ease of finding the position of an area to be observed, as shown in FIG. 8, when the sample that has not been subjected to a folding test is fixed to fixing members of the endurance testing machine and is folded once. Moreover, in the case of a sample showing no creases after the folding test, the sample is dismounted from the endurance testing machine after the folding test, and lines M3 (dotted lines in FIG. 8) connecting the marks M2 on both the edges S2d, of the bent part S2d should be drawn with a permanent marker to prevent the area to be observed from being missed. Then, the entire region of the bent part S2d surrounded by the marks M2 on both the edges S2d, of the bent part S2d and by the lines M3 connecting the marks M2 is observed by naked eyes to find creases. Moreover, for observation of microcracks, the microscope is positioned such that the center of the bent part S2d is in alignment of the center of the field of view (the area surrounded by a double dot-dashed line in FIG. 8) of the microscope. It is noted that the marks are not drawn within the area to be observed in the sample by means of, for example, a permanent marker.

Additionally, the adhesion between the resin base material and the functional layer may be reduced when the above folding test is performed on the sample S2. Thus, it is preferable that no defects, such as separation of layers, are observed near the interface between the resin base material 11 and the functional layer 12 when the bent part of the optical film subjected to the above folding test, particularly the interface between the resin base material 11 and the functional layer 12, is observed with a digital microscope. Digital Microscope VHX-5000 manufactured by Keyence Corporation is an example of the digital microscope.

When an optical film 10 that has not been subjected to a rubber eraser abrasion test is wrapped around a cylinder, with the functional layer 12 facing outward, in accordance with the mandrel test described in JIS K5600-5-1: 1999 (in which a sample is wrapped around a metal cylinder with a diameter of 2 to 32 mm), no crack is preferably formed in the optical film 10 until the diameter of the cylinder is reduced below 20 mm. The above measurement is repeated three times, and the smallest diameter should have the smallest of the three measured values.

In cases where an additional film, such as a polarizing plate, is provided on one surface of the optical film 10 through an adhesive or adhesion layer, the folding test or the mandrel test should be carried out after removing the additional film and the adhesive or adhesion layer in the same manner as described above. The additional film can be removed, for example, as follows. First of all, a laminate consisting of the optical film attached to the additional film through the adhesive or adhesion layer is heated with a hair dryer and is slowly separated by inserting a cutter blade into a possible interface between the optical film and the additional film. By repeating such a process of heating and separation, the adhesive or adhesion layer and the additional film can be removed. Even if such a removal process is performed, the mandrel test is not significantly affected.

The optical film 10 that has not been subjected to a rubber eraser abrasion test preferably has a total light transmittance of 90% or more. The optical film 10 with a total light transmittance of less than 90% may provide insufficient optical performance. The total light transmittance can be measured using a haze meter (for example, product name: "HM-150"; manufactured by Murakami Color Research Laboratory Co., Ltd.) in accordance with JIS K7361-1: 1997. For the total light transmittance, the optical film 10 that has not been subjected to a rubber eraser abrasion test is cut into a piece with a size of 50 mm×100 mm to obtain a sample. Then, the measurement is repeated three times, and the arithmetic mean of the measured values is determined as the total light transmittance of the sample. The optical film 10 more preferably has a total light transmittance of 91% or more, further preferably 92% or more.

The above-described total light transmittance can be measured using a haze meter (for example, product name: "HM-150", manufactured by Murakami Color Research Laboratory Co., Ltd.) by a method following JIS K7361-1: 1997. The above-described total light transmittance is defined as the arithmetic mean of three measurements obtained by cutting the optical film into a piece with a size of 50 mm×100 mm, and then setting the cut piece without any curl or wrinkle and without any dirt such as fingerprints or dust to measure the total light transmittance three times for one sample. The phrase "measured three times" as used herein should refer not to measuring at the same position three times but to measuring at three different positions. In the optical film 10, not only the front surface 10A but also a laminated layer such as the functional layer 12 is visually observed to be smooth and also has a deviation in film thickness within ±10%. Accordingly, it is considered that an approximate average total light transmittance of the whole optical film can be obtained by measuring the total light transmittance at three different positions on the piece cut out from the optical film. The deviation in total light transmittance is within ±10% even if a measurement object has a size as large as 1 m×3000 m or as large as a 5-inch smartphone. In cases where it is impossible to cut a piece with the above-described size out from the optical film, a piece with a size of 22 mm×22 mm or larger may be cut out from the optical film as appropriate. If the piece of the optical film is small in size, the optical film is gradually shifted or turned in such an extent that the light source spot is within the piece of the optical film to secure three measurement positions.

In cases where an additional film, such as a polarizing plate, is provided on the optical film 10 through an adhesive or adhesion layer, the total light transmittance should be measured after removing the additional film and the adhesive or adhesion layer in the same manner as described above. Even if such a removal process is performed, the measurement of total light transmittance is not significantly affected.

The optical film 10 that has not been subjected to a rubber eraser abrasion test preferably has a haze value (total haze value) of 1% or less when the front surface 10A of the optical film 10 is mirror-like and smooth. The optical film 10 with a haze value of more than 1% may provide insufficient optical performance.

In cases where the front surface 10A of the optical film 10 is provided with antireflection properties, the haze value may be more than 1%. For example, if image sharpness is important, the haze value is preferably 5% or less, further preferably 3% or less. In contrast, the total haze value is preferably 25% or less, further preferably 20% or less, still further preferably 15% or less, to prevent the patterns of display elements, that is the circuit patterns, from being observed.

The haze value can be measured using a haze meter (for example, product name: "HM-150"; manufactured by Murakami Color Research Laboratory Co., Ltd.) by a method in accordance with JIS K7136: 2000. Specifically, the haze value is measured by the same method as for the total light transmittance.

In cases where an additional film, such as a polarizing plate, is provided on the optical film through an adhesive or adhesion layer, the haze value should be measured after removing the additional film and the adhesive or adhesion layer in the same manner as described above. Even if such a removal process is performed, the measurement of haze value is not significantly affected.

The optical film 10 preferably has a yellow index (YI) of 15 or less. The optical film 10 with a YI of 15 or less can be less yellow in color and be applied to uses that require transparency of optical films. More preferably, the maximum YI is 10 or less, 7 or less, or 6 or less. The yellow index (YI) can be determined as follows. First of all, a piece with a size of 50 mm×50 mm is cut out from the optical film 10 to obtain a sample. Then, the sample is set in a spectrophotometer (product name: "UV-2450"; manufactured by Shimadzu Corporation; light source: tungsten lamp and deuterium lamp) in such a manner that the resin base material faces the light source, to measure the light transmittance of the sample in the wavelength range of 300 nm to 780 nm in an environment at a temperature of 23±5° C. and a relative humidity of 30% or more and 70% or less. Then, the measured transmittance values of the sample are processed according to the formula described in JIS Z8722: 2009 to calculate color tristimulus values X, Y, and Z, and the tristimulus values X, Y, and Z are processed according to the formula described in ASTM D1925: 1962 to calculate the YI of the sample. The YI is defined as the arithmetic mean of three YI values obtained by measuring the light transmittance in the wavelength range from 300 nm to 780 nm three times for one sample, and calculating the YI from the three light transmittance values. In the UV-2450, a yellow index is calculated on a personal computer (PC) connected to the UV-2450 by reading the measurement data of the above transmittance and selecting the item "YI" from calculation items. The measurement of transmittance in the wavelength range of 300 nm to 780 nm is performed under the following conditions, and the transmittance should be determined by measuring transmittance at least five points spaced 1 nm apart in the wavelength range of 300 nm to 780 nm and calculating the average of the transmittance values. Additionally, in cases where fluctuation is observed in spectral transmittance spectra, smoothing treatment may be performed with a delta of 5.0 nm.

(Measurement Conditions)
 Wavelength range: 300-780 nm
 Scan speed: High
 Slit width: 2.0
 Sampling interval: Auto (0.5-nm intervals)
 Illumination: C
 Light source: D2 and WI
 Field: 2°
 Light source-switching wavelength: 360 nm
 S/R switching: Standard
 Detector: PM
 Autozero: performed at 550 nm subsequent to the baseline scan Examples of applications of the optical film 10 include, but are not specifically limited to, image display devices in smartphones, tablet terminals, personal computers (PCs), wearable terminals, digital signage systems, televisions, automotive navigation systems, and the like. Additionally, the optical film 10 is also suitable for vehicle displays. The form of each above-described image display device is also favorable for applications which require flexible forms, such as foldable or rollable forms.

The optical film 10 can be cut into a desired size or may be rolled. In cases where the optical film 10 is cut to a desired size, the cut piece of the optical film is not limited to a particular size, and the size of the film is appropriately determined depending on the display size of an image display device. Specifically, the optical film 10 may be, for example, 2.8 inches or more and 500 inches or less in size. The term "inch" as used herein will refer to the length of a diagonal when the optical film is rectangular, and to the length of a diameter when the optical film is circular, and to the average of major and minor axes when the optical film is elliptical. In cases where the optical film is rectangular here, the aspect ratio of the optical film is not specifically limited, which refers to the above-described size in inch determined for the optical film, provided that no problem is found in the optical film used for the display screen of an image display device. Examples of the aspect ratio include height-to-width ratios of 1:1, 4:3, 16:10, 16:9, and 2:1. However, particularly in optical films used for vehicle displays and digital signage systems which are rich in designs, the aspect ratio is not limited to the above-described aspect ratios. Additionally, in cases where the optical film 10 is large in size, the optical film will be trimmed, for example, to the A5 size (148 mm×210 mm) starting at an arbitrary position and then trimmed to fit size requirements of each measurement item. For example, if the optical film 10 is in a roll form, the optical film 10 of predetermined length should be pulled from a roll to cut a piece of the optical film with a desired size not from an invalid region including both edges along the longitudinal direction of the roll, but from a valid region near the center of the optical film, where the quality is constant.

<<Resin Base Material>>

The resin base material 11 is a base material composed of a light-transmitting resin. The term "light-transmitting" as used herein refers to a property that allows light transmission, including, for example, a total light transmittance of 50% or more, preferably 70% or more, more preferably 80% or more, and particularly preferably 90% or more. The term "light-transmitting" does not necessarily refer to transparency and may refer to translucency.

The resin constituting the resin base material 11 is not specifically limited, but is preferably a light-transmitting resin. Examples of such a light-transmitting resin include cellulose acetate resins, polyolefin resins, polycarbonate resins, acrylic resins, polyester resins, aromatic polyether ketone resins, polyether sulfone resins, polyimide resins, polyamide-imide resins, polyamide resins, or combinations of two or more of these resins. Among those resins, cellulose acetate resins are preferred in terms of resin adhesion to a resin base material or of pencil hardness. Among those, polyester resins are also preferred because a resin base material composed of a polyester resin is superior to a base material composed of a resin other than polyester resins in view of preventing an increase in haze value, and in terms of heat resistance, barrier property, and water resistance, as well as because a resin base material composed of a polyester resin is hardly damaged even if brought into contact with a coating machine, though a resin base material is prone to be damaged when brought into contact with a coating machine for applying, for example, a functional layer by coating.

In cases where a foldable optical film is prepared as the optical film, a polyimide resin, a polyamide-imide resin, a polyamide resin, a polyester resin, a cycloolefin polymer resin, or a combination thereof is preferably used as a resin constituting a resin base material because the resulting optical film will provide excellent foldability. However, a cellulose acetate resin (for example, cellulose triacetate) can also be preferably used depending on the specific usage. Among those resins, a polyimide resin, a polyamide resin, or a combination thereof is preferred because the resulting optical film has superior hardness and transparency as well as excellent foldability, and also shows outstanding heat resistance, and can obtain further excellent hardness and transparency when the optical film is baked. Furthermore, images presented on an image display device are sometimes observed in environments such as outdoor venues by users wearing sunglasses. When the sunglasses are polarized sunglasses, the identifiability of the images may be reduced when viewed through polarized sunglasses. Therefore, image display devices are currently required to have ability to prevent presented images from reducing the identifiability even if viewed through polarized sunglasses. In this respect, cycloolefin polymer resins are preferred in view of preventing the reduction in the above identifiability because cycloolefin polymer resins can induce a phase shift in the light from an image and prevent the reduction in the above identifiability of the image.

The inventors presumed that base materials comprising a polyimide resin would be suitable as resin base materials if flexibility was important in an optical film. It is sure that microcracks or breaks are hardly formed when a polyimide resin is used for the base material, as compared with conventionally widely used transparent base materials (for example, base materials comprising a polymethyl methacrylate resin, a cellulose triacetate resin, or a polyethylene terephthalate resin). However, from a detailed observation, wrinkles and/or creases formed on, for example, a functional layer may be found even if a polyimide resin is used for the base material, similarly to other resin base materials. Particularly when an optical film is applied to smartphones and a crease is found on the screen, letters and the like may be unreadable due to the small screen of each smartphone. In contrast, it was found that use of, for example, a base material comprising a cycloolefin polymer resin and having a very small film thickness provided more excellent foldability than use of a base material comprising a polyimide resin and having a thickness of 60 µm or more and 100 µm or less. Additionally, for example, a very thin resin base material comprising a cycloolefin polymer resin and having a film thickness of 5 µm or more and 35 µm or less (furthermore, 5 µm or more and 18 µm or less) also provides excellent optical properties, such as very small in-plane and of out-of-plane retardation values. For example, resin base materials comprising a polyimide resin, a polyamide-imide resin, or a polyamide resin may have an out-of-plane retardation value of 1,000 or more due to the film structure even if the in-plane retardation value is less than 100 nm, which may affect the identifiability of images when the resulting optical film is used for image display devices. In contrast, since both the in-plane retardation and the out-of-plane retardation can be easily controlled to be, for example, less than 100 nm and less than 50 nm, respectively, and a high cubic optical isotropy is achieved in resin base materials comprising a cycloolefin polymer resin, the resin base materials can resolve the problem associated with polarized sunglasses and are very suitable for optical uses. Thus, very thin resin base materials comprising a cycloolefin polymer resin are suitable for flexible uses and optical uses. Although resin base materials comprising a cellulose triacetate resin or a polycarbonate resin are also optically isotropic, damages such as wrinkles or cracks are easily formed when those resin base materials with a thickness of 5 µm or more and 35 µm or less are folded, and resin base materials comprising a cycloolefin polymer resin, which are also optically isotropic, are considered to be structurally resistant to folding at the molecular level.

Examples of cellulose acetate resins include cellulose triacetate (TAC) resins and cellulose diacetate resins. Cellulose triacetate resins are capable of having an average light transmittance of 50% or more in the visible light band of 380 to 780 nm. Cellulose triacetate resins preferably have an average light transmittance of 70% or more, further preferably 85% or more.

The cellulose triacetate resins may include an ester formed from cellulose and acetic acid along with a fatty acid, such as cellulose acetate propionate or cellulose acetate butyrate, as well as pure cellulose triacetate. Additionally, these cellulose triacetates may include other lower cellulose fatty acid esters, such as cellulose diacetate, or various additives, such as a plasticizer or an ultraviolet absorber, as necessary.

Examples of polyolefin resins include resins containing at least one component selected from polyethylene resins, polypropylene resins, cycloolefin polymer (COP)-based resins, and cycloolefin copolymer (COC)-based resins.

Examples of the cycloolefin polymer resin can include norbornene resins, monocyclic olefin resins, cyclic conjugated diene resins, vinyl alicyclic hydrocarbon resins, and hydrides thereof. Among those resins, norbornene resins can be suitably used because excellent transparency and formability are provided.

Examples of the norbornene resins can include ring-opening polymers composed of norbornene-based monomers, ring-opening copolymers composed of norbornene-based monomers and other monomers, or hydrides thereof, and addition polymers composed of norbornene-based monomers, addition copolymers composed of norbornene-based monomers and other monomers, or hydrides thereof.

Commercially available cycloolefin polymer resins include, for example, "ZEONEX®" and "ZEONOR®" (norbornene resins) manufactured by ZEON Corporation, "SUMILITE® FS-1700" manufactured by Sumitomo Bakelite Co., Ltd., "ARTON®" (modified norbornene resins) manufactured by JSR Corporation, "APEL®" (cyclic olefin copolymers) manufactured by Mitsui Chemicals Inc., "Topas®" (cyclic olefin copolymers) manufactured by Ticona, and "OPTREZ OZ-1000 series" (alicyclic acrylic resins) manufactured by Hitachi Chemical Co., Ltd. A film can be formed from such a cycloolefin polymer resin to obtain a light-transmitting base material. The film formation is not specifically limited, and any known film formation method, such as the solvent casting method or the melt extrusion method, can be used. Additionally, cycloolefin polymer film products are commercially available, and any of the film products may be used as a resin base material. Examples of the cycloolefin polymer film include "Escena®" and "SCA40" manufactured by Sekisui Chemical Co., Ltd., "ZEONOR® films" manufactured by ZEON Corporation, and "ARTON® films" manufactured by JSR Corporation.

Examples of the cycloolefin copolymer-based resins include copolymers composed of ethylene and a norbornene monomer, and copolymers composed of ethylene and tetracyclododecene.

Examples of the polycarbonate resin include bisphenol-based (for example, bisphenol A-based) aromatic polycarbonates, and aliphatic polycarbonate such as diethylene glycol bis(allyl carbonate).

Examples of the acrylic resins include poly(methyl (meth)acrylate) resins, poly(ethyl (meth)acrylate) resins, and poly(methyl (meth)acrylate-co-butyl (meth)acrylate) resins.

Examples of the polyester resins include resins containing at least one component selected from polyethylene terephthalate (PET), polypropylene terephthalate, polybutylene terephthalate, and polyethylene naphthalate.

Examples of the aromatic polyether ketone resins include polyether-ether ketones (PEEKs).

The polyimide resin may be an aliphatic polyimide resin, but is preferably an aromatic polyimide resin which contains aromatic rings. The aromatic polyimide resin is composed of a tetracarboxylic component and a diamine component, at least one of which is an aromatic ring-containing component.

The polyimide resin may partially contain a polyamide structure. Examples of the polyamide structure that may be contained include a polyamide-imide structure containing a tricarboxylic acid residue such as trimellitic anhydride, and a polyamide structure containing a dicarboxylic acid residue such as terephthalic acid. The concept of polyamide resin includes aromatic polyamides (aramids) as well as aliphatic polyamides. Specific examples of the polyimide resin include compounds having the structure represented by either of the chemical formulae (1) and (2) below. In the chemical formulae below, n represents the number of repeating units, which is an integer of 2 or more. Among those compounds represented by the chemical formulae (1) and (2) below, the compounds represented by the chemical formula (1) are preferred in terms of their low phase difference and high transparency.

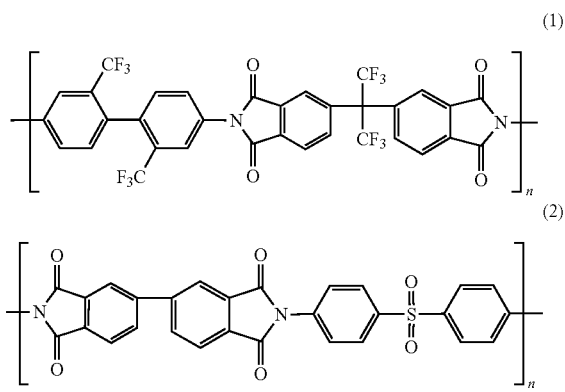

The resin base material 11 preferably has a thickness of 25 μm or more and 100 μm or less. In cases where the resin base material has a thickness of 25 μm or more, the resulting optical film can be prevented from curling and also have sufficient hardness, and is furthermore less prone to wrinkling and less likely to deteriorate in appearance when the optical film is produced by roll-to-roll process. In contrast, in cases where the resin base material has a thickness of 100 μm or less, the resulting optical film has sufficient flexibility, which can provide a good balance between hardness and flexibility. The lower limit of the resin base material 11 is more preferably 30 μm or more, 35 μm or more, or 40 μm or more, while the upper limit of the resin base material 11 is more preferably 90 μm or less, 85 μm or less, or 80 μm or less. The thickness of the resin base material can be determined by using a scanning transmission electron microscope (STEM) or a scanning electron microscope (SEM) to acquire a cross-sectional image of the resin base material, measuring the thickness of the resin base material at 20 different locations within the cross-sectional image, and calculating the arithmetic mean of the measured thickness values at the 20 locations. The image should be acquired with a scanning electron microscope at a magnification suitable for the thickness of the resin base material, at which the interface between the resin base material and the functional layer is clearly observed. Specifically, the magnification should be appropriately adjusted depending on the thickness of the resin base material, for example, to 1,000 times or 500 times when the thickness of the resin base material is 50 μm or 100 μm, respectively. The resin base material 11 preferably has a deviation in thickness within 15% or less, 10% or less, or 7% or less. When a scanning transmission electron microscope (STEM) is used to measure the thickness of the resin base material, the measurement can be performed by the same method as for the measurement of the film thickness of the functional layer. However, the magnification used for acquiring a cross-sectional image of the resin base material should be from 100 to 20,000 times.

In cases where an optical film, which is required to have some flexibility (for example, foldability), has a thick resin base material and a thick functional layer, creases and/or microcracks as well as cracks may be formed on a bent part in the resin base material and/or the functional layer when the optical film is folded. The formation of cracks, creases, and/or microcracks may cause appearance defects, particularly clouding, and adhesion defects due to the microcracks. Thus, it will be important to control the thickness of the resin base material and/or the functional layer and the adhesion between layers (the adhesion by chemical bonding, which is depending on the types of materials, and/or the physical adhesion, which prevents cracking) if the optical film is used for flexible uses. Particularly, since the toughness of the optical film varies depending on the thickness of the resin base material in cases where the resin base material 11 comprises a cycloolefin polymer resin or a polyester resin or even a polyimide resin, it will be important to control the thickness of the resin base material. However, the preferred thickness of the resin base material 11 is different between the cases where the optical film 10 is folded to direct the functional layer 12 inward (bent inward) and where the optical film 10 is folded to direct the functional layer 12 outward (bent outward). Specifically, the thickness of the resin base material 11 may be larger when the optical film 10 is bent outward, than that when the optical film 10 is bent inward. A function to absorb external impacts can be provided by increasing the thickness of the resin base material.

<Case of bending an Optical Film Inward>

In cases where the resin base material 11 comprises, for example, a cellulose triacetate resin, the thickness of the resin base material 11 is preferably 15 μm or more and 65 μm or less. In cases where the thickness of a resin base material is excessively small, the resin base material may split when folded. However, in cases where the thickness of the resin base material 11 is 15 μm or more, the resin base material 11 can be prevented from splitting when folded. Additionally, in cases where the thickness of the resin base material 11 is 65 μm or less, the resin base material 11 can be prevented from cracking or clouding on a bent part when folded. In this case, the resin base material 11 preferably has a maximum thickness of 50 μm or less, or 30 μm or less.

In cases where the resin base material 11 comprises, for example, a cycloolefin polymer resin, the thickness of the resin base material 11 is preferably 5 μm or more and 45 μm or less. The resin base material 11 with a thickness of 5 μm or more would have excellent handling performance, while the resin base material 11 with a thickness of 45 μm or less could be prevented from cracking or clouding on a bent part when folded. In this case, the resin base material 11 preferably has a maximum thickness of 35 μm or less, or 18 μm or less.

In cases where the resin base material 11 comprises, for example, a polyester resin, the thickness of the resin base material 11 is preferably 5 μm or more and 45 μm or less. The resin base material 11 with a thickness of 5 μm or more would have excellent handling performance, while the resin base material 11 with a thickness of 45 μm or less could be prevented from cracking or clouding on a bent part when folded. In this case, the resin base material 11 preferably has a maximum thickness of 35 µm or less, or 18 µm or less.

In cases where the resin base material 11 comprises, for example, a polyimide resin, a polyamide resin, a polyamide-imide resin, or a combination thereof, the thickness of the resin base material 11 is preferably 5 µm or more and 75 µm or less. The resin base material 11 with a thickness of 5 µm or more would have excellent handling performance, while the resin base material 11 with a thickness of 75 µm or less could be prevented from cracking when folded, and would also have excellent optical and mechanical properties. In this case, the resin base material 11 preferably has a maximum thickness of 70 µm or less, 60 µm or less, 50 µm or less, 35 µm or less, or 18 µm or less. Additionally, the resin base material 11 in this case preferably has a minimum thickness of 5 µm or more in view of, for example, handling ability.

In cases where each of the above-described resin base materials has a thickness of 35 µm or less, the resin base material 11 preferably becomes highly suitable for being processed in cases where a protective film is attached thereto during the production process.

<Case of Bending an Optical Film Outward>

In cases where the resin base material 11 comprises, for example, a cellulose triacetate resin, a cycloolefin polymer resin, a polyester resin, a polyimide resin, a polyamide resin, a polyamide-imide resin, or a combination thereof, the thickness of the resin base material 11 is preferably 35 µm or more and 105 µm or less. The resin base material 11 with a thickness of 35 µm or more could absorb various external impacts when used facing outward, while the resin base material 11 with a thickness of 105 µm or less could be prevented from cracking or clouding on a bent part when folded. In this case, the resin base material 11 preferably has a maximum thickness of 85 µm or less, or 80 µm or less.

<<Functional Layer>>

The functional layer 12 as a layer exhibiting a hard-coat function, or a hard coat layer, will be described. The "hard coat layer" as used herein refers to a layer having an indentation hardness larger than that of the resin base material, where the term "indentation hardness" is described below. When flexibility is needed, the functional layer may be a layer other than a hard coat layer. In this case, the functional layer may have a lower grade of pencil hardness than that described below. In such a case, the functional layer functions as a hard coat layer because the mechanical strength is increased by the functional layer compared with that provided by the resin base material alone.

The functional layer 12 preferably has a hardness (pencil hardness) of "H" or harder as measured by the pencil hardness test specified by JIS K5600-5-4: 1999. By limiting the pencil hardness to a hardness of "H" or harder, the resulting optical film 10 can have sufficient hardness and increase durability. The pencil hardness test should be performed by applying a load of 500 g to a pencil and moving the pencil at a speed of 1 mm/sec to make a scratch. The grade of the hardest pencil that does not scratch the surface of the optical film during the pencil hardness test is determined as the pencil hardness of the optical film. A plural number of pencils with different hardness are used for the measurement of pencil hardness and the pencil hardness test is repeated five times for each pencil. In cases where no scratch is made on the surface of the optical film with a pencil with specific hardness in four or more out of the five replicates, the pencil with the hardness is determined to make no scratch on the surface of the optical film. The above-described scratch refers to a scratch which is visibly detectable when the surface of an optical film subjected to the pencil hardness test is observed under transmitting fluorescent light. The functional layer may be a monolayer structure, or may have a multilayer structure composed of two or more layers as described in the present embodiment.

The functional layer 12 preferably has an indentation hardness ($H_{IT}$) of 100 MPa or more. In cases where flexibility is most important, an indentation hardness of 20 MPa or more and less than 100 MPa is preferred. The functional layer 12 may have a minimum indentation hardness of 200 MPa or more, or 300 MPa or more, and may have a maximum indentation hardness of 800 MPa or less in consideration of preventing microcrack formation and maintaining the adhesion at the interface between the functional layer and the resin base material. The functional layer with such minimum and maximum indentation hardness values can maintain its own flexibility. Additionally, to put an optical film to practical use, the physical and optical properties of the optical film subjected to a folding test should be almost the same as those before the folding test. Moreover, a functional layer is effective as a layer with a function of preventing scratches from forming during processing. Because of this, the indentation hardness is preferably within the above-described numerical range to obtain physical properties as described above and required for practical use, as well as to utilize the flexibility. The functional layer may be provided on one or both surfaces of the resin base material depending on applications.

The "indentation hardness" as used herein refers to a value obtained from a load-displacement curve during the entire process from loading to unloading of an indenter. Measurement of the above indentation hardness ($H_{IT}$) should be performed on a measurement sample by using a "TI950 TriboIndenter" manufactured by Bruker Corporation in an environment at a temperature of 23±5° C. and a relative humidity of 30% or more and 70% or less. The measurement sample may be produced by the same method as for the above sample produced to obtain a cross-sectional SEM image. In cases where the functional layer 12 has a small film thickness, a measurement sample with a sufficiently large area is preferably prepared with an oblique cutting device such as a surface and interfacial cutting analysis system (SAICAS). Although it is typical that a sample is cut in the direction perpendicular to the front surface of the sample to provide the resulting cross-section (vertical section) for a cross-sectional analysis, it is difficult to selectively analyze a particular layer in a sample with a multilayer structure when the thickness of each layer in the sample is small despite the requirement of a large measurement area. However, oblique cutting of the sample can produce a cross-section and the resulting exposed cross-sectional sample surface can be larger than a possible vertical section of the same sample. For example, when an inclined plane with an angle of 10° to the horizontal plane is produced, the resulting sample surface is nearly 6 times as large as the possible vertical section. Thus, the sample which is hardly analyzed when a vertical section of the sample is produced and provided for the analysis can be analyzed when a cross-section of the sample is produced for the analysis by oblique cutting with a SAICAS. Then, a smooth area is found in the obtained cross-section of the measurement sample, and a Berkovich indenter (a trigonal pyramid, TI-0039, manufactured by Bruker Corporation) is pressed perpendicularly into the flat area on the functional layer 12 at a speed of 10 nm/sec, while a load is applied with a maximum displacement of 100 nm in the measurement based on displacement to displace the indenter from 0 nm to 100 nm over 10 seconds. In this respect, a Berkovich indenter should be pressed into a portion of the functional layer in order to avoid the influence of the light-transmitting base material and to avoid the influence of the side edges of the functional layer, wherein the portion is located 500 nm away from the interface between the resin base material and the functional layer to the central part of the functional layer and 500 nm or more away from both the side edges of the functional layer to the central part of the functional layer. Subsequently, the indenter is held at the displacement position of 100 nm for 5 seconds, and then unloaded to displace the indenter from 100 nm to 0 nm over 10 seconds. Then, the change in indentation depth h (nm) in response to a pressing load F (N) is continuously measured to generate a load-displacement curve. From the generated load-displacement curve, the indentation hardness is calculated by the following equation (4), where the maximum pressing load $F_{max}$ (N) is divided by the projected contact area $A_p$ (mm$^2$), which is an area of contact between the indenter and the functional layer 12. The indentation hardness is defined as the arithmetic mean of 8 measured values obtained by measuring the indentation hardness at 10 different positions, and removing the largest and the smallest values from the measured values. $A_p$ represents a projected contact area obtained by correcting the tip curvature of the indenter using molten quartz as a standard sample by the Oliver-Pharr method.

$$H_{IT}=F_{max}/A_p \qquad (4)$$

The functional layer 12 preferably has a film thickness of 11 µm or more and 50 µm or less. The functional layer 12 with a film thickness of 11 µm or more would have sufficient hardness, while the functional layer 12 with a film thickness of 50 µm or less could prevent reduction in workability. More preferably, the functional layer 12 has a minimum film thickness of 14 µm or more, 17 µm or more, or 20 µm or more in view of achieving a desired hardness, and has a maximum film thickness of 45 µm or less, 42 µm or less, or 39 µm or less in view of increasing the flexibility. In cases where the functional layer has a multilayer structure, the film thickness of the functional layer should mean the sum of the film thicknesses of all the functional layers. The functional layer 12 preferably has a deviation in film thickness within 15% or less, 10% or less, or 7% or less.

The film thickness of the functional layer is defined as the arithmetic mean of film thickness values at 20 different locations, where a cross-section of the functional layer is imaged using a scanning electron microscope (SEM) to measure the film thickness of the functional layer at the 20 locations within the cross-sectional image. A specific method of acquiring cross-sectional images is described below. First of all, a piece of 1 mm×10 mm cut from the optical film is embedded in an embedding resin to prepare a block, and homogeneous sections having a thickness of 70 nm or more and 100 nm or less and having no openings or the like are sliced from the block according to a commonly used sectioning technique. In this respect, the reason why sections having a thickness of 70 nm or more and 100 nm or less are sliced is because the block remaining after cutting out the sections is used for the measurement and a cross-section with increased smoothness is produced in the remaining block by cutting sections with the above thickness from the block. If the remaining block has a rough surface, the measurement accuracy may be reduced. For the preparation of sections, an "Ultramicrotome EM UC7" (Leica Microsystems GmbH) and the like can be used. Then, the block remaining after cutting out the homogeneous sections having no openings or the like is used as a measurement sample. Subsequently, cross-sectional images of the measurement sample are acquired using a scanning electron microscope (SEM) (product name: "S-4800"; manufactured by Hitachi High-Technologies Corporation). The cross-sectional images are acquired using the above-described S-4800 by setting the detector to "SE," the accelerating voltage to "5 kV," and the emission current to "10 µA." The focus, contrast, and brightness are appropriately adjusted at a magnification of 100 to 100,000 times, preferably 1,000 to 10,000 times depending on the film thickness of the functional layer, so that each layer can be identified by observation. To reduce the deviation in measured film thickness values, the observation at a magnification as low as possible is recommended for measuring the film thickness of the functional layer. For example, the magnification is preferably 2,000 times when the film thickness of the functional layer is around 30 µm, and the magnification preferably ranges from 2,000 to 5,000 times when the film thickness of the functional layer is around 15 µm. Furthermore, the beam monitor aperture, the objective lens aperture, and the WD may be respectively set to "3," "3," and "8 mm," in acquirement of cross-sectional images using the above-described S-4800. For the measurement of the film thickness of a first layer, it is important that the contrast at the interface between the first functional layer and another layer (for example, the resin base material) can be observed as clearly as possible when the cross-section is observed. In cases where the interfacial boundary is hardly observed due to lack of contrast, a staining process may be applied because interfacial boundaries between organic layers become easily observed by application of a staining procedure with osmium tetraoxide, ruthenium tetraoxide, phosphotungstic acid, or the like. Additionally, higher magnification may make it more difficult to find the contrast at the interface. In that case, the observation is also carried out with low magnification. For example, the first functional layer is observed at two different magnifications consisting of a higher magnification, such as 25,000 or 50,000 times, and a lower magnification, such as 50,000 or 100,000 times, to determine the above arithmetic means at both the magnifications, which are further averaged to determine the film thickness of the first functional layer.

The functional layer 12 comprises a first functional layer 13 and a second functional layer 14 provided on a surface of the first functional layer 13 opposite to the resin base material 11.

<First Functional Layer>

The first functional layer 13 is a layer for increasing the hardness. The first functional layer 13 comprises a binder resin and particles dispersed in the binder resin. The presence of the particles in the first functional layer 13 can result in increased pencil hardness. The first functional layer 13 may contain, in addition to the binder resin and the like, various additives other than those components as necessary, to the extent that the effects of the present invention are not compromised. Examples of such additives include ultraviolet absorbers, anti-static agents, adhesion-improving agents, leveling agents, thixotropy enhancing agents, coupling agents, plasticizers, antifoam agents, bulking agents, coloring agents, and fillers.

The first functional layer 13 preferably has a film thickness of 10 µm or more and 40 µm or less. The first functional layer with a film thickness of 10 µm or more would provide sufficient hardness, while the first functional layer with a film thickness of 40 µm or less could prevent reduction in workability. More preferably, the first functional layer 13 has a minimum film thickness of 12 µm or more, 14 µm or more, or 16 μm or more in view of preventing interference fringe formation, and has a maximum film thickness of 38 μm or less, 34 μm or less, or 30 μm or less in view of the adhesion to the resin base material 11. The film thickness of the first functional layer 13 should be measured by the same method as for the film thickness of the functional layer 12. The first functional layer 13 preferably has a deviation in film thickness within 15% or less, 10% or less, or 7% or less.

(Binder Resin)

The resin contains a polymerized product (a cured product) of a polymerizable compound (a curable compound). The polymerizable compound refers to a molecule having at least one polymerizable functional group. Examples of the polymerizable functional group include ethylenic unsaturated groups such as (meth)acryloyl group, vinyl group, and allyl group. Both "acryloyl group" and "methacryloyl group" are meant by the word "(meth)acryloyl group."

The polymerizable compound is preferably a polyfunctional (meth)acrylate. Examples of the above-described polyfunctional (meth)acrylate include trimethylolpropane tri(meth)acrylate, tripropylene glycol di(meth)acrylate, diethylene glycol di(meth)acrylate, dipropylene glycol di(meth)acrylate, pentaerythritol tri(meth)acrylate, pentaerythritol tetra(meth)acrylate, dipentaerythritol hexa(meth)acrylate, 1,6-hexanediol di(meth)acrylate, neopentyl glycol di(meth)acrylate, trimethylolpropane tri(meth)acrylate, ditrimethylolpropane tetra(meth)acrylate, dipentaerythritol penta(meth)acrylate, tripentaerythritol octa(meth)acrylate, tetrapentaerythritol deca(meth)acrylate, isocyanuric acid tri(meth)acrylate, isocyanuric acid di(meth)acrylate, polyester tri(meth)acrylate, polyester di(meth)acrylate, bisphenol di(meth)acrylate, diglycerol tetra(meth)acrylate, adamantyl di(meth)acrylate, isobornyl di(meth)acrylate, dicyclopentane di(meth)acrylate, tricyclodecane di(meth) acrylate, ditrimethylolpropane tetra(meth)acrylate, and those compounds modified with PO, EO, caprolactone, or the like.

Among those polyfunctional polymerizable compounds, polymerizable compounds with three to six functional groups, such as pentaerythritol triacrylate (PETA), dipentaerythritol hexaacrylate (DPHA), pentaerythritol tetraacrylate (PETTA), dipentaerythritol pentaacrylate (DPPA), trimethylolpropane tri(meth)acrylate, tripentaerythritol octa (meth)acrylate, and tetrapentaerythritol deca(meth)acrylate, are preferred in terms of the ability to achieve the above-described pencil hardness in a suitable manner. In this specification, the word "(meth)acrylate" means acrylate and methacrylate.

The polymerizable compound may further contain a monofunctional (meth)acrylate monomer for the purpose of, for example, adjusting the hardness of the resin and the viscosity of the composition, and improving the adhesiveness of the layer. Examples of the above-described monofunctional (meth)acrylate monomer include hydroxyethyl acrylate (HEA), glycidyl methacrylate, methoxypolyethylene glycol (meth)acrylate, isostearyl (meth)acrylate, 2-acryloyloxyethyl succinate, acryloyl morpholine, N-acryloyloxyethyl hexahydrophthalimide, cyclohexyl acrylate, tetrahydrofuryl acrylate, isobornyl acrylate, phenoxyethyl acrylate, and adamantyl acrylate.

The weight average molecular weight of the above-described monomer is preferably less than 1,000, more preferably 200 or more and 800 or less, in view of improving the hardness of the resin layer. Additionally, the weight average molecular weight of the above-described polymerizable oligomer is preferably 1,000 or more and 20,000 or less, more preferably 1,000 or more and 10,000 or less, and still more preferably 2,000 or more and 7,000 or less.

(Particles)

The particles are a component for increasing the hardness of the functional layer, and may be any of inorganic particles, organic particles, or a combination thereof. Examples of the inorganic particles include inorganic oxide particles, such as silica ($SiO_2$) particles, alumina particles, titania particles, tin oxide particles, antimony-doped tin oxide (abbreviation: ATO) particles, and zinc oxide particles. Among those particles, silica particles are preferred in view of further increasing the hardness. Silica particles include spherical silica particles and deformed silica particles, and deformed silica particles are preferred among those silica particles. In this specification, the "spherical particles" refer to, for example, particles in the form of spheres, ellipsoids, or the like, and the "deformed particles" refer to particles with a randomly rough surface as observed on potato tubers (having an aspect ratio of 1.2 or more and 40 or less when a cross-section is observed). Because the above-described deformed particles have a surface area larger than that of spherical particles, the presence of such deformed particles increases the area for contact with the above-described binder resin, which can increase the pencil hardness of the first functional layer 13. Observation of a cross-section of the first functional layer 13 under a transmission electron microscope (TEM) or a scanning transmission electron microscope (STEM) can determine whether or not the silica particles contained in the first functional layer 13 are deformed silica particles. In cases where spherical silica particles are used, spherical silica particles with a smaller particle diameter would result in the functional layer with higher hardness. In contrast, deformed silica particles can provide the same level of hardness as that of commercially available spherical silica particles with the smallest particle diameter, even though the deformed silica particles are not as small as the spherical silica particles.

The average particle diameter of the above-described silica particles is preferably 5 nm or more and 200 nm or less. Silica particles with an average particle diameter of less than 5 nm are difficult to produce, and may aggregate each other or be highly resistant to deformation. Furthermore, deformed silica particles with such an average particle diameter are less dispersible and may aggregate each other even in the above-described ink composition before use for coating. On the other hand, in cases where the above-described deformed silica particles have an average particle diameter of more than 200 nm, problems, such as formation of a very rough surface and increase of haze value and increase of haze, may occur in the first functional layer. In cases where the silica particles are spherical silica particles, the average particle diameter of the silica particles is defined as the arithmetic mean of the particle diameters of 20 particles, where the particle diameters of the 20 particles are measured from cross-sectional images of particles acquired using a transmission electron microscope (TEM) or scanning transmission electron microscope (STEM). Additionally, in cases where the silica particles are deformed silica particles, the average particle diameter of the silica particles is defined as the arithmetic mean of the particle diameters of 20 particles, where the maximum (major axis) and minimum (minor axis) values of the distance between two points on the circumference of each particle are measured from a cross-sectional image of the functional layer acquired using a transmission electron microscope (TEM) or a scanning transmission electron microscope (STEM), and these values are averaged to determine the particle diameter of the particle.

The content of particles in the first functional layer 13 is preferably 20% by mass or more and 70% by mass or less. The first functional layer can retain sufficient hardness in cases where the content of particles is 20% by mass or more. In contrast, in cases where the content of particles is 70% by mass or less, a reduction in adhesion can be prevented from occurring between the particles and the binder resin due to the moderate filling ratio, which can prevent the first functional layer from reducing the hardness.

As the inorganic particles, inorganic particles having polymerizable functional groups on the surface (reactive inorganic particles) are preferably used. Such inorganic particles having polymerizable functional groups on the surface can be produced by surface treatment of inorganic particles with, for example, a silane coupling agent. Examples of the method of treating the surface of inorganic particles with a silane coupling agent include a dry method in which the silane coupling agent is sprayed over the inorganic particles, and a wet method in which the inorganic particles are dispersed in a solvent and the silane coupling agent is then added to the solvent and allowed to react with the inorganic particles.

Examples of the organic particles can include plastic beads. Specific examples of the plastic beads include polystyrene beads, melamine resin beads, acrylic beads, acrylic-styrene beads, silicone beads, benzoguanamine beads, benzoguanamine-formaldehyde beads, polycarbonate beads, and polyethylene beads.

<Second Functional Layer>

The second functional layer 14 is a layer for increasing the scratch resistance and the smoothness. The second functional layer 14 is a hard coat layer, or may not be a hard coat layer but, for example, a vapor-deposited layer or a spray-coated layer. The second functional layer 14 comprises a binder resin, a lubricant, and an antifouling agent. The second functional layer 14 may contain, in addition to the binder resin and the like, various additives other than those components as necessary, to the extent that the effects of the present invention are not compromised. Examples of such additives include particles (for example, micron-scale particles for providing antireflection properties, or nano-scale particles intended for functions), ultraviolet absorbers, antistatic agents, adhesion-improving agents, leveling agents, thixotropy enhancing agents, coupling agents, plasticizers, antifoam agents, bulking agents, coloring agents, and fillers.

The second functional layer 14 preferably has a film thickness of 1 μm or more and 10 μm or less. The second functional layer with a film thickness of 1 μm or more would provide sufficient scratch resistance, while the second functional layer with a film thickness of 10 μm or less could prevent curling and maintain the flexibility. More preferably, the second functional layer 14 has a minimum film thickness of 2 μm or more, 3 μm or more, or 4 μm or more in view of achieving a desired hardness, and has a maximum film thickness of 7 μm or less, 8 μm or less, or 9 μm or less in view of transparency. The film thickness of the second functional layer 14 should be measured by the same method as for the film thickness of the functional layer 12. The second functional layer 14 preferably has a deviation in film thickness within 15% or less, 10% or less, or 7% or less.

In an optical film 10 that has not been subjected to a rubber eraser abrasion test, a 5-μm square region on the front surface 14A of the second functional layer 14 preferably has an arithmetic mean height (Sa) of 10 nm or less. The maximum Sa value may be 7 nm or less, 4 nm or less, 1 nm or less, or, furthermore, 0.8 nm or less. The maximum Sa value can provide high transparency and low haze in spite of the presence of depressions 10B as described above, or even if these depressions 10B appear after the rubber eraser abrasion test. Additionally, the maximum value as described above is considered to be effective in providing depressions after the rubber eraser abrasion test, which can provide favorable film properties. Above the maximum value, it becomes difficult to control film properties, which may cause failure to provide favorable physical properties. Moreover, the minimum Sa value may be 0.01 nm or more, or 0.05 nm or more, in consideration of preventing film sticking during the production process where the optical film is possibly overlaid on itself to produce a film roll or film sheets.

(Binder Resin)

The binder resin contained in the second functional layer 14 is similar to the binder resin contained in the first functional layer 13, and will thus not be described here.

(Lubricant)

A lubricant provides smoothness to the front surface 10A of the optical film 10. The lubricant is preferably a lubricant having a polymerizable functional group. When a lubricant having a polymerizable functional group is used as the lubricant, the lubricant is present in the second functional layer 14, associated with the binder resin.

A silicone-based lubricant is preferred as the lubricant in view of the ability to increase the surface smoothness of the optical film. The silicone-based lubricant is not specifically limited, but includes straight silicone or modified silicone, such as polydimethylsiloxane, polymethylphenylsiloxane, and polymethylhydrogensiloxane.

Examples of the modified silicone include ethylenically unsaturated group-modified silicone such as (meth)acrylate-modified silicone, amino-modified silicone, amido-modified silicone, epoxy-modified silicone, carboxy-modified silicone, alcohol-modified silicone, carbinol-modified silicone, and mercapto-modified silicone.

Commercially available lubricants include, for example, BYK-313, BYK-322, BYK-331, BYK-333, BYK-345, BYK-377, BYK-378, BYK-UV3500, and BYK-UV3510 (manufactured by BYK Japan KK).

The lubricant preferably has a weight-average molecular weight of 3,000 or more and 20,000 or less. A lubricant with a weight-average molecular weight of 3,000 or more can prevent problems associated with the quality of the surface, while a lubricant with a weight-average molecular weight of 20,000 or less can prevent a decrease in compatibility with the resin.

The content of the lubricant is preferably 0.01 parts by mass or more and 0.5 parts by mass or less with respect to 100 parts by mass of a polymerizable compound that constitutes the binder resin. When the content of the lubricant is 0.01 parts by mass or more, the dynamic friction coefficient of the front surface of the second functional layer is decreased, and excellent smoothness can be provided. When the content of the lubricant is 0.5 parts by mass or less, a reduction in scratch resistance can be prevented from occurring.

In cases where both a lubricant and an antifouling agent are contained, these agents are preferably present at a ratio of 1:9 to 5:5. If the content ratio of these agents is within this range, an optical film with more superior scratch and abrasion resistance could be obtained.

(Antifouling Agent)

An antifouling agent prevents deposition of dirt, such as fingerprints, on the front surface 10A of the optical film 10. The antifouling agent is preferably an antifouling agent having a polymerizable functional group. When an antifouling agent having a polymerizable functional group is used as the antifouling agent, the antifouling agent is present in the second functional layer, associated with the binder resin.

A fluorinated antifouling agent, such as a fluorine-based antifouling agent or a fluorinated silicone-based antifouling agent, is preferred as the antifouling agent. Use of a fluorinated antifouling agent will make fingerprints less likely to be left (or invisible) and easier to wipe off, and additionally can reduce the surface tension generated during coating of a second functional layer composition, which increases the leveling performance and assists in forming a second functional layer with an excellent appearance. Among fluorinated antifouling agents, fluorinated silicone-based antifouling agents are preferred in view of reducing the frictional force with a rubber eraser, which are compounds that simultaneously have a Si-containing structure, such as siloxane backbone, and a F-containing structure, such as perfluoro ether. In the presence of such an antifouling agent simultaneously containing both Si and F elements, favorable physical properties can be provided due to the presence of this type of antifouling agent alone. The co-presence of fluorine-based and silicone-based antifouling agents can also improve the smoothness and the antifouling property.

Commercially available fluorine-based antifouling agents include, for example, OPTOOL DAC, OPTOOL DSX (manufactured by Daikin Industries, Ltd.), MEGAFACE RS-56, MEGAFACE RS-71, MEGAFACE RS-74, MEGAFACE RS-75 (manufactured by DIC Corporation), LINC152EPA, LINC151 EPA, LINC182UA (manufactured by Kyoeisha Chemical Co., Ltd.), FTERGENT 650A, FTERGENT 601AD, and FTERGENT 602.

Commercially available fluorinated silicone-based antifouling agents include, for example, MEGAFACE RS-851, MEGAFACE RS-852, MEGAFACE RS-853, MEGAFACE RS-854 (manufactured by DIC Corporation), OPSTAR TU2225, and OPSTAR TU2224 (manufactured by JSR Corporation).

The antifouling agent preferably has a weight-average molecular weight of 3,000 or more and 20,000 or less. An antifouling agent with a weight-average molecular weight of 3,000 or more can prevent problems associated with the quality of the surface, while an antifouling agent with a weight-average molecular weight of 20,000 or less can prevent a decrease in compatibility with the resin.

The content of the antifouling agent is preferably 0.01 parts by mass or more and 0.5 parts by mass or less with respect to 100 parts by mass of a polymerizable compound that constitutes the binder resin. When the content of the antifouling agent is 0.01 parts by mass or more, an excellent antifouling property can be provided. When the content of the antifouling agent is 0.5 parts by mass or less, a reduction in scratch resistance can be prevented from occurring.

(Particles)

Addition of particularly large particles to the second functional layer results in formation of large irregularities on the front surface of the resulting optical film, which may cause detachment of particles when a rubber eraser abrasion test (500 g×4,000 times) or a rubber eraser abrasion test (1,000 g×5,000 times) is performed on the front surface of the optical film, and damage the front surface of the optical film due to the detachment of the particles. In contrast, the dynamic friction coefficient of the front surface 10A of the optical film 10, which is 0.70 or less, allows a rubber eraser to move smoothly on the front surface. Thus, even if particles are added to the second functional layer 14, the particles are less detached when a rubber eraser abrasion test (500 g×4,000 times) or a rubber eraser abrasion test (1,000 g×5,000 times) is performed, which can prevent any damage. The particles are the same as the particles described in the section for the first functional layer 13, and will thus not be described here.

<<Production Method for Optical Films>>

The optical film 10 can be produced, for example, as follows. First of all, a first functional layer composition is applied on the first surface 11A of the resin base material 11 by a coating apparatus such as bar coater to form a coating film of the first functional layer composition.

<First Functional Layer Composition>

A first functional layer composition contains a polymerizable compound that turns into a binder resin when it is cured, and particles. The first functional layer composition may additionally contain an ultraviolet absorber, a leveling agent, a solvent, a polymerization initiator, as necessary.

(Solvent)

Examples of the above-described solvent include alcohols (for example, methanol, ethanol, propanol, isopropanol, n-butanol, s-butanol, t-butanol, benzyl alcohol, PGME, ethylene glycol, diacetone alcohol), ketones (for example, acetone, methyl ethyl ketone, methyl isobutyl ketone, cyclopentanone, cyclohexanone, heptanone, diisobutyl ketone, diethyl ketone, diacetone alcohol), esters (methyl acetate, ethyl acetate, butyl acetate, n-propyl acetate, isopropyl acetate, methyl formate, PGMEA), aliphatic hydrocarbons (for example, hexane, cyclohexane), halogenated hydrocarbons (for example, methylene chloride, chloroform, carbon tetrachloride), aromatic hydrocarbons (for example, benzene, toluene, xylene), amides (for example, dimethylformamide, dimethylacetamide, n-methylpyrrolidone), ethers (for example, diethyl ether, dioxane, tetrahydrofuran), ether alcohols (for example, 1-methoxy-2-propanol), and carbonates (dimethyl carbonate, diethyl carbonate, ethylmethyl carbonate). These solvents may be used individually or in combination of two or more. Among those solvents, methyl isobutyl ketone and methyl ethyl ketone are preferred as the above-described solvent in terms of the ability to dissolve or disperse components such as urethane (meth)acrylate and other additives, whereby the first functional layer composition can be suitably applied.

(Polymerization Initiator)

The polymerization initiator is a component which degrades, when exposed to ionizing radiation, and generates radicals to initiate or promote polymerization (cross-linking) of a polymerizable compound.

The polymerization initiator is not specifically limited, provided that the polymerization initiator can generate a substance that initiates a radical polymerization by exposure to ionizing radiation. Any known polymerization initiator can be used without any particular limitation, and specific examples of the polymerization initiator include acetophenones, benzophenones, Michler's benzoyl benzoate, α-amyloxime esters, thioxantones, propyophenones, benzyls, benzoins, and acylphosphine oxides. Additionally, the polymerization initiator is preferably mixed with a photosensitize for use, and specific examples of the photosensitizer include n-butylamine, triethylamine, and poly-n-butylphosphine.

After the coating film of the first functional layer composition is formed, the coating film is heated and dried, for example, at a temperature of 30° C. or higher and 120° C. or lower for 10 to 120 seconds by various known techniques to evaporate the solvent.

After drying the coating film, the coating film is exposed to ionizing radiation such as ultraviolet light to semi-cure (half cure) the coating film. The term "semi-cured" as used herein means that curing substantially proceeds upon further exposure to ionizing radiation. However, the coating film may be completely cured (full-cured) at this step. The phrase "completely cured" as used herein means that curing substantially no more proceeds in spite of further exposure to ionizing radiation. The radiation in the present specification includes visible light, ultraviolet light, X-rays, electron beams, α-rays, β-rays, and γ-rays.

After the coating film is semi-cured, a second functional layer composition for forming a second functional layer is applied on the coating film by a coating apparatus such as bar coater to form a coating film of the second functional layer composition.

<Second Functional Layer Composition>

A second functional layer composition contains a polymerizable compound that turns into a binder resin when it is cured, and a lubricant and an antifouling agent. The second functional layer composition may additionally contain an ultraviolet absorber, a solvent, and a polymerization initiator, as necessary. The solvent and the polymerization initiator for the second functional layer composition are the same as those described for the first functional layer composition, and will thus not be described here.

After the coating film of the second functional layer composition is formed, the coating film is heated and dried, for example, at a temperature of 30° C. or higher and 120° C. or lower for 10 to 120 seconds by various known techniques to evaporate the solvent.

After the coating film is dried, the coating film of the second functional layer composition is exposed to ionizing radiation such as ultraviolet light to completely cure (full-cure) the coating film of the first functional layer composition and the coating film of the second functional layer composition for the formation of the first functional layer 13 and the second functional layer 14, and the functional layer 12 is thereby obtained. Consequently, an optical film 10 shown in FIG. 1 is obtained.

According to the present embodiment, an optical film 10 capable of achieving superior scratch and abrasion resistance and of providing excellent antifouling performance can be obtained, wherein a 5-μm square region on the front surface 10A of the optical film 10 is observed to have 1 or more and 50 or less depressions having any shape at least selected from a ring shape with an outer diameter of 0.1 μm or more and 2.5 μm or less and with a depth of 1 nm or more and 150 nm or less, a circular shape with a diameter of 0.1 μm or more and 2.5 μm or less and with a depth of 1 nm or more and 150 nm or less, and an irregular shape with a width of 0.1 μm or more and 2.5 μm or less and with a depth of 1 nm or more and 150 nm or less, when the square region is observed using an atomic force microscope after the above rubber eraser abrasion test (500 g×4,000 times); and the dynamic friction coefficient (at a load of 500 g) of the front surface 10A of the optical film 10 determined before a rubber eraser abrasion test is 0.70 or less; and the change rate of the dynamic friction coefficient (at a load of 500 g) of the front surface 10A of the optical film 10 between before and after the rubber eraser abrasion test (500 g×4,000 times) is up to 35%. This is considered to be because of the following reason. In cases where the functional layer contains a lubricant and an antifouling agent, or where a functional layer contains not a single but multiple types of antifouling agents or contains an antifouling agent containing different types of elements in the absence of a lubricant, the dynamic friction coefficient of the front surface of the optical film that has not been subjected to a rubber eraser abrasion test can be 0.70 or less, and the dynamic frictional force acting between a wad of steel wool or a rubber eraser and the surface of the functional layer is thus so low that the wad of steel wool or the rubber eraser can move smoothly. Particularly in cases where the functional layer contains a lubricant and an antifouling agent, the lubricant (for example, a silicone-based lubricant) or the antifouling agent are present at locally high concentrations, which allows a wad of steel wool or a rubber eraser to move more smoothly. Additionally, a low dynamic frictional force acting between a rubber eraser and the surface of the functional layer can prevent removal of the majority of the antifouling agent from the front surface of the optical film due to the friction with the rubber eraser, which in turn can prevent reduction in contact angle due to the rubber eraser abrasion test and provide an excellent antifouling property. Then, when the rubber eraser abrasion test (500 g×4,000 times) is performed on the optical film as described above, some portion of the locally present lubricant or antifouling agent is removed from the rubbed front surface of the optical film, and depressions as described above are thereby formed. In this respect, the majority of the lubricant or antifouling agent remains in the depressions, and this causes the dynamic frictional force acting between a wad of steel wool or a rubber eraser and the surface of the functional layer to be low not only before the rubber eraser abrasion test, but also after the rubber eraser abrasion test (500 g×4,000 times), and can allow the change rate of the dynamic friction coefficient (at a load of 500 g) of the front surface 10A of the optical film 10 between before and after the rubber eraser abrasion test (500 g×4,000 times) to be up to 35%. Thus, the wad of steel wool or the rubber eraser can move smoothly even after the rubber eraser abrasion test (500 g×4,000 times). Accordingly, superior scratch and abrasion resistance, and excellent antifouling performance can be provided not only before a rubber eraser abrasion test, but also after a rubber eraser abrasion test (500 g×4,000 times).

Moreover, according to the present embodiment, an optical film having superior scratch and abrasion resistance can be obtained, wherein when the rubber eraser abrasion test (1,000 g×5,000 times) is performed, the absolute value of the difference in the arithmetic mean height of a 5-μm square region on the front surface of the optical film measured using an atomic force microscope between before and after the rubber eraser abrasion test (1,000 g×5,000 times) is 0.1 nm or more and 5 nm or less; and the dynamic friction coefficient (at a load of 1,000 g) of the front surface of the optical film determined before the rubber eraser abrasion test is 0.70 or less; and the change rate of the dynamic friction coefficient (at a load of 1,000 g) of the front surface 10A of the optical film 10 between before and after the rubber eraser abrasion test (1,000 g×5,000 times) is up to 35%. This is considered to be because of the following reason. It is typical that the components in the surface of the optical film are easily removed when the optical film is subjected to the rubber eraser abrasion test (1,000 g×5,000 times). Thus, the arithmetic mean height of the front surface of the optical film measured after the rubber eraser abrasion test (1,000 g×5,000 times) tends to be significantly increased. In contrast, in cases where the functional layer contains a lubricant and an antifouling agent, or where a functional layer contains not a single but multiple types of antifouling agents or contains an antifouling agent containing different types of elements in the absence of a lubricant, as in the case of the functional layer according to the present embodiment, the dynamic friction coefficient (at a load of 1,000 g) of the front surface of the optical film determined before a rubber eraser abrasion test can be 0.70 or less, and the dynamic frictional force acting between a wad of steel wool or a rubber eraser and the surface of the functional layer is thus so low that the wad of steel wool or the rubber eraser can move smoothly. Then, when the rubber eraser abrasion test (1,000 g×5,000 times) is performed on the optical film as described above, some portion of the locally present lubricant or antifouling agent is removed as described above, but the smooth movement of the rubber eraser due to the action of the lubricant or the antifouling agent reduces the amount of the removed component, and this can cause the absolute value of the difference in the arithmetic mean height of the front surface of the optical film between before and after the rubber eraser abrasion test (1,000 g×5,000 times) to be 0.1 nm or more and 5 nm or less, and can also allow the change rate of the dynamic friction coefficient (at a load of 1,000 g) of the front surface 10A of the optical film 10 between before and after the rubber eraser abrasion test (1,000 g×5,000 times) to be up to 35%. Accordingly, superior scratch and abrasion resistance, and excellent antifouling performance can be provided not only before a rubber eraser abrasion test, but also after a rubber eraser abrasion test (1,000 g×5,000 times).

<<<<Polarizing Plate>>>>

Figure 9:
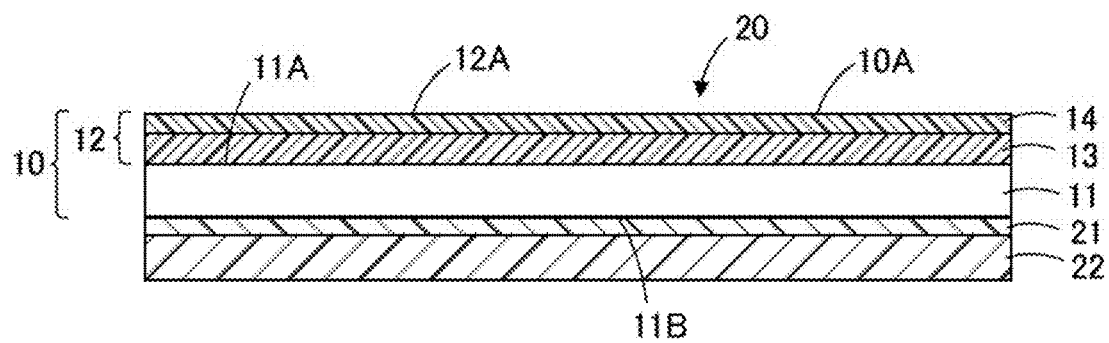
FIG. 9 shows a schematic diagram of a polarizing plate according to an embodiment.

The optical film 10 can be incorporated into a polarizing plate and then used. FIG. 9 shows a schematic diagram of a polarizing plate according to the present embodiment. As shown in FIG. 9, a polarizing plate 20 comprises an optical film 10, a polarizer 21, and a protective film 22 in this order. In this specification, the "polarizing plate" refers to a laminate comprising at least a polarizer, including, in addition to the polarizing plate 20, laminates assembled from, for example, a polarizer and the optical film of the present invention with an adhesive agent or a bonding agent. In this respect, a functional layer with some function may be placed between the polarizer and the optical film of the present invention.

The optical film 10 and the polarizer 21, and the polarizer 21 and the protective film 22 are bonded together by, for example, an aqueous bonding agent or an ultraviolet-curable bonding agent.

<<<Polarizer>>>

The polarizer 21 is provided on a second surface 11B of the resin base material 11 opposite to the first surface 11A. The polarizer 21 includes uniaxially stretched polyvinyl alcohol resin-based films stained with iodine or a dichromatic pigment. As the polyvinyl alcohol resin, a saponified polyvinyl acetate resin can be used. Examples of the polyvinyl acetate resin include polyvinyl acetates as homopolymers of vinyl acetate, and further include copolymers of vinyl acetate and another monomer copolymerizable therewith. Examples of said another monomer copolymerizable with vinyl acetate include unsaturated carboxylic acids, olefins, vinyl ethers, unsaturated sulfonic acids, and acrylamides with an ammonium group. The polyvinyl alcohol resin may have been modified. For example, aldehyde-modified polyvinyl alcohol such as polyvinyl formal and polyvinyl acetal can be used.

<<<Protective Film>>>

Examples of the protective film 22 include cellulose triacetate films (TAC films) and (meth)acrylic resin films.

<<<<Image Display Device>>>>

Figure 10:
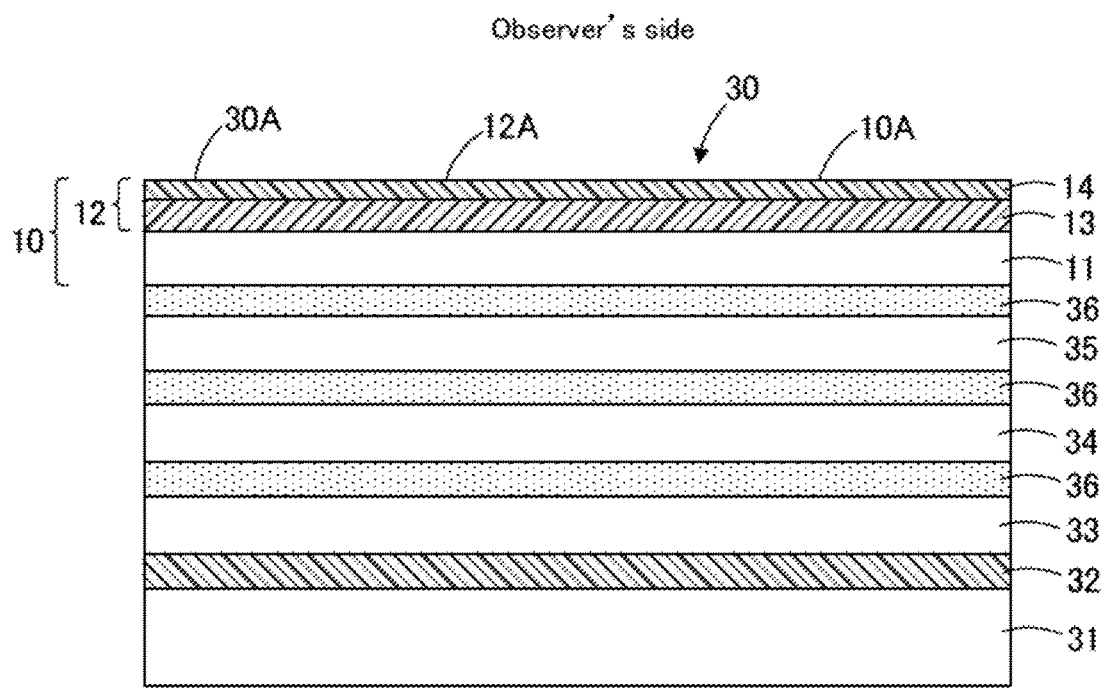
FIG. 10 shows a schematic diagram of an image display device according to an embodiment.

The optical film 10 may be incorporated into a foldable image display device and then used. FIG. 10 shows a schematic diagram of an image display device according to the present embodiment. As shown in FIG. 10, an image display device 30 generally comprises a housing 31 for accommodating, for example, a battery, a protective film 32, a display element 33, a circularly polarizing plate 34, a touch sensor 35, and an optical film 10 laminated in this order toward the observer's side. A light-transmitting adhesion layer 36 such as, for example, an OCA (optical clear adhesive) is placed along the interfaces between the display element 33 and the circularly polarizing plate 34, between the circularly polarizing plate 34 and the touch sensor 35, and between the touch sensor 35 and the optical film 10, and these components are anchored to each other with the light-transmitting adhesion layer 36. The above image display device is just an example, and foldable or rollable image display devices are not limited to the example.

In the optical film 10, the functional layer 12 is located on the observer's side of the resin base material 11. In the image display device 30, the front surface 12A of the functional layer 12 in the optical film 10 constitutes the front surface 30A of the image display device 30.

The display element 33 is an organic light-emitting diode (OLED) element, but the display device may be a liquid crystal display element, an inorganic light-emitting diode element, or a quantum dot light-emitting diode (QLED).

The touch sensor 35 is located closer to the display element 33 than the circularly polarizing plate 34, but may be placed between the circularly polarizing plate 34 and the optical film 10. Additionally, the touch sensor 35 may be an on-cell type or an in-cell type.

The intended uses of the optical film 10 are not specifically limited, but the optical film 10 can be very suitably used in image display devices, such as smartphones, tablet terminals, and personal computers with touch function.

EXAMPLES

Now, the present invention will be described in more detail by way of Examples. However, the present invention is not limited to those Examples. The phrase "a converted value based on 100% solids" below means a value determined based on the assumption that the content of solids diluted in a solvent is 100%.

<Preparation of Hard Coat Layer Compositions>

First, the following components were combined to meet the composition requirements indicated below and thereby to obtain hard coat layer compositions.

(Hard Coat Layer Composition 1)
 Dipentaerythritol polyacrylate (product name: "A-9550"; manufactured by Shin-Nakamura Chemical Co., Ltd.): 70 parts by mass;
 Silica particles (product name: "PGM-AC-2140Y"; manufactured by Nissan Chemical Industries, Ltd.): 30 parts by mass;
 Fluorine-based leveling agent (product name: "MEGAFACE F-444"; manufactured by DIC Corporation): 0.1 parts by mass.

(Hard Coat Layer Composition 2)
 Pentaerythritol triacrylate (product name: "A-TMM-3"; manufactured by Shin-Nakamura Chemical Co., Ltd.): 100 parts by mass;
 Silicone-based lubricant (product name: "BYK-333"; manufactured by BYK Japan KK): 0.1 parts by mass;

Fluorinated antifouling agent (product name: "MEGA-FACE RS-56"; manufactured by DIC Corporation): 0.1 parts by mass.

(Hard Coat Layer Composition 3)
Pentaerythritol triacrylate (product name: "A-TMM-3"; manufactured by Shin-Nakamura Chemical Co., Ltd.): 100 parts by mass;
Silicone-based lubricant (product name: "BYK-377"; manufactured by BYK Japan KK): 0.1 parts by mass;
Fluorinated antifouling agent (product name: "MEGA-FACE RS-56"; manufactured by DIC Corporation): 0.1 parts by mass.

(Hard Coat Layer Composition 4)
Pentaerythritol triacrylate (product name: "A-TMM-3"; manufactured by Shin-Nakamura Chemical Co., Ltd.): 100 parts by mass;
Silicone-based lubricant (product name: "BYK-378"; manufactured by BYK Japan KK): 100 parts by mass;
Fluorinated antifouling agent (product name: "MEGA-FACE RS-56"; manufactured by DIC Corporation): 0.1 parts by mass.

(Hard Coat Layer Composition 5)
Pentaerythritol triacrylate (product name: "A-TMM-3"; manufactured by Shin-Nakamura Chemical Co., Ltd.): 100 parts by mass;
Silicone-based lubricant (product name: "BYK-UV3510"; manufactured by BYK Japan KK): 100 parts by mass;
Fluorinated antifouling agent (product name: "MEGA-FACE RS-56"; manufactured by DIC Corporation): 0.1 parts by mass.

(Hard Coat Layer Composition 6)
Pentaerythritol triacrylate (product name: "A-TMM-3"; manufactured by Shin-Nakamura Chemical Co., Ltd.): 100 parts by mass;
Silicone-based lubricant (product name: "BYK-UV3500"; manufactured by BYK Japan KK): 0.1 parts by mass;
Fluorinated antifouling agent (product name: "MEGA-FACE RS-56"; manufactured by DIC Corporation): 0.1 parts by mass.

(Hard Coat Layer Composition 7)
A mixture of dipentaerythritol pentaacrylate and dipentaerythritol hexaacrylate (product name: "M403"; manufactured by Toagosei Co., Ltd.): 25 parts by mass;
EO-modified dipentaerythritol hexaacrylate (product name: "A-DPH-6E"; manufactured by Shin-Nakamura Chemical Co., Ltd.): 25 parts by mass;
Deformed silica particles (average particle diameter: 25 nm; manufactured by JGC C&C): 50 parts by mass (a converted value based on 100% solids);
Photopolymerization initiator (1-hydroxycyclohexyl phenyl ketone; product name: "Omnirad184", manufactured by IGM Resins B.V.): 4 parts by mass;
Fluorinated silicone-based leveling agent (product name: "Fluorinated silicone coating agent KP911"; manufactured by Shin-Etsu Chemical Co., Ltd.): 0.2 parts by mass (a converted value based on 100% solids);
Methyl isobutyl ketone (MIBK): 150 parts by mass.

(Hard Coat Layer Composition 8)
Pentaerythritol triacrylate (product name: "A-TMM-3"; manufactured by Shin-Nakamura Chemical Co., Ltd.): 100 parts by mass;
Silicone-based lubricant (product name: "BYK-345"; manufactured by BYK Japan KK): 0.1 parts by mass;
Fluorinated antifouling agent (product name: "MEGA-FACE RS-75"; manufactured by DIC Corporation): 0.1 parts by mass;
Smoothing agent (product name: "H65"; manufactured by CIK NanoTek Corporation): 1.5 parts by mass.

(Hard Coat Layer Composition 9)
Pentaerythritol triacrylate (product name: "A-TMM-3"; manufactured by Shin-Nakamura Chemical Co., Ltd.): 100 parts by mass;
Fluorinated antifouling agent (product name: "MEGA-FACE RS-75"; manufactured by DIC Corporation): 0.1 parts by mass.

(Hard Coat Layer Composition 10)
Pentaerythritol triacrylate (product name: "A-TMM-3"; manufactured by Shin-Nakamura Chemical Co., Ltd.): 100 parts by mass;
Silicone-based lubricant (product name: "BYK-313"; manufactured by BYK Japan KK): 0.1 parts by mass;
Fluorinated antifouling agent (product name: "MEGA-FACE RS-75"; manufactured by DIC Corporation): 0.1 parts by mass.

(Hard Coat Layer Composition 11)
Pentaerythritol triacrylate (product name: "A-TMM-3"; manufactured by Shin-Nakamura Chemical Co., Ltd.): 100 parts by mass;
Silicone-based lubricant (product name: "BYK-322"; manufactured by BYK Japan KK): 0.1 parts by mass;
Fluorinated antifouling agent (product name: "MEGA-FACE RS-75"; manufactured by DIC Corporation): 0.1 parts by mass.

(Hard Coat Layer Composition 12)
Pentaerythritol triacrylate (product name: "A-TMM-3"; manufactured by Shin-Nakamura Chemical Co., Ltd.): 100 parts by mass;
Silicone-based lubricant (product name: "BYK-331"; manufactured by BYK Japan KK): 0.1 parts by mass;
Fluorinated antifouling agent (product name: "MEGA-FACE RS-75"; manufactured by DIC Corporation): 0.1 parts by mass.

Example 1

A cellulose triacetate base material (product name: "KC8UAW"; manufactured by Konica Minolta, Inc.) with a size of 210 mm×297 mm (corresponding to the A4 size) and a thickness of 80 μm was set up as a resin base material, and the hard coat layer composition 1 was applied with a bar coater on one of the surfaces, or a first surface, of the cellulose triacetate base material to form a coating film. Then, the resulting coating film was heated at 90° C. for 40 seconds to evaporate the solvent in the coating film, and was then exposed to ultraviolet light to a cumulative light dose of 100 mJ/cm$^2$ in the air by using an ultraviolet irradiation device (with an H bulb as a light source; manufactured by Fusion UV Systems Inc.) to obtain a semi-cured (half cured) coating film. Next, the hard coat layer composition 2 was applied with a bar coater on the surface of the semi-cured coating film of the hard coat layer composition 1 to form a coating film. The resulting coating film was heated at 90° C. for 1 minute to evaporate the solvent in the coating film, and was then exposed to ultraviolet light to a cumulative light dose of 400 mJ/cm$^2$ under an oxygen concentration of 200 ppm or lower by using an ultraviolet irradiation device (with an H bulb as a light source; manufactured by Fusion UV Systems Inc.) to obtain a completely cured (full-cured) coating film. Thus, an optical film comprising a hard coat layer that is composed of a first hard coat layer having a film thickness of 15 µm and provided on a cellulose triacetate base material and of a second hard coat layer having a film thickness of 5 µm and layered on the first hard coat layer was obtained.

The film thickness of the first or second hard coat layer was defined as the arithmetic mean of film thickness values at 20 different locations, where a cross-section of the hard coat layer was imaged using a scanning electron microscope (SEM), and the film thickness of the hard coat layer was measured at the 20 locations within the image of the cross-section. A specific method of acquiring cross-sectional images is described below. First of all, a piece of 1 mm×10 mm cut out from the optical film was embedded in an embedding resin to prepare a block, and homogeneous sections having a thickness of 70 nm or more and 100 nm or less and having no openings or the like were cut out from the block according to a commonly used sectioning technique. For the preparation of sections, an "Ultramicrotome EM UC7" (Leica Microsystems GmbH) and the like was used. Then, the block remaining after cutting out the homogeneous sections having no openings or the like was used as a measurement sample. Subsequently, cross-sectional images of the measurement sample were acquired using a scanning electron microscope (SEM) (product name: "5-4800"; manufactured by Hitachi High-Technologies Corporation). The cross-sectional images were acquired using the above-described S-4800 by setting the detector to "SE," the accelerating voltage to "5 kV," and the emission current to "10 µA." The focus, contrast, and brightness were appropriately adjusted at a magnification in the range of 10,000 to 50,000 times, so that each layer could be identified by observation. Furthermore, the beam monitor aperture, the objective lens aperture, and the WD were respectively set to "3," "3," and "8 mm," in acquisition of the cross-sectional images using the above-described S-4800. Also in each of Examples 2 to 13 and Comparative Examples 1 to 5, the thickness of a base material and the film thickness of a hard coat layer were measured in the same manner as in Example 1.

Example 2

In Example 2, an optical film was obtained in the same manner as in Example 1, except that the hard coat layer composition 3 was used instead of the hard coat layer composition 2.

Example 3

In Example 3, an optical film was obtained in the same manner as in Example 1, except that the hard coat layer composition 4 was used instead of the hard coat layer composition 2.

Example 4

In Example 4, an optical film was obtained in the same manner as in Example 1, except that the hard coat layer composition 5 was used instead of the hard coat layer composition 2.

Example 5

In Example 5, an optical film was obtained in the same manner as in Example 1, except that the hard coat layer composition 6 was used instead of the hard coat layer composition 2.

Example 6

In Example 6, an optical film was obtained in the same manner as in Example 1, except that a cellulose triacetate base material (product name: "KC6UAW", manufactured by Konica Minolta, Inc.) with a thickness of 60 µm was used instead of the cellulose triacetate base material (product name: "KC8UAW", manufactured by Konica Minolta, Inc.) with a thickness of 80 µm and the hard coat layer composition 7 was used instead of the hard coat layer composition 2.

Example 7

In Example 7, an optical film was obtained in the same manner as in Example 1, except that a cellulose triacetate base material (product name: "Z-TAC"; manufactured by Fujifilm Corporation) with a thickness of 25 µm was used instead of the cellulose triacetate base material (product name: "KC8UAW", manufactured by Konica Minolta, Inc.) with a thickness of 80 µm and the hard coat layer composition 7 was used instead of the hard coat layer composition 2.

Example 8

In Example 8, an optical film was obtained in the same manner as in Example 1, except that a polyethylene terephthalate base material (product name: "Cosmoshine® A4100", manufactured by TOYOBO Co., Ltd.) with a thickness of 48 µm was used instead of the cellulose triacetate base material and the hard coat layer composition 7 was used instead of the hard coat layer composition 2.

Example 9

In Example 9, an optical film was obtained in the same manner as in Example 1, except that a polyethylene terephthalate base material (product name: "Cosmoshine® A4100", manufactured by TOYOBO Co., Ltd.) with a thickness of 38 µm was used instead of the cellulose triacetate base material and the hard coat layer composition 7 was used instead of the hard coat layer composition 2.

Example 10

In Example 10, an optical film was obtained in the same manner as in Example 1, except that a cycloolefin polymer polymer base material (product name: "ZEONOR® film ZF16", manufactured by ZEON Corporation) with a thickness of 50 µm was used instead of the cellulose triacetate base material.

Example 11

In Example 11, an optical film was obtained in the same manner as in Example 1, except that a cycloolefin polymer base material (product name: "ZEONOR® film ZF16"; manufactured by ZEON Corporation) with a thickness of 25 µm was used instead of the cellulose triacetate base material.

Example 12

In Example 12, an optical film was obtained in the same manner as in Example 1, except that a polyimide base material (product name: "Neopulim®"; manufactured by Mitsubishi Gas Chemical Company, Inc.) with a thickness of 60 μm was used instead of the cellulose triacetate base material. The above Neopulim® was commercially available as a polyimide base material.

Example 13

In Example 13, an optical film was obtained in the same manner as in Example 1, except that a polyimide base material (product name: "Neopulim®"; manufactured by Mitsubishi Gas Chemical Company, Inc.) with a thickness of 20 μm was used instead of the cellulose triacetate base material. The above Neopulim® was commercially available as a polyimide base material.

Comparative Example 1

In Comparative Example 1, an optical film was obtained in the same manner as in Example 1, except that the hard coat layer composition 8 was used instead of the hard coat layer composition 2.

Comparative Example 2

In Comparative Example 2, an optical film was obtained in the same manner as in Example 1, except that the hard coat layer composition 9 was used instead of the hard coat layer composition 2.

Comparative Example 3

In Comparative Example 3, an optical film was obtained in the same manner as in Example 1, except that the hard coat layer composition 10 was used instead of the hard coat layer composition 2.

Comparative Example 4

In Comparative Example 4, an optical film was obtained in the same manner as in Example 1, except that the hard coat layer composition 11 was used instead of the hard coat layer composition 2.

Comparative Example 5

In Comparative Example 5, an optical film was obtained in the same manner as in Example 1, except that the hard coat layer composition 12 was used instead of the hard coat layer composition 2.

<Observation of Depressions Before and after a Rubber Eraser Abrasion Test>

In the optical films according to Examples 1 to 6, 8, 10, and 12 and Comparative Examples 1 to 5, a 5-μm square region on the front surface of each optical film was observed using an atomic force microscope (AFM) (product name: "WET-9100"; manufactured by Shimadzu Corporation) before and after a rubber eraser abrasion test to find depressions in the square region, which depressions had any shape at least selected from a ring shape with an outer diameter of 0.1 μm or more and 2.5 μm or less and with a depth of 1 nm or more and 150 nm or less, a circular shape with a diameter of 0.1 μm or more and 2.5 μm or less and with a depth of 1 nm or more and 150 nm or less, and an irregular shape with a width of 0.1 μm or more and 2.5 μm or less and with a depth of 1 nm or more and 150 nm or less, and the number of such depressions was counted. Then, the presence and absence of 1 or more and 50 or less such depressions were classified as "present" and "absent," respectively. Additionally, the presence of a projection with a height of 1 nm or more within each of such depressions was examined. Then, the absence and presence of such projections were classified as "absent" and "present," respectively. The optical film according to Example 7 was not examined by, for example, observing depressions because a hard coat layer was formed similarly to Example 6 by using the hard coat layer composition 7, and the optical film according to Example 9 was not examined by, for example, observing depressions because a hard coat layer was formed similarly to Example 8 by using the hard coat layer composition 7, and the optical film according to Example 11 was not examined by, for example, observing depressions because a hard coat layer was formed similarly to Example 10 by using the hard coat layer composition 7, and the optical film according to Example 13 was not examined by, for example, observing depressions because a hard coat layer was formed similarly to Example 12 by using the hard coat layer composition 7.

To observe depressions, three pieces of the optical film with a size of 50 mm×100 mm were first cut out to obtain three samples. Then, a rectangular frame-shaped mark with a size of 20 mm×40 mm was drawn with a permanent marker on the back surface of each of the three samples. The rectangular frame-shaped mark was drawn in such a manner that the longitudinal direction was parallel to the longitudinal direction of each sample. Then, a rubber eraser abrasion test was performed on two out of the three samples.

The above rubber eraser abrasion test was performed by the following procedure. First of all, a pencil with a rubber eraser (product name: "Pencil for office use #9852 (with a rubber eraser)"; manufactured by Mitsubishi Pencil Co., Ltd.) was provided. The rubber eraser in the pencil had a diameter of 6 mm and a durometer hardness (Type A Durometer, Type A (cylindrical indenter), JIS K6253: 1997/ ISO7619 (Rubber)) of 65 or more and 90 or less. After the pencil with a rubber eraser was provided, the pencil was cut at a distance of 50 mm from the tip of the rubber eraser. Then, the cut end of pencil with a rubber eraser was attached to a jig having a hole with a diameter of 6 mm by inserting the tip of the cut piece, as opposed to the rubber eraser, into the hole in such a manner that the rubber eraser was completely exposed from the jig. The pencil with a rubber eraser was attached to the jig in such a manner that the tip of the rubber eraser exposed from the jig was around 1.5 mm in length. Then, the jig holding the pencil with a rubber eraser was mounted on a color fastness rubbing tester (product name: "AB-301", manufactured by Tester Sangyo Co., Ltd.). The jig was mounted on the above tester in such a manner that the pencil with a rubber eraser was perpendicular to the surface of the sample.

Meanwhile, one of the samples obtained above was immobilized on a sample stage of the above color fastness rubbing tester in such a manner that the sample lying on the surface of the sample stage had no wrinkle. The sample was placed on the sample stage in such a manner that the moving direction of the sample stage was in the longitudinal direction of the sample and the center of a region to be rubbed was matched with the center of the frame-shaped mark. Then, the surface of the sample was rubbed under these conditions 4,000 times with the rubber eraser in a reciprocating motion at a rubbing speed of 30 mm/sec and under a load of 500 g to perform a rubber eraser abrasion test (500 g×4,000 times). Additionally, one of the other samples obtained above was similarly used to perform a rubber eraser abrasion test (1,000 g×5,000 times), in which the surface of the sample was rubbed 5,000 times with the rubber eraser in a reciprocating motion at a rubbing speed of 30 mm/sec and under a load of 1,000 g. That is, among the three samples, one sample was not subjected to a rubber eraser abrasion test (a sample examined before a rubber eraser abrasion test), and another one sample was subjected to the rubber eraser abrasion test (500 g×4,000 times), and the remaining one sample was subjected to the rubber eraser abrasion test (1,000 g×4,000 times).

Ring-shaped, circularly shaped, or irregularly shaped depressions on the surface of each of the above-described samples were observed with an atomic force microscope (AFM) (product name: "WET-9100"; manufactured by Shimadzu Corporation). The observation was performed by the following procedure. Specifically, three areas where at least no macroscopic abnormality was seen (areas which carried, for example, no foreign bodies or scratches) were first randomly selected at the central part of the region within the frame-shaped mark in each sample, and the sample was cut into 5-mm squares to obtain three measurement samples. Meanwhile, a plural number of flat and circular metal plates with a diameter of 15 mm and a thickness of 1 mm were provided, and each metal plate was attached with a piece of a double-sided carbon coated tape manufactured by Nissin EM Co., Ltd. Each measurement sample was attached to each piece of the tape in such a manner that the surface of the measurement sample (the surface of the optical film) faced upward. Then, the metal plates attached with the measurement samples were left in a desiccator overnight for secure adhesion between the tape and the samples. After left overnight, each metal plate with an attached sample was immobilized on a stage of an atomic force microscope (product name: "WET-9400"; manufactured by Shimadzu Corporation) by means of a magnet, and the surface profiles on 5-µm square measurement areas were observed with the atomic force microscope in tapping mode.

The number of the above depressions was calculated by randomly selecting 5 positions from one measurement sample, counting the number of depressions at the 5 positions within a 5-µm square region in each of the three measurement samples (a total of 15 positions), and calculating the arithmetic mean of the obtained numbers of depressions at the 15 positions. In this respect, when a depression was ring-shaped and the above-described region included a part of the depression but not its entirety, the 5-µm square region on the front surface of the optical film was observed with an atomic force microscope to extrapolate the missing outer edge of the depression included in the above-described region, as shown by a dotted line in FIG. 2, to draw a full circle. If the area of the depression inside the outer edge included in the above-described region was not less than half the area of the extrapolated full circle, even the part of the depression was counted as a depression. If the area of the part of the depression included in the above-described region was less than half the area of the extrapolated full circle, the depression was not counted.

In cases where the above depressions were ring-shaped, the outer diameter and depth of the depressions were determined by the following procedure, to judge whether or not the depression was the same type of depression as described above. First of all, while one depression in a 5-µm square region on the surface of the sample was observed with an atomic force microscope, a straight line was drawn from an arbitrary point A to another arbitrary point B on the outer edge of the depression to connect the longest distance between the two points, as shown in FIG. 2, and the length of the line from the point A to the point B (the outer diameter) was determined. Moreover, depths were measured along the axis from the point A to the point B, and the largest among the depths from the reference level along the axis from the point A to the point B was found. Once the surface profile of an optical film was taken under the atomic force microscope, the reference level for depth measurement was automatically determined. Then, the measurement was performed on 3 different positions, and the arithmetic mean of the lengths measured at the 3 positions and the arithmetic mean of the depths measured at the 3 positions were calculated to obtain the outer diameter and depth of the depressions. Some depressions may have a local deep hole with an aspect ratio of 5 or more on the bottom surfaces. When the hole is taken into consideration for measurement of the depth of a depression, the depth of the depression is not accurately determined. Then, the points A and B were selected in such a manner that any local deep hole as described above was not located on the axis from the point A to the point B. Also in cases where the depressions were circularly shaped, the diameter and depth of the depressions were determined in the same manner as those of ring-shaped depressions.

In cases where the above depressions were irregularly shaped, the width of the depressions was determined by the following procedure. First of all, while one depression in a 5-µm square region on the surface of the sample was observed with an atomic force microscope, a straight line L1 passing through a position considered as the central part of the depression was drawn, as shown in FIG. 2. The intersection points C1 and D1 between the straight line L1 and the outer edge of the depression were determined. Subsequently, the distance DS1 between the points C1 and D1 was measured, and the middle point M of the segment with the distance DS1 was determined. Moreover, a virtual straight line L2 passing through the middle point M and inclined at 60° from the straight line L1 was drawn, and the intersection points C2 and D2 between the straight line L2 and the outer edge of the depression 10B were determined to measure the distance DS2 between the points C2 and D2. Furthermore, a virtual straight line L3 passing through the middle point M and inclined at 120° from the straight line L1 and not overlapping with the straight line L2 was drawn, and the intersection points C3 and D3 between the straight line L3 and the outer edge of the depression 10B were determined to measure the distance DS3 between the points C3 and D3. Then, the average of the distances DS1 to DS3 was calculated to determine the width. Additionally, in cases where the depressions were irregularly shaped, the depth of the depressions was also determined in the same manner as that of ring-shaped depressions.

<Measurement of Arithmetic Mean Height (Sa) Before and after a Rubber Eraser Abrasion Test>

In the optical films according to Examples 1 to 6, 8, 10, and 12 and Comparative Examples 1 to 5, the arithmetic mean height (Sa) was determined using an atomic force microscope (for example, product name: "AFM-5500"; manufactured by Hitachi High-Technologies Corporation) before and after a rubber eraser abrasion test (5,000 times) as follows to calculate the absolute value of the difference in the arithmetic mean height (Sa) between the rubber eraser abrasion test (1,000 g×5,000 times). Specifically, each optical film that had not been subjected to a rubber eraser abrasion test was first cut into two pieces with a size of 50 mm×100 mm to obtain two samples. Then, a rectangular frame-shaped mark with a size of 20 mm×40 mm was drawn with a permanent marker on the back surface of each of the two samples. The rectangular frame-shaped mark was drawn in such a manner that the longitudinal direction was parallel to the longitudinal direction of each sample. Then, a rubber eraser abrasion test (1,000 g×5,000 times) was performed on one out of the two samples. The rubber eraser abrasion test (1,000 g×5,000 times) was performed under the same conditions as those for the rubber eraser abrasion test (1,000 g×5,000 times) in the above section <Observation of Depressions Before and After a Rubber eraser abrasion Test>.

Then, three areas where at least no macroscopic abnormality was seen (areas which carried, for example, no foreign bodies or scratches) were randomly selected at the central part of the region within the frame-shaped mark in each sample, and the sample was cut into 5-mm squares to obtain three measurement samples. Meanwhile, a plural number of flat and circular metal plates with a diameter of 15 mm and a thickness of 1 mm were provided, and each metal plate was attached with a piece of a double-sided carbon coated tape manufactured by Nissin EM Co., Ltd. Each measurement sample was attached to each piece of the tape in such a manner that the surface of the measurement sample (the surface of the optical film) faced upward. Then, the metal plates attached with the measurement samples were left in a desiccator overnight for secure adhesion between the tape and the samples.

After left overnight, each metal plate with an attached measurement sample was placed on a stage of an atomic force microscope (product name: "AFM-5500"; manufactured by Hitachi High-Technologies Corporation), and the surface profiles on 5-μm square measurement areas were observed with the atomic force microscope in tapping mode. Then, the arithmetic mean height Sa was calculated from the observation data using the surface analysis software installed in the atomic force microscope. The vertical scale during the surface analysis was 20 nm. The observation was performed at room temperature, and a cantilever SI-DF40P2 manufactured by Olympus Corporation was used as a cantilever. In the observation of surface profile, five positions were randomly selected from each of the three measurement samples and the surface profile was observed at the 15 positions in total (three measurement samples×five positions). Then, the surface analysis software installed in the atomic force microscope was used to calculate Sa values from all the obtained data from the 15 positions, and the arithmetic means of the values from the 15 positions was determined as the Sa of the measurement samples. The arithmetic mean height (Sa) was also measured in the sample subjected to the rubber eraser abrasion test (1,000 g×5,000 times) by the same method as for the optical film that had not been subjected to a rubber eraser abrasion test. Then, the absolute value of the difference in the arithmetic mean height (Sa) of a 5-μm square region on the surface of the measurement samples between before and after the rubber eraser abrasion test (1,000 g×5,000 times) was calculated.

<Measurement of Dynamic Friction Coefficient Before and after a Rubber Eraser Abrasion Test>

In the optical films according to Examples 1 to 6, 8, 10, and 12 and Comparative Examples 1 to 5, the dynamic friction coefficient of the front surface of each optical film was determined before and after a rubber eraser abrasion test, and the change rate of the dynamic friction coefficient of the front surface of each optical film between before and after the rubber eraser abrasion test was also determined. The dynamic friction coefficient (at a load of 500 g) of the front surface of each optical film determined before a rubber eraser abrasion test was defined as a dynamic friction coefficient obtained in the sample after one reciprocating motion in the below-described pseudo-rubber eraser abrasion test (500 g×4,000 times), and the dynamic friction coefficient (at a load of 1,000 g) of the front surface of each optical film determined before a rubber eraser abrasion test was defined as a dynamic friction coefficient obtained in the sample after one reciprocating motion in the below-described pseudo-rubber eraser abrasion test (1,000 g×5,000 times), and the dynamic friction coefficient (at a load of 500 g) of the front surface of each optical film determined after a rubber eraser abrasion test (500 g×4,000 times) was defined as a dynamic friction coefficient obtained in the sample after 4,000 reciprocating motions in the pseudo-rubber eraser abrasion test (500 g×4,000 times), and the dynamic friction coefficient (at a load of 1,000 g) of the front surface of each optical film determined after a rubber eraser abrasion test (1,000 g×5,000 times) was defined as a dynamic friction coefficient obtained in the sample after 5,000 reciprocating motions in the pseudo-rubber eraser abrasion test (1,000 g×5,000 times). The pseudo-rubber eraser abrasion test performed for the determination of dynamic friction coefficient resembled the rubber eraser abrasion test described in the section <Observation of Depressions and Projections Before and After a Rubber eraser abrasion Test>.

Specifically, a pencil with a rubber eraser (product name: "Pencil for office use #9852 (with a rubber eraser)"; manufactured by Mitsubishi Pencil Co., Ltd.) was first provided, and the pencil was cut at a distance of 50 mm from the tip of the rubber eraser. Then, the cut end of pencil with a rubber eraser was attached to a jig having a hole with a diameter of 6 mm by inserting the tip of the cut piece, as opposed to the rubber eraser, into the hole in such a manner that the tip of the rubber eraser was completely exposed from the jig. The pencil with a rubber eraser was attached to the jig in such a manner that the tip of the rubber eraser exposed from the jig was around 1.5 mm in length. Subsequently, the jig with the pencil with a rubber eraser was immobilized on a measurement unit of a dynamic friction abrasion testing device (product name: "Handy Tribomaster Type TL201 Ts"; manufactured by Trinity-Lab Inc.) along the axis of the measurement unit by means of a double-sided tape. Then, a specialized software program (Tribo-Analysis Software) was started on the screen of a personal computer (PC) electrically connected to the dynamic friction abrasion testing device with the pencil immobilized on the measurement unit.

Meanwhile, each optical film that had not been subjected to a rubber eraser abrasion test was cut into pieces with a size of 50 mm×100 mm to obtain six samples. Among the six samples, three samples were for determining a dynamic friction coefficient obtained before a rubber eraser abrasion test and a dynamic friction coefficient obtained after a rubber eraser abrasion test (500 g×4,000 times), and the remaining three samples were for determining a dynamic friction coefficient obtained after a rubber eraser abrasion test (1,000 g×5,000 times). Then, a frame-shaped mark with a size of 20 mm×40 mm was drawn with a permanent marker on the back surface of each of the samples, so that the center of a region to be rubbed was easily recognized. The mark was drawn in such a manner that the longitudinal direction was parallel to the longitudinal direction of the sample. Subsequently, a tape named Cello-tape® was stuck on the four sides to immobilize the sample on a driving unit of the static and dynamic friction abrasion testing device in such a manner that the surface to determine the dynamic friction coefficient faced upward and the sample lying on the surface of the driving unit had no wrinkle. The sample was placed on the driving unit in such a manner that the moving direction of the driving unit was in the longitudinal direction of the sample and the center of a region to be rubbed was matched with the center of the mark. Additionally, a weight of 500 g was immobilized on the upper surface of the jig by means of a double-sided tape to make the rubber eraser in the measurement unit placed in contact with and perpendicular to the surface of the sample. After the rubbing distance (in one way), the rubbing speed, the number of reciprocating motions, and the measurement mode were respectively set to 20 mm, 40 rounds/min, 4,000 times, and the continuous measurement mode, a switch on the screen of the PC was pressed to start the pseudo-rubber eraser abrasion test (500 g×4,000 times) and determination of the dynamic friction coefficient (at a load of 500 g) of the sample in an environment at a temperature of 23° C. and a relative humidity of 50%. During the pseudo-rubber eraser abrasion test, the dynamic friction coefficient (at a load of 500 g) was continuously determined to plot a graph where the horizontal axis represented the time and the vertical axis represented the dynamic frictional force. The dynamic friction coefficient (at a load of 500 g) at a time point corresponding to each of the reciprocating motions was calculated by dividing the dynamic frictional force by the normal force at the particular time point. The dynamic friction coefficient (at a load of 500 g) of each optical film was defined as the arithmetic mean of three values obtained by measuring the three samples. Prior to every measurement, the position of the rubber eraser was adjusted in such a manner that the distance of the tip of the exposed rubber eraser from the jig was 1.5 mm. Additionally, the change rate between the dynamic friction coefficient (at a load of 500 g) of the surface of the sample determined before the pseudo-rubber eraser abrasion test and the dynamic friction coefficient (at a load of 1,000 g) of the surface of the sample determined after the pseudo-rubber eraser abrasion test (500 g×4,000 times) was determined according to the above equation (2).

Moreover, the remaining three samples were similarly used to perform a pseudo-rubber eraser abrasion test (1,000 g×5,000 times), as well as to determine the dynamic friction coefficient (at a load of 1,000 g). In this case, the weight of 500 g was replaced with a weight of 1,000 g, and the number of reciprocating motions was set to 5,000 times. The dynamic friction coefficient (at a load of 1,000 g) was defined as the arithmetic mean of three values obtained by measuring the three samples. Additionally, the change rate of the dynamic friction coefficient (at a load of 1,000 g) of the surface of the sample between before and after the pseudo-rubber eraser abrasion test (1,000 g×5,000 times) was determined according to the above equation (2).

<Ratio of Contact Angle Maintained Between Before and after a Rubber Eraser Abrasion Test>

In the optical films according to Examples 1 to 6, 8, 10, and 12 and Comparative Examples 1 to 5, the contact angle of water on the front surface of each optical film was measured both before and after a rubber eraser abrasion test to calculate the ratio of the contact angle measured after the rubber eraser abrasion test to the contact angle measured before the rubber eraser abrasion test, namely the ratio of maintained contact angle. A rubber eraser abrasion test (500 g×4,000 times) or a rubber eraser abrasion test (1,000 g×5,000 times) was performed as the rubber eraser abrasion test.

First of all, three samples similar to the samples described in the above section <Observation of Depressions Before and After a Rubber eraser abrasion Test> were obtained. Then, the rubber eraser abrasion test (500 g×4,000 times) described in the above section <Observation of Depressions and Projections Before and After a Rubber eraser abrasion Test> was performed on one out of the three samples, and the rubber eraser abrasion test (1,000 g×5,000 times) described in the above section <Observation of Depressions Before and After a Rubber eraser abrasion Test> was also performed on one of the other samples.

Then, the contact angle of water on the surface of each sample was measured using a microscopic contact angle meter (product name: "DropMaster 300"; manufactured by Kyowa Interface Science Co., Ltd.) at 23° C. by a method in accordance with the sessile drop method described in JIS R3257: 1999. Specifically, the sample that had not been subjected to a rubber eraser abrasion test was first cut into a piece with a size of 30 mm×50 mm to obtain a measurement sample. The measurement sample was cut so as to include a frame-shaped mark with a size of 20 mm×40 mm. Then, the measurement sample was placed flat on a glass slide with a size of 25 mm×75 mm by means of a double-sided tape. The measurement sample was placed in such a manner that the above-described frame was located within the glass slide. Subsequently, ions generated with an ionizer (for example, product name: "KD-730B"; manufactured by Kasuga Denki, Inc.) were applied for 30 seconds to eliminate static electricity on the measurement sample and thereby to prevent static electricity on the measurement sample from influencing the measurement result. After the static electricity was eliminated, a 1-µL drop of water was placed on the surface of the second hard coat layer by means of a syringe, and was left to stand for 5 seconds. Then, the microscopic contact angle meter was switched on to measure the contact angle of water. The measurement of contact angle was performed in an environment at a temperature of 23° C. and a relative humidity of 50%. Moreover, the contact angle was measured at 10 different positions, and the arithmetic mean of the measured values was defined as the contact angle on the front surface of the optical film measured before a rubber eraser abrasion test. The contact angle of water on the front surface of the optical film measured after the rubber eraser abrasion test (500 g×4,000 times) and the contact angle of water on the front surface of the optical film measured after the rubber eraser abrasion test (1,000 g×5,000 times) were measured by the same method as for the contact angle of water on the front surface of the optical film before a rubber eraser abrasion test, except that the sample subjected to the rubber eraser abrasion test (500 g×4,000 times) and the sample subjected to the rubber eraser abrasion test (1,000 g×5,000 times) were respectively used for the measurement. Then, the ratio of maintained contact angle was calculated according to the above equation (3).

<Steel Wool (SW) Test>

In the optical films according to Examples 1 to 6, 8, 10, and 12 and Comparative Examples 1 to 5, a steel-wool scratch test was performed on the front surface of each optical film (the front surface of each hard coat layer) that had not been subjected to a rubber eraser abrasion test, for evaluation purposes. Specifically, each optical film that had not been subjected to a rubber eraser abrasion test was cut into a piece with a size of 50 mm×100 mm to obtain a sample that had not been subjected to a rubber eraser abrasion test. Then, the sample was immobilized on a sample stage of a color fastness rubbing tester (product name: "AB-301"; manufactured by Tester Sangyo Co., Ltd.) in such a manner that the surface of the sample (the front surface of the optical film) faced upward and the sample lying flat on the sample stage had no wrinkle or no curl. Subsequently, a wad of steel wool with a grade of #0000

(product name: "Bonstar B-204"; manufactured by Nihon Steel Wool Co., Ltd.) was mounted on the tester and brought into contact with the surface of the sample, and was allowed to rub the front surface 5,000 times under a load 1 kg/cm$^2$ by moving reciprocally at a speed of 100 mm/sec through a distance of 200 mm in both ways (100 mm in one way) in an environment at a temperature of 23° C. and a relative humidity of 50%. The contact surface between the steel wool and the front surface of an optical film was 1 cm$^2$. The above Bonstar B-204 had a width of about 390 mm, a length of about 75 mm, and a thickness of about 110 mm for commercial uses. The wad of steel wool was torn off (not chopped with a cutting tool because chopped steel wool fiber have sharp edges) from the original mass of steel wool and was uniformly rounded into a ball until specific wires extended from the steel wool were laid on the surface of the ball. Then, the tester was set in such a manner that the thickness of the steel wool was reduced to 20 mm when a load of 1 kg was applied, provided that the contact area was 1 cm$^2$. Finally, the sample was observed under transmitting fluorescent light (illuminance on the sample: 800 to 1200 Lx; observation distance: 30 cm) and under LED light (illuminance on the sample: 4,000 to 6,000 Lx; observation distance: 30 cm) by naked eyes to determine whether or not any scratch was found on the surface of the sample. The evaluation criteria were as follows.

o: no scratch was found.
x: a scratch was found.

<Pencil Hardness Test>

In the optical films according to Examples 1 to 6, 8, 10, and 12 and Comparative Examples 1 to 5, the pencil hardness was measured in accordance with JIS K5600-5-4: 1999 on the front surface of each optical film (the front surface of each hard coat layer) that had not been subjected to a rubber eraser abrasion test. In the measurement of pencil hardness, each optical film was cut into a piece with a size of 50 mm×100 m to obtain a sample that had not been subjected to a rubber eraser abrasion test. The sample was immobilized on a glass plate by means of a tape called Cello-tape®, manufactured by Nichiban Co., Ltd., in such a manner that the sample had no fold or no wrinkle, and a pencil was moved on the sample at a speed of 1 mm/sec by applying a load of 1 kg to the pencil. The grade of the hardest pencil that does not scratch the surface of the optical film during the pencil hardness test is determined as the pencil hardness of the optical film. A plural number of pencils with different hardness were used for the measurement of pencil hardness and the pencil hardness test was repeated five times for each pencil. In cases where no scratch was visibly detected on the surface of the sample (the optical film) in four or more out of the five replicates when the surface of the sample was observed under transmitting fluorescent light, the pencil with the hardness was determined to make no scratch on the surface of the sample.

<Measurement of Total Light Transmittance>

In the optical films according to Examples 1 to 6, 8, 10, and 12 and Comparative Examples 1 to 5, the total light transmittance was measured in accordance with JIS K7361-1: 1997 by using a haze meter (product name: "HM-150"; manufactured by Murakami Color Research Laboratory Co., Ltd.) for each optical film that had not been subjected to a rubber eraser abrasion test. For the above-described total light transmittance, each optical film that had not been subjected to a rubber eraser abrasion test was cut into a piece with a size of 50 mm×100 mm to obtain a sample. Then, the sample was set in such a manner that the sample had no curl or wrinkle as well as no dirt such as fingerprints or dust and the hard coat layer faced in the direction opposite to the light source, to measure the total light transmittance three times for one sample. The arithmetic mean of the three measured values was determined as the total light transmittance of the sample.

<Measurement of Haze Value>

In the optical films according to Examples 1 to 6, 8, 10, and 12 and Comparative Examples 1 to 5, the haze value (the total haze value) was measured in accordance with JIS K7136: 2000 by using a haze meter (product name: "HM-150"; manufactured by Murakami Color Research Laboratory Co., Ltd.) for each optical film that had not been subjected to a rubber eraser abrasion test. For the haze value, each optical film was cut into a piece with a size of 50 mm×100 mm to obtain a sample that had not been subjected to a rubber eraser abrasion test. Then, the sample was set in such a manner that the sample had no curl or wrinkle as well as no dirt such as fingerprints or dust and the hard coat layer faced in the direction opposite to the light source, to measure the haze value three times for one optical film. The arithmetic mean of the three measured values was determined as the haze of the optical film.

<Evaluation of Flexibility>

(1) Evaluation of Crack and Break Formation after Folding Test

A folding test was performed on the optical films according to Examples 6 to 13 to examine crack and break formation in the optical films. Specifically, each optical film that had not been subjected to a rubber eraser abrasion test was cut into a piece with a size of 125 mm×50 mm to obtain a rectangular sample. After the sample was cut off, the sample was mounted on a tension free u-shape folding test machine (product name: "DLDMLH-FS"; manufactured by Yuasa System Co., Ltd.) as a folding endurance testing machine, by fixing the short edges (50 mm) of the sample to the fixing members, as shown in FIG. 5 (C), in such a manner that the minimum gap between the two opposing edges was 2 mm (the outer diameter of a bent part: 2 mm), and was tested under the following conditions by repeating the folding test 100,000 times, in each of which the hard coat layer in the sample was folded back inward (the hard coat layer was folded inward, and the base material was folded outward).

(Folding Conditions)
Reciprocating speed: 80 rpm (revolutions per minute)
Test stroke: 60 mm
Bend angle: 180°

Then, it was examined to determine whether any crack or break was formed at the bent part. The evaluation criteria were as follows. When a prospective bent part of each optical film was observed before the folding test, no crack or break was found. The evaluation criteria were as follows.

(Foldability)
⊚: formation of a crack or break at the bent part was not detected after the folding test;
o: formation of a slight crack or break at the bent part was detected after the folding test, but the damage was not so serious as to warrant exclusion from practical use;
Δ: formation of a crack or break at the bent part was detected after the folding test.

Additionally, the same sample as described above was newly prepared from each of the optical films according to Examples 6 to 13, and the sample was mounted on the folding endurance testing machine by fixing the short edges of the sample to the fixing members in such a manner that the minimum gap φ between the two opposing edges was 2 mm (the outer diameter of a bent part: 2 mm), and was tested by repeating the folding test 200,000 times, in each of which the hard coat layer in the sample was folded back inward, and the sample subjected to the folding test was observed to find any crack or break, and was evaluated based on the above criteria, in the same manner as above. Furthermore, the same sample as described above was newly prepared from each of the optical films according to Examples 6 to 13, and the sample was mounted on the folding endurance testing machine by fixing the short edges of the sample to the fixing members in such a manner that the minimum gap φ between the two opposing edges was 2 mm (the outer diameter of a bent part: 2 mm), and was tested by repeating the folding test 300,000 times, in each of which the hard coat layer in the sample was folded back inward, and the sample subjected to the folding test was observed to find any crack or break, and was evaluated based on the above criteria, in the same manner as above.

(2) Evaluation of Crease Formation after Folding Test

In the optical films according to Examples 6 to 13, the appearance was observed after the folding test, to evaluate whether any crease was formed at the bent part of each optical film. The folding test was performed according to the method described in the section about the evaluation of surface resistance before and after a folding test. The creases were inspected by naked eyes in an environment at a temperature of 23° C. and a relative humidity of 50%. The creases were observed by thoroughly observing both the inner and outer surfaces at the bent part under unfolded conditions in transmitted light and reflected light at a room under a white color illumination (at 800 to 2,000 lux). For observation of the creases, marks were drawn on both the edges perpendicular to the folding direction in the bent part, with a permanent marker, to indicate the position of the bent part for ease of finding the position of an area to be observed, as shown in FIG. 7, when each sample that had not been subjected to a folding test was fixed to fixing members of the endurance testing machine and was folded once. Moreover, each sample was dismounted from the endurance testing machine after the folding test, and lines connecting the marks on both the edges of the bent part were drawn with a permanent marker. Then, the entire region of the bent part surrounded by the marks on both the edges of the bent part and by the lines connecting the marks was observed by naked eyes to find creases. When a prospective bent part of each optical film was observed before the folding test, no crease was found. The evaluation criteria were as follows.

⊚: a crease was not detected in the optical film after the folding test;

○: a slight crease was detected in the optical film after the folding test, but the damage was not so severe as to warrant exclusion from practical use;

Δ: a crease was detected in the optical film after the folding test.

(3) Evaluation of Microcrack Formation after Folding Test

In the optical films according to Examples 6 to 13, the appearance was observed after the folding test, to evaluate whether any microcrack was formed at the bent part of each optical film. The folding test was performed according to the method described in the section about the evaluation of surface resistance before and after a folding test. The microcracks were inspected using a digital microscope (product name: "VHX-5000"; manufactured by Keyence Corporation) in an environment at a temperature of 23° C. and a relative humidity of 50%. Specifically, each sample subjected to the folding test was first slowly unfolded and was immobilized on a stage of the microscope by means of a tape. When the creases were tight, an area to be observed was made as smooth as possible. However, the area to be observed (at the bent part) near the center of the sample was not touched by hand and was protected from any excessive force. Then, the area on both the inner and outer surfaces were observed under unfolded conditions. The microcracks were observed at a magnification of 200 times in reflected light under darkfield conditions with choosing a ring light as the light source for the digital microscope. For observation of the microcracks, marks were drawn on both the edges perpendicular to the folding direction in the bent part, with a permanent marker, to indicate the position of the bent part for ease of finding the position of an area to be observed, as shown in FIG. 8, when each sample that had not been subjected to a folding test was fixed to fixing members of the endurance testing machine and was folded once. Moreover, each sample was dismounted from the endurance testing machine after the folding test, and lines connecting the marks on both the edges of the bent part were drawn with a permanent marker. Furthermore, for observation of microcracks, the microscope was positioned such that the center of the bent part was in alignment of the center of the field of view of the microscope. When a prospective bent part of each optical film was observed before the folding test, no microcrack was found. The evaluation criteria were as follows.

(Microcracks)

⊚: a microcrack was not detected in the optical film after the folding test;

○: a small microcrack was detected in the optical film after the folding test, but the damage was not so severe as to warrant exclusion from practical use;

Δ: a microcrack was detected in the optical film after the folding test.

The results are shown in Tables 1 to 3 below.

TABLE 1

|  | Before Rubber Eraser Abrasion Test | | | | After Rubber Eraser Abrasion Test (500 g × 4,000 times) | | | |
| --- | --- | --- | --- | --- | --- | --- | --- | --- |
|  | Presence or absence of 1 or more and 50 or less depressions | Dynamic friction coefficient (load: 500 g) | Dynamic friction coefficient (load: 1000 g) | Sa (nm) | Presence or absence of 1 or more and 50 or less depressions | Dynamic friction coefficient (load: 500 g) | Change rate of dynamic friction coefficient (%) | Ratio of maintained contact angle (%) |
| Example 1 | Absent | 0.65 | 0.60 | 0.4 | Present | 0.64 | 1.5 | 90 |
| Example 2 | Absent | 0.62 | 0.59 | 0.4 | Present | 0.59 | 4.8 | 90 |
| Example 3 | Absent | 0.63 | 0.63 | 0.4 | Present | 0.60 | 4.7 | 90 |
| Example 4 | Absent | 0.65 | 0.62 | 0.7 | Present | 0.48 | 26 | 85 |
| Example 5 | Absent | 0.65 | 0.60 | 0.4 | Present | 0.62 | 4.6 | 90 |
| Example 6 | Present | 0.54 | 0.46 | 0.5 | Present | 0.60 | 11 | 90 |

TABLE 1-continued

| | Before Rubber Eraser Abrasion Test | | | | After Rubber Eraser Abrasion Test (500 g × 4,000 times) | | | |
|---|---|---|---|---|---|---|---|---|
| | Presence or absence of 1 or more and 50 or less depressions | Dynamic friction coefficient (load: 500 g) | Dynamic friction coefficient (load: 1000 g) | Sa (nm) | Presence or absence of 1 or more and 50 or less depressions | Dynamic friction coefficient (load: 500 g) | Change rate of dynamic friction coefficient (%) | Ratio of maintained contact angle (%) |
| Example 8 | Present | 0.54 | 0.46 | 0.5 | Present | 0.60 | 11 | 90 |
| Example 10 | Present | 0.54 | 0.46 | 0.5 | Present | 0.60 | 11 | 90 |
| Example 12 | Present | 0.54 | 0.46 | 0.5 | Present | 0.60 | 11 | 90 |
| Comparative Example 1 | Absent | 0.45 | 0.40 | 0.4 | Absent | 0.64 | 42 | 50 |
| Comparative Example 2 | Absent | 0.75 | 0.72 | 0.4 | Absent | 0.74 | 1.3 | 60 |
| Comparative Example 3 | Absent | 0.36 | 0.35 | 3.4 | Absent | 0.55 | 52 | 85 |
| Comparative Example 4 | Absent | 0.32 | 0.38 | 2.8 | Absent | 0.54 | 68 | 85 |
| Comparative Example 5 | Absent | 0.38 | 0.33 | 4.7 | Absent | 0.56 | 47 | 85 |

TABLE 2

| | After Rubber Eraser Abrasion Test (1,000 g × 5,000 times) | | | | | | | | |
|---|---|---|---|---|---|---|---|---|---|
| | Presence or absence of 1 or more and 50 or less depressions | Dynamic friction coefficient (load: 1000 g) | Change rate of dynamic friction coefficient (%) | Sa (nm) | Absolute value of difference in Sa | Ratio of maintained contact angle (%) | SW test | Pencil hardness test | Total light transmittance (%) | Haze value (%) |
| Example 1 | Absent | 0.58 | 3.3 | 0.49 | 0.09 | 90 | ○ | 7H | 92 | 0.2 |
| Example 2 | Absent | 0.55 | 6.7 | 0.48 | 0.08 | 89 | ○ | 7H | 92 | 0.2 |
| Example 3 | Absent | 0.60 | 4.7 | 0.48 | 0.08 | 90 | ○ | 7H | 92 | 0.2 |
| Example 4 | Absent | 0.44 | 29 | 0.64 | 0.06 | 84 | ○ | 7H | 92 | 0.2 |
| Example 5 | Absent | 0.59 | 1.6 | 0.49 | 0.09 | 89 | ○ | 7H | 92 | 0.2 |
| Example 6 | Present | 0.53 | 15 | 2.4 | 1.9 | 90 | ○ | 4H | 92 | 0.2 |
| Example 8 | Present | 0.53 | 15 | 2.4 | 1.9 | 90 | ○ | 4H | 92 | 0.2 |
| Example 10 | Present | 0.53 | 15 | 2.4 | 1.9 | 90 | ○ | 4H | 92 | 0.2 |
| Example 12 | Present | 0.53 | 15 | 2.4 | 1.9 | 90 | ○ | 4H | 92 | 0.2 |
| Comparative Example 1 | Absent | 0.62 | 55 | 3.6 | 3.2 | 45 | ○ | 7H | 92 | 0.2 |
| Comparative Example 2 | Absent | 0.71 | 1.4 | 3.8 | 3.4 | 57 | ○ | 7H | 92 | 0.2 |
| Comparative Example 3 | Absent | 0.60 | 71 | 14.4 | 11 | 80 | X | 7H | 91 | 1.0 |
| Comparative Example 4 | Absent | 0.56 | 47 | 13.2 | 10.4 | 80 | X | 7H | 91 | 1.5 |
| Comparative Example 5 | Absent | 0.48 | 45 | 2.8 | 1.9 | 80 | X | 7H | 91 | 0.2 |

TABLE 3

| | Flexibility | | | | | | | | |
|---|---|---|---|---|---|---|---|---|---|
| | 2ϕ mm, 100,000 times | | | 2ϕ mm, 200,000 times | | | 2ϕ mm, 300,000 times | | |
| | Cracks and breaks | Creases | Microcracks | Cracks and breaks | Creases | Microcracks | Cracks and breaks | Creases | Microcracks |
| Example 6 | ◎ | ○ | ◎ | ○ | ○ | ○ | Δ | Δ | Δ |
| Example 7 | ◎ | ◎ | ◎ | ◎ | ○ | ○ | ○ | Δ | ○ |
| Example 8 | ◎ | ○ | ◎ | ○ | ○ | ○ | Δ | Δ | Δ |
| Example 9 | ◎ | ◎ | ◎ | ◎ | ○ | ○ | ○ | Δ | ○ |
| Example 10 | ◎ | ◎ | ◎ | ◎ | ○ | ○ | Δ | Δ | Δ |
| Example 11 | ◎ | ◎ | ◎ | ◎ | ◎ | ◎ | ○ | ○ | ○ |
| Example 12 | ◎ | ◎ | ◎ | ◎ | ◎ | ◎ | ○ | Δ | ○ |
| Example 13 | ◎ | ◎ | ◎ | ◎ | ◎ | ◎ | ○ | ○ | ○ |

The results will be described below. In the optical films according to Comparative Examples 1 to 5, the presence of 1 or more and 50 or less depressions as described above was not confirmed after the rubber eraser abrasion test (500 g×4,000 times), or the change rate of the dynamic friction coefficient between before and after the rubber eraser abrasion test (500 g×4,000 times) was more than 35%. Consistently, the optical films according to Comparative Examples 1 and 2 showed excellent results in the steel-wool scratch test but had low ratios of maintained contact angle and lower abrasion resistance, and the optical films according to Comparative Examples 3 to 5 showed excellent results in the test for the ratio of maintained contact angle but showed poor results in the steel-wool scratch test and had lower scratch resistance. Contrarily, in the optical films according to Examples 1 to 6, 8, 10, and 12, the presence of 1 or more and 50 or less depressions as described above was confirmed after the rubber eraser abrasion test (500 g×4,000 times), and the dynamic friction coefficient determined before the rubber eraser abrasion test (500 g×4,000 times) was up to 0.70, and the change rate of the dynamic friction coefficient between before and after the rubber eraser abrasion test (500 g×4,000 times) was up to 35%. Consistently, the results in the steel-wool scratch test and the test for the ratio of maintained contact angle were also excellent in those optical films. The hard coat layer in the optical film according to Example 7 is similar to the hard coat layer in the optical film according to Example 6, and the hard coat layer in the optical film according to Example 9 is similar to the hard coat layer in the optical film according to Example 8, and the hard coat layer in the optical film according to Example 11 is similar to the hard coat layer in the optical film according to Example 10, and the hard coat layer in the optical film according to Example 13 is similar to the hard coat layer in the optical film according to Example 12. Thus, it is believed that Examples 7, 9, 11, and 13 will produce the same results as Examples 6, 8, 10, and 12, respectively. These results confirmed that the optical films according to Examples 1 to 13 had superior scratch resistance as well as excellent abrasion resistance.

In the optical films according to Comparative Examples 1 to 5, the absolute value of the difference in the arithmetic mean height (Sa) between before and after the rubber eraser abrasion test (1,000 g×5,000 times) fell outside the range of 0.1 nm to 5 nm, or the change rate of the dynamic friction coefficient between before and after the rubber eraser abrasion test (1,000 g×5,000 times) was more than 35%. Consistently, the optical films according to Comparative Examples 1 and 2 showed excellent results in the steel-wool scratch test but had low ratios of maintained contact angle and lower abrasion resistance, and the optical films according to Comparative Examples 3 to 5 showed excellent results in the test for the ratio of maintained contact angle but showed poor results in the steel-wool scratch test and had lower scratch resistance. Contrarily, in the optical films according to Examples 1 to 6, 8, 10, and 12, the absolute value of the difference in the arithmetic mean height (Sa) between before and after the rubber eraser abrasion test (1,000 g×5,000 times) fell within the range of 0.1 nm to 5 nm, and the dynamic friction coefficient determined before the rubber eraser abrasion test (1,000 g×5,000 times) was up to 0.70, and the change rate of the dynamic friction coefficient between before and after the rubber eraser abrasion test (1,000 g×5,000 times) was up to 35%. Consistently, the results in the steel-wool scratch test and the test for the ratio of maintained contact angle were also excellent in those optical films. The hard coat layer in the optical film according to Example 7 is similar to the hard coat layer in the optical film according to Example 6, and the hard coat layer in the optical film according to Example 9 is similar to the hard coat layer in the optical film according to Example 8, and the hard coat layer in the optical film according to Example 11 is similar to the hard coat layer in the optical film according to Example 10, and the hard coat layer in the optical film according to Example 13 is similar to the hard coat layer in the optical film according to Example 12. Thus, it is believed that Examples 7, 9, 11, and 13 will produce the same results as Examples 6, 8, 10, and 12, respectively. These results confirmed that the optical films according to Examples 1 to 13 had superior scratch resistance as well as excellent abrasion resistance.

Figure 11A:
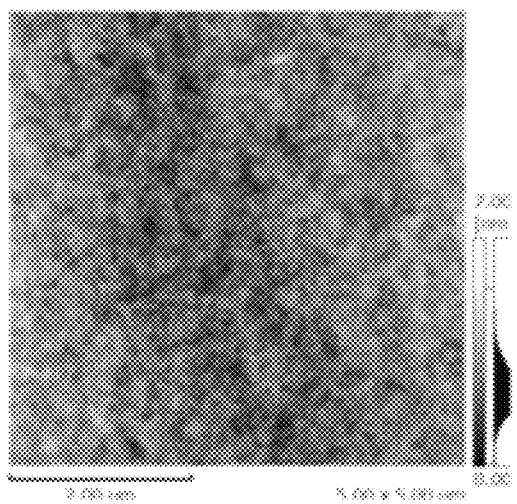
FIGS. 11(A) and 11(B) are pictures showing the front surface of an optical film according to Example 1 observed under an atomic force microscope before a rubber eraser abrasion test.
Figure 11B:
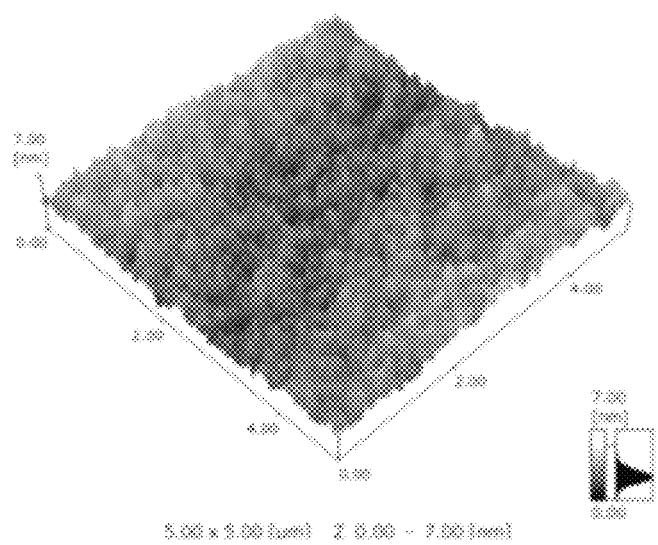
Figure 12A:
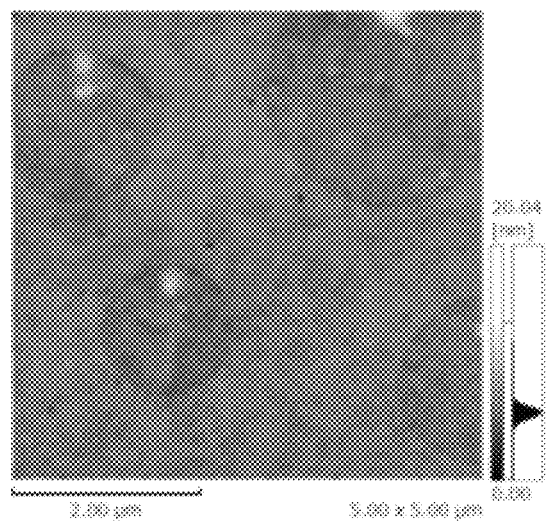
FIGS. 12(A) and 12(B) are pictures showing the front surface of an optical film according to Example 1 observed under an atomic force microscope after a rubber eraser abrasion test (500 g×4,000 times).
Figure 12B:
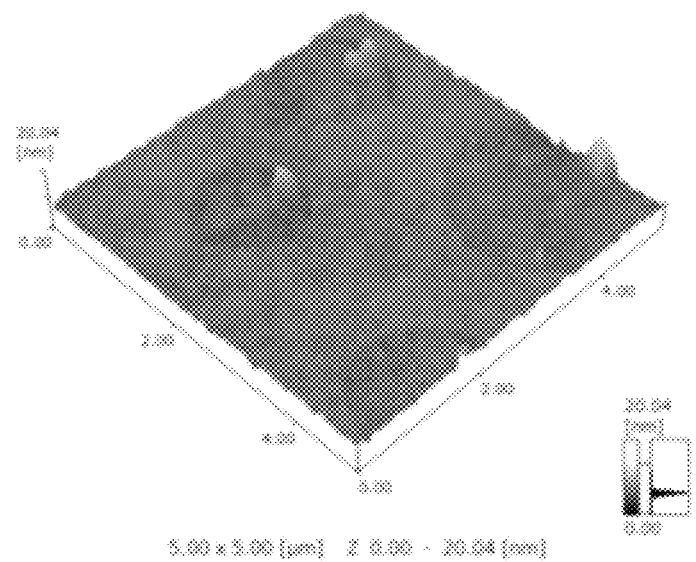

For reference, a picture showing a 5-μm square region on the front surface of the optical film according to Example 1 observed under an atomic force microscope before the rubber eraser abrasion test is shown in FIG. 11(A), and a picture showing the front surface of the optical film observed under an atomic force microscope before rubber eraser abrasion test is shown in FIG. 11(B), and a picture showing the front surface of the optical film according to Example 1 observed under an atomic force microscope after the rubber eraser abrasion test (500 g×4,000 times) is shown in FIG. 12(A), and another picture showing the front surface of the optical film according to Example 1 observed under an atomic force microscope after the rubber eraser abrasion test (500 g×4,000 times) is shown in FIG. 12(B). In the optical films according to Example 1, ring-shaped, circularly shaped, or irregularly shaped depressions were not observed before the rubber eraser abrasion test, as shown in FIGS. 11(A) and 11(B), but depressions with a depth of about 0.8 nm formed along apparently circular edges were observed after the rubber eraser abrasion test (500 g×4,000 times), as shown in FIGS. 12(A) and 12(B), indicating the presence of ring-shaped depressions. FIGS. 11(A) and 11(B), and FIGS. 12(A) and 12(B) are pictures taken using an atomic force microscope AFM-5500 (manufactured by Hitachi High-Technologies Corporation). The scale size in the height direction shown in FIG. 11(B) is 7.00 nm, while the scale size in the height direction shown in FIG. 12(B) is increased to 20.04 nm due to the presence of projections. Thus, though the surface of the sample shown in FIG. 11(B) appears to be rougher than that shown in FIG. 12(B), the surface of the sample shown in FIG. 11(B) is not necessarily proven to be rougher than that shown in FIG. 12(B), due to the difference in scale in the height direction. Once the surface profile of a sample was taken under the atomic force microscope, the scale in the height direction was automatically determined.

Figure 13A:
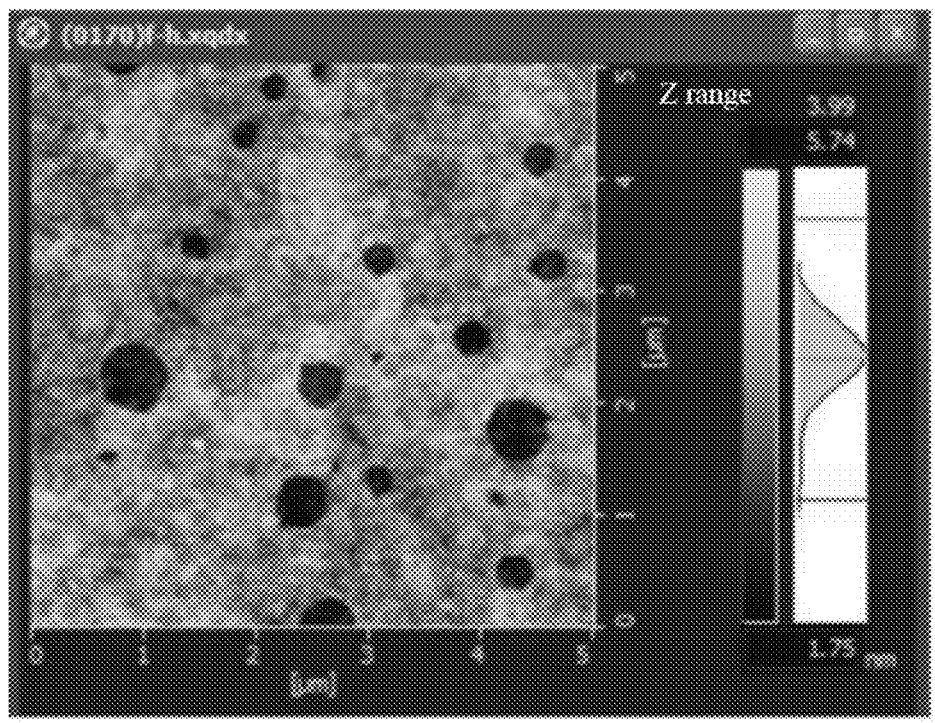
FIG. 13(A) is a picture showing the front surface of an optical film according to Example 6 observed under an atomic force microscope before a rubber eraser abrasion test.
Figure 13B:
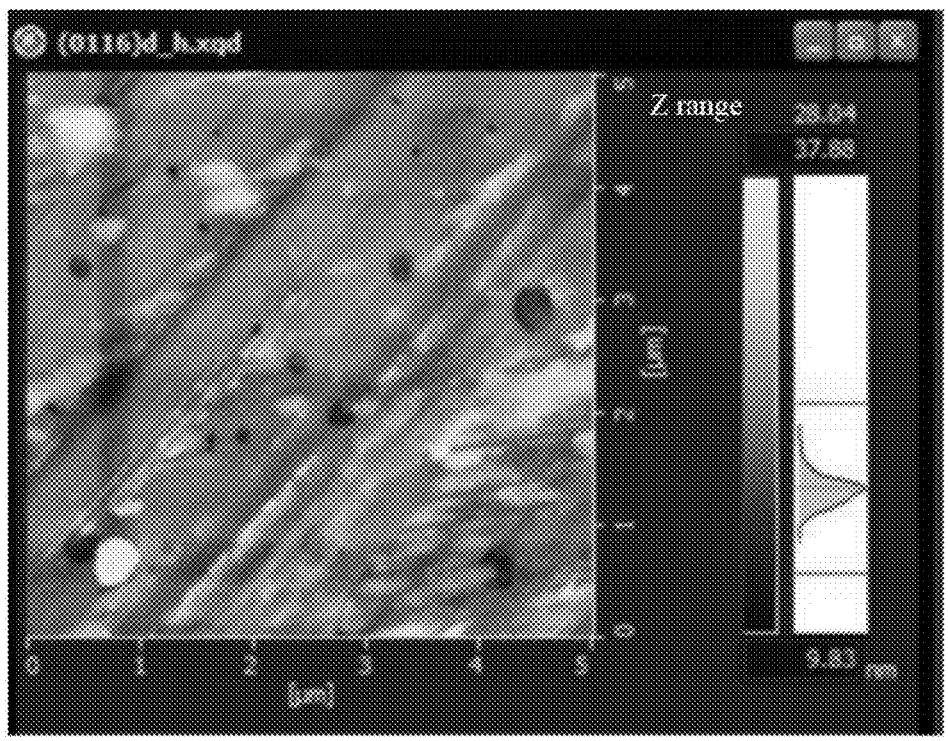
FIG. 13(B) is a picture showing the front surface of the optical film according to Example 6 observed under an atomic force microscope after a rubber eraser abrasion test (1,000 g×5,000 times).

Moreover, a picture showing a 5-μm square region on the front surface of the optical film according to Example 6 observed under an atomic force microscope (product name: "AFM-5500"; manufactured by Hitachi High-Technologies Corporation) before a rubber eraser abrasion test is shown in FIG. 13(A), and a picture showing the front surface of the optical film according to Example 6 observed under an atomic force microscope (product name: "AFM-5500"; manufactured by Hitachi High-Technologies Corporation) after the rubber eraser abrasion test (1,000 g×5,000 times) is shown in FIG. 13(B). In Example 6, depressions as described above were found in both the samples before and after the rubber eraser abrasion test (1,000 g×5,000 times).

The above folding test was performed in such a manner that the hard coat layer of each optical film was folded inward. Additionally, each sample was mounted in such a manner that the minimum gap φ between the two opposing edges was 3 mm (the outer diameter of a bent part: 3 mm), and was tested by repeating the folding test 100,000 times, in each of which the hard coat layer in the sample was folded back outward. In this folding test, the optical films according to Examples 6 to 13 showed excellent results (scores represented by "o" or higher) in all the tests for evaluations of crack and break formation, crease formation, and microcrack formation after the folding test.

LIST OF REFERENCE NUMERALS

10. Optical film
10A. Front surface
10B. Depressions
11. Resin base material
11A. First surface
11B. Second surface
12. Functional layer
12A. Front surface
13. First functional layer
14. Second functional layer
20. Polarizing plate
21. Polarizer
30. Image display device
33. Display element
35. Touch sensor

The invention claimed is:

1. An optical film comprising a resin base material and a functional layer provided on a first surface of the resin base material,
wherein a front surface of the optical film constitutes a front surface of the functional layer;
a 5-μm square region on the front surface of the optical film is observed to have 1 or more and 50 or less depressions having any shape at least selected from a ring shape with an outer diameter of 0.1 μm or more and 2.5 μm or less and with a depth of 1 nm or more and 150 nm or less, a circular shape with a diameter of 0.1 μm or more and 2.5 μm or less and with a depth of 1 nm or more and 150 nm or less, and an irregular shape with a width of 0.1 μm or more and 2.5 μm or less and with a depth of 1 nm or more and 150 nm or less, when the square region is observed using an atomic force microscope after a rubber eraser abrasion test, in which the front surface of the optical film is rubbed 4,000 times with a rubber eraser in a reciprocating motion under a load of 500 g;
the front surface of the optical film has a dynamic friction coefficient of 0.60 or less measured using the rubber eraser under a load of 500 g before the rubber eraser abrasion test; and
the change rate of the dynamic friction coefficient of the front surface of the optical film measured using the rubber eraser under a load of 500 g after the rubber eraser abrasion test to the dynamic friction coefficient of the front surface of the optical film before the rubber eraser abrasion test is up to 35%.

2. An optical film comprising a resin base material and a functional layer provided on a first surface of the resin base material,
wherein a front surface of the optical film constitutes a front surface of the functional layer;
the absolute value of the difference in the arithmetic mean height of a 5-μm square region on the front surface of the optical film measured using an atomic force microscope between before and after a rubber eraser abrasion test is 10 nm or less when the rubber eraser abrasion test is performed by rubbing the front surface of the optical film 5,000 times with a rubber eraser in a reciprocating motion under a load of 1,000 g;
a 5-μm square region on the front surface of the optical film is observed to have 1 or more and 50 or less depressions having any shape at least selected from a ring shape with an outer diameter of 0.1 μm or more and 2.5 μm or less and with a depth of 1 nm or more and 150 nm or less, a circular shape with a diameter of 0.1 μm or more and 2.5 μm or less and with a depth of 1 nm or more and 150 nm or less, and an irregular shape with a width of 0.1 μm or more and 2.5 μm or less and with a depth of 1 nm or more and 150 nm or less, when the square region is observed using an atomic force microscope after the rubber eraser abrasion test;
the front surface of the optical film has a dynamic friction coefficient of 0.70 or less measured using the rubber eraser under a load of 1000 g before the rubber eraser abrasion test; and
the change rate of the dynamic friction coefficient of the front surface of the optical film measured using the rubber eraser under a load of 1000 g after the rubber eraser abrasion test to the dynamic friction coefficient of the front surface of the optical film before the rubber eraser abrasion test is up to 35%.

3. The optical film according to claim 1, wherein a 5-μm square region on the front surface of the optical film is observed to have the depressions, ranging from 1 or more to 50 or less in number, when the square region is observed using an atomic force microscope before the rubber eraser abrasion test.

4. The optical film according to claim 1, wherein a 5-μm square region on the front surface of the optical film is observed to have no depressions when the square region is observed using an atomic force microscope before the rubber eraser abrasion test.

5. The optical film according to claim 1, wherein a projection with a height of 1 nm or more is located within each depression or inside each depression.

6. The optical film according to claim 1, wherein the ratio of maintained contact angle is 80% or more, which is the ratio of the contact angle of water on the front surface of the optical film measured after the rubber eraser abrasion test to that measured before the rubber eraser abrasion test.

7. The optical film according to claim 1, wherein no scratches are found on the front surface of the optical film when the front surface of the optical film not provided for the rubber eraser abrasion test is rubbed 5,000 times with steel wool in a reciprocating motion under a load of 1 kg/cm² during a steel-wool scratch test.

8. The optical film according to claim 1, wherein the functional layer comprises a first functional layer containing particles and a second functional layer provided on a surface opposite to the resin base material side surface of the first functional layer and containing no particles.

9. The optical film according to claim 1, wherein no crack or break is formed in the optical film when the optical film is folded in such a manner that a gap of 2 mm is left between the opposite edges and the functional layer faces inward, and then unfolded, and the process is repeated 100,000 times, in cases where the resin base material contains cellulose triacetate resin and the resin base material has a thickness of 15 μm or more and 65 μm or less, or the resin base material contains a polyester resin and the resin base material has a thickness of 5 μm or more and 45 μm or less, or the resin base material contains a cycloolefin polymer resin and the resin base material has a thickness of 5 μm or more and 35 μm or less, or the resin base material contains at least either a polyimide resin or a polyamide resin and the resin base material has a thickness of 5 μm or more and 75 μm or less.

10. The optical film according to claim 1, wherein no crack or break is formed in the optical film when the optical film is folded in such a manner that a gap of 3 mm is left between the opposite edges and the functional layer faces outward, and then unfolded, and the process is repeated 100,000 times, in cases where the resin base material contains at least any of a cellulose triacetate resin, a polyester resin, a cycloolefin polymer resin, or a polyimide resin and a polyamide resin and the resin base material has a thickness of 35 μm or more and 105 μm or less.

11. A polarizing plate, comprising:
the optical film according to claim 1; and
a polarizer provided on a second surface opposite to the first surface of the resin base material in the optical film.

12. An image display device, comprising:
a display element; and
the optical film according to claim 1, placed on the observer's side of the display element,
wherein the functional layer of the optical film is placed on the observer's side of the resin base material.

13. The image display device according to claim 12, wherein a touch sensor is further provided between the display element and the optical film.

14. The image display device according to claim 12, wherein the display element is an organic light-emitting diode element.

15. The optical film according to claim 2, wherein a 5-μm square region on the front surface of the optical film is observed to have the depressions, ranging from 1 or more to 50 or less in number, when the square region is observed using an atomic force microscope before the rubber eraser abrasion test.

16. The optical film according to claim 2, wherein a 5-μm square region on the front surface of the optical film is observed to have no depressions when the square region is observed using an atomic force microscope before the rubber eraser abrasion test.

17. The optical film according to claim 2, wherein a projection with a height of 1 nm or more is located within each depression or inside each depression.

18. The optical film according to claim 2, wherein the ratio of maintained contact angle is 80% or more, which is the ratio of the contact angle of water on the front surface of the optical film measured after the rubber eraser abrasion test to that measured before the rubber eraser abrasion test.

19. The optical film according to claim 2, wherein no scratches are found on the front surface of the optical film when the front surface of the optical film not provided for the rubber eraser abrasion test is rubbed 5,000 times with steel wool in a reciprocating motion under a load of 1 kg/cm² during a steel-wool scratch test.

20. The optical film according to claim 2, wherein the functional layer comprises a first functional layer containing particles and a second functional layer provided on a surface opposite to the resin base material side surface of the first functional layer and containing no particles.

21. The optical film according to claim 2, wherein no crack or break is formed in the optical film when the optical film is folded in such a manner that a gap of 2 mm is left between the opposite edges and the functional layer faces inward, and then unfolded, and the process is repeated 100,000 times, in cases where the resin base material contains cellulose triacetate resin and the resin base material has a thickness of 15 μm or more and 65 μm or less, or the resin base material contains a polyester resin and the resin base material has a thickness of 5 μm or more and 45 μm or less, or the resin base material contains a cycloolefin polymer resin and the resin base material has a thickness of 5 μm or more and 35 μm or less, or the resin base material contains at least either a polyimide resin or a polyamide resin and the resin base material has a thickness of 5 μm or more and 75 μm or less.

22. The optical film according to claim 2, wherein no crack or break is formed in the optical film when the optical film is folded in such a manner that a gap of 3 mm is left between the opposite edges and the functional layer faces outward, and then unfolded, and the process is repeated 100,000 times, in cases where the resin base material contains at least any of a cellulose triacetate resin, a polyester resin, a cycloolefin polymer resin, or a polyimide resin and a polyamide resin and the resin base material has a thickness of 35 μm or more and 105 μm or less.

23. A polarizing plate, comprising:
the optical film according to claim 2; and
a polarizer provided on a second surface opposite to the first surface of the resin base material in the optical film.

24. An image display device, comprising:
a display element; and
the optical film according to claim 2, placed on the observer's side of the display element,
wherein the functional layer of the optical film is placed on the observer's side of the resin base material.

25. The image display device according to claim 24, wherein a touch sensor is further provided between the display element and the optical film.

26. The image display device according to claim 24, wherein the display element is an organic light-emitting diode element.

* * * * *